United States Patent
Masuyama et al.

(10) Patent No.: US 9,699,933 B2
(45) Date of Patent: Jul. 4, 2017

(54) SYSTEM AND METHOD FOR PROVIDING AC JUMPER MANAGEMENT AND IDENTIFYING AC JUMPER TOPOLOGY

(71) Applicant: Dell Products, LP, Round Rock, TX (US)

(72) Inventors: Jinsaku Masuyama, Cedar Park, TX (US); Syed S. Ahmen, Round Rock, TX (US); John R. Palmer, Georgetown, TX (US)

(73) Assignee: DELL PRODUCTS, LP, Round Rock, TX (US)

( * ) Notice: Subject to any disclaimer, the term of this patent is extended or adjusted under 35 U.S.C. 154(b) by 296 days.

(21) Appl. No.: 14/610,371

(22) Filed: Jan. 30, 2015

(65) Prior Publication Data
US 2015/0257302 A1    Sep. 10, 2015

Related U.S. Application Data

(63) Continuation-in-part of application No. 14/199,660, filed on Mar. 6, 2014.

(51) Int. Cl.
*H05K 7/14* (2006.01)
*G06F 1/26* (2006.01)

(52) U.S. Cl.
CPC ............ *H05K 7/1498* (2013.01); *G06F 1/26* (2013.01); *H05K 7/1492* (2013.01)

(58) Field of Classification Search
CPC .................................................... H05K 7/1498
USPC ....................................................... 709/220
See application file for complete search history.

(56) References Cited

U.S. PATENT DOCUMENTS

| | | | |
|---|---|---|---|
| 2,014 A | * | 3/1841 | Perrin ................... B27F 1/04 144/89 |
| 5,335,985 A | | 8/1994 | Baur |
| 5,434,775 A | | 7/1995 | Sims et al. |
| 5,505,533 A | | 4/1996 | Kammersqard et al. |
| 5,774,668 A | | 6/1998 | Choquier et al. |
| 5,805,442 A | | 9/1998 | Crater et al. |
| 5,869,820 A | | 2/1999 | Chen et al. |
| 5,910,776 A | | 6/1999 | Black |
| 5,913,034 A | | 6/1999 | Malcolm |
| 5,926,463 A | | 7/1999 | Ahearn et al. |
| 5,956,665 A | | 9/1999 | Martinez et al. |
| 5,956,723 A | | 9/1999 | Zhu |
| 5,959,012 A | | 9/1999 | Simonian et al. |

(Continued)

*Primary Examiner* — O. C. Vostal
(74) *Attorney, Agent, or Firm* — Larson Newman, LLP

(57) ABSTRACT

A server rack includes a power mapping module, a power receptacle that includes a power tine communication module wherein the power receptacle is uniquely associated with a rack unit of the server rack and is collocated with the associated rack unit, and a server coupled to the power mapping module via a management network, wherein the server asserts an interrupt request to the power mapping module via the management network. The power mapping module sends a unique identifier via the first power tine communication module in response to receiving the interrupt request. The server receives the unique identifier via the second power line communication module and sends the unique identifier to the power mapping module via the management network. The power mapping module determines that the server is installed into the rack based upon the receipt of the unique identifier.

20 Claims, 42 Drawing Sheets

(56) References Cited

U.S. PATENT DOCUMENTS

| | | | |
|---|---|---|---|
| 6,057,981 A | 5/2000 | Fish et al. | |
| 6,112,246 A | 8/2000 | Horbal et al. | |
| 6,131,119 A | 10/2000 | Fukui | |
| 6,167,448 A | 12/2000 | Hemphill et al. | |
| 6,282,175 B1 | 8/2001 | Steele et al. | |
| 6,601,084 B1 | 7/2003 | Bhaskaran et al. | |
| 6,654,347 B1 | 11/2003 | Wiedeman et al. | |
| 6,714,977 B1 | 3/2004 | Fowler et al. | |
| 6,826,714 B2 | 11/2004 | Coffey et al. | |
| 7,696,506 B2 | 4/2010 | Lung | |
| 7,720,987 B2 | 5/2010 | Penk et al. | |
| 8,037,330 B2 | 10/2011 | Livescu et al. | |
| 8,334,755 B2 * | 12/2012 | Eun | H04L 41/12 340/10.1 |
| 8,674,823 B1 * | 3/2014 | Contario | H02J 1/10 340/333 |
| 8,732,508 B2 | 5/2014 | Cochran et al. | |
| 8,811,377 B1 * | 8/2014 | Weston | H04W 52/0219 370/351 |
| 9,355,055 B1 * | 5/2016 | Klein | G06F 13/4022 |
| 2002/0095487 A1 | 7/2002 | Day et al. | |
| 2002/0141210 A1 | 10/2002 | Glannopoulos et al. | |
| 2002/0196150 A1 * | 12/2002 | Wildman | B65F 1/0033 340/573.1 |
| 2003/0046339 A1 | 3/2003 | Ip | |
| 2003/0126253 A1 * | 7/2003 | Ewing | G06F 1/26 709/223 |
| 2004/0010649 A1 | 1/2004 | Weaver et al. | |
| 2004/0160323 A1 * | 8/2004 | Stilp | G08B 3/1083 340/572.1 |
| 2006/0044148 A1 * | 3/2006 | Daniels | G06F 1/1616 340/686.1 |
| 2007/0013235 A1 * | 1/2007 | Fein | G06F 21/81 307/116 |
| 2007/0094426 A1 | 4/2007 | Chiang et al. | |
| 2007/0108296 A1 * | 5/2007 | Konopka | G06K 7/10178 235/492 |
| 2008/0317021 A1 | 12/2008 | Ives et al. | |
| 2009/0189774 A1 | 7/2009 | Brundridge et al. | |
| 2009/0217073 A1 | 8/2009 | Brech et al. | |
| 2009/0236909 A1 * | 9/2009 | Aldag | H01R 25/142 307/39 |
| 2009/0301925 A1 * | 12/2009 | Alloro | G06F 19/3462 206/534 |
| 2009/0307515 A1 | 12/2009 | Bandholz et al. | |
| 2010/0027687 A1 | 2/2010 | De Natale et al. | |
| 2010/0060428 A1 * | 3/2010 | Lee | G06K 7/10207 340/10.1 |
| 2010/0106154 A1 | 4/2010 | Harley et al. | |
| 2010/0301809 A1 * | 12/2010 | Bhade | B60L 11/1824 320/148 |
| 2011/0022245 A1 | 1/2011 | Goodrum et al. | |
| 2011/0074582 A1 * | 3/2011 | Alexis | G08B 13/149 340/572.1 |
| 2011/0136353 A1 * | 6/2011 | Spitaels | H01R 25/003 439/95 |
| 2011/0140856 A1 * | 6/2011 | Downie | G06K 9/0707 340/10.1 |
| 2011/0179301 A1 | 7/2011 | Liu et al. | |
| 2011/0291813 A1 * | 12/2011 | Jansma | G06F 1/266 340/10.5 |
| 2012/0054527 A1 * | 3/2012 | Pfeifer | G06F 1/266 713/340 |
| 2012/0262956 A1 | 10/2012 | DeHaven | |
| 2012/0303767 A1 | 11/2012 | Renzin | |
| 2013/0007249 A1 | 1/2013 | Wang et al. | |
| 2013/0031342 A1 * | 1/2013 | French | G06F 9/4418 713/2 |
| 2013/0132607 A1 * | 5/2013 | Sinha | H04L 45/00 709/238 |
| 2013/0297387 A1 * | 11/2013 | Michael | G08G 1/0112 705/13 |
| 2014/0108827 A1 * | 4/2014 | Mathew | H05K 7/1498 713/300 |
| 2014/0115353 A1 * | 4/2014 | Hutten | G06F 1/263 713/310 |
| 2014/0203077 A1 * | 7/2014 | Gadh | H02J 7/00 235/382 |
| 2014/0317267 A1 * | 10/2014 | Ramachandran | H04L 41/24 709/224 |

* cited by examiner

SYSTEM AND METHOD FOR PROVIDING AC JUMPER MANAGEMENT AND IDENTIFYING AC JUMPER TOPOLOGY

CROSS REFERENCE TO RELATED APPLICATIONS

This application is a continuation-in-part of U.S. application Ser. No. 14/199,660, filed Mar. 6, 2014, entitled "System and Method for Providing a Server Rack Management Controller," invented by John R. Palmer et al., and assigned to the assignee hereof.

FIELD OF THE DISCLOSURE

This disclosure generally relates to information handling systems, and more particularly relates to a system and method for providing AC jumper management and identifying ac juniper topology in a server rack.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

A data center is a facility to house a group of networked information handling systems typically used by organizations for the remote storage, processing, or distribution of large amounts of data, and includes associated components, such as telecommunication systems, storage systems, power supplies, environmental controls, and security infrastructure. A data center includes a group of server racks that house the information handling systems, and that are located on floor tiles of a raised floor. A space below the raised floor can be utilized to provide an air flow from an AC system to the server racks.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
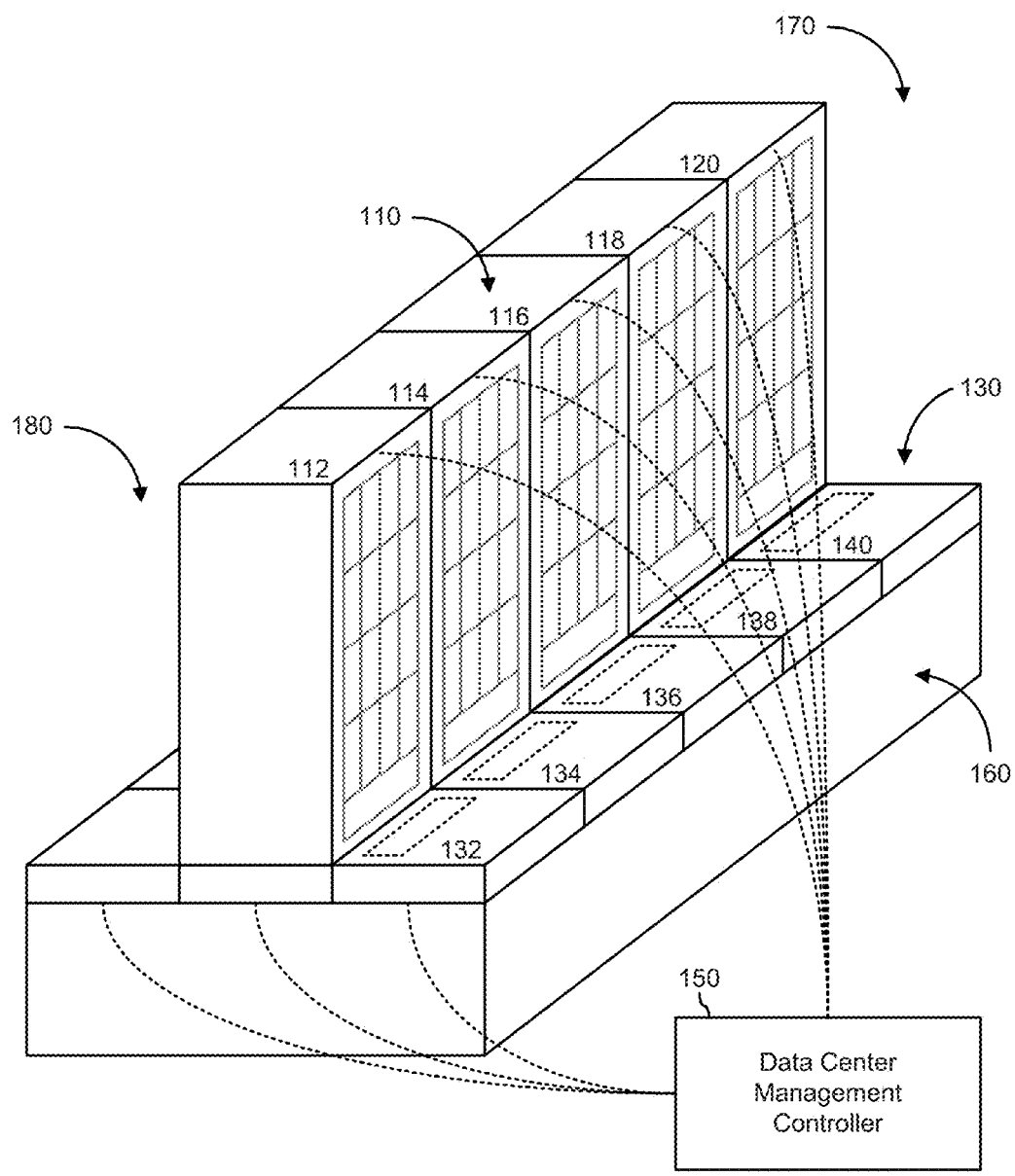
FIG. 1 is an illustration of a data center according to an embodiment of the present disclosure.

FIG. 1 illustrates an embodiment of a data center 100 including server aisle 110, a floor 130, a data center management controller (DCMC) 150, a sub-floor 160, a cold aisle 170, and a hot aisle 180. One or more of the elements of data center 100 can be realized as an information handling system. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smart phone, a tablet device or other consumer electronic device, a network server, a network storage device, a switch, a router, or another network communication device, or any other suitable device and may vary in size, shape, performance, functionality, and price. Further, an information handling system can include processing resources for executing machine-executable code, such as a central processing unit (CPU), a programmable logic array (PLA), un embedded device such as a System-on-a-Chip (SoC), or other control logic hardware. An information handling system can also include one or more computer-readable medium for storing machine-executable code, such as software or data. Additional components of information handling system 100 can include one or more storage devices that can store machine-executable code, one or more communications ports for communicating with external devices, and various input and output (I/O) devices, such as a keyboard, a mouse, and a video display.

Server aisle 110 includes server racks 112, 114, 116, 118, and 120 that operate to perform the data storage and processing functions of data center 100. Floor 130 is a false-floor that forms a platform above a ground level floor, crating sub-floor 160, an area between floor 130 and the ground level floor. Sub-floor 160 provides for power routing and cabling for servers 112, 114, 116, 118, and 120, and acts as a conduit for air conditioning (AC) to provide temperature controlled air flow to the servers. As such, floor 130 includes floor tiles 132, 134, 136, 138, and 140 that each include vents that permit the temperature controlled air to pass from sub-floor 160 to cold aisle 170. There, the temperature controlled air is drawn through the equipment in server racks 112., 114, 116, 118, and 120 to cool the equipment, and the air flows out the back of the server racks, removing the heat from the equipment, and passing to hot aisle 180, where the hot air is recirculated through an AC system. The skilled artisan will recognize that other floor configurations than the illustrated raised floor configuration shown herein can be utilized in combination with the teachings of the present disclosure, as needed or desired. Further, the skilled artisan will recognize that other air flows than the air flows from the floor to the cold aisle to the hot isle as illustrated herein can be utilized in combination with the teachings of the present disclosure, as needed or desired.

In an embodiment, DCMC 1150 operates to provide a management network for the equipment in server racks 112, 114, 116, 118, and 120. For example, one or more of the elements of server racks 112, 114, 116, 118, and 120 can include a service processor such as a baseboard management controller, an Integrated Dell Remote Access Controller (iDRAC), another service processor, or a combination thereof, such that DCMC 150 can remotely manage the equipment in the server racks. An example of a DCMC includes a dedicated hardware device, a software stack on a dedicated server, a software stack on a server of data center 100, or other hardware, software, or firmware located in the data center or remote from the data center, as needed or desired.

In a particular embodiment, the floor tiles operate to provide information to respective server racks. In a first case, the information is communicated via a passive communication channel. In another case, the information is communicated via an active communication channel, and the floor tiles include a tile management controller (TMC). In another embodiment, the information is provided to a rack management controller (RMC). In either of the above embodiments, each TMC can be in communication with DCMC 150, each RMC can be in communication with the DCMC, or both the TMCs and the RMCs can be in communication with the DCMC.

In a particular embodiment, the RMCs operate to provide an Internet Protocol-based (IP) keyboard-video-mouse (KVM), an Ethernet management switch (EMS), and a serial aggregator. Moreover, the RMCs operate to provide a U-space aligned description of the equipment in the server rack. Here, the U-space alignment is determined based upon a management connection between the RMC and the equipment, or based upon a power connection between a power distribution unit (PDU) and the equipment. In another embodiment, the RMCs operate to provide a common real-time clock function for the equipment in the server rack, and to provide other common functions of the equipment in the server rack. In another embodiment the RMCs operate to provide virtual local area network (vLAN) mapping for the equipment in the server rack. In a first case, the vLAN mapping is provided based upon the location of a management connection between the RMC and the equipment. In another case, the vLAN mapping is provided based upon the location of a power connection between the PDU and the equipment. In another embodiment, a power map of the data center is obtained based upon the location of a power connection between the RMC and the PDU.

In another embodiment, the data center operates to provide preemptive/proactive cooling of the equipment in the server racks on a per rack basis and on a data center wide basis. Further, one or more of the tile and the server racks operate to provide closed loop thermal control. In a first case, a floor tile operates to control whether or not air is permitted to flow through the vent of the floor tile. In another embodiment, an air flow based power generator is provided for the floor tiles, in order to provide power for the TMC.

In another embodiment, one or more of the floor tiles and the server racks operate to determine the weight of the server rack and to calculate weight related parameters, such as safety margins, for the server rack. In a particular embodiment, the leveling feet of the server racks operate to determine the weight of the rack. In yet another embodiment, the leveling feet of the server racks are automatically controlled to provide leveling of the server racks. In another embodiment, the RMCs operate to determine when a server rack is top heavy, for example, when several pieces of equipment have been removed from the bottom of a server rack and other equipment has been left in place in the top of the server rack. Here, the RMCs operate to provide an interlock to keep service personnel from removing the equipment from the top of the rack. In another embodiment, the RMCs operate to detect when a side panel of the server rack has been removed or a ground is not connected.

Figure 2:
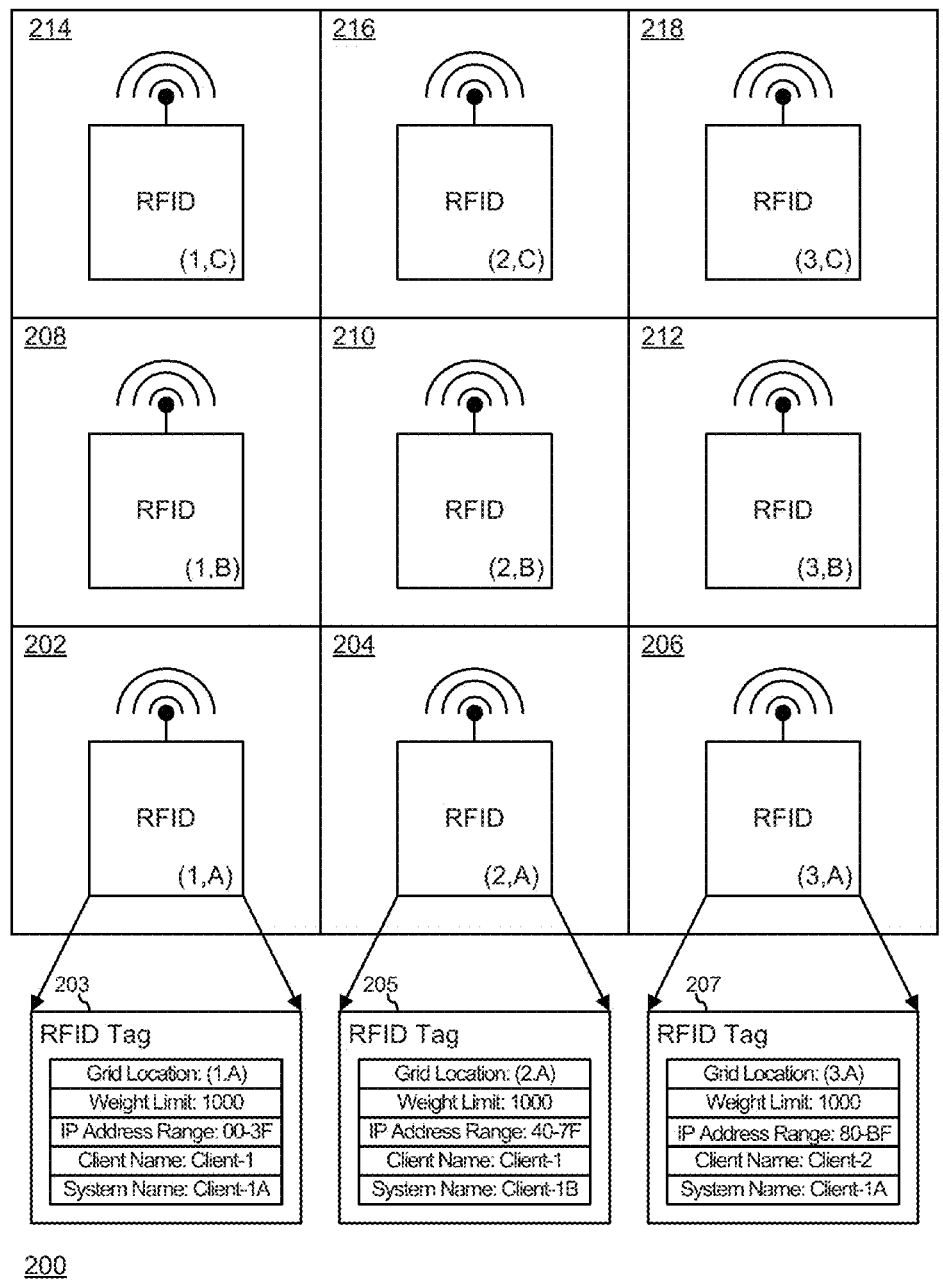
FIG. 2 is a block diagram of a data center floor including passive floor tiles according to an embodiment of the present disclosure.

FIG. 2 illustrates an embodiment of a floor 200 similar to floor 130, that includes passive floor tiles 202, 204, 206, 208, 210, 212, 214, 216, and 218. Floor tiles 202, 204, and 206 are illustrated as including radio frequency identification (RFID) tags 203, 205, and 207, respectively. RFID tags 203, 205, and 207 operate to store information related to the location of the associated floor tiles 202, 204, and 206, and to permit the communication of the information via a radio-frequency electromagnetic fields. The information stored in RFID tag 203 includes a grid location on floor 200 that identifies floor tile 202, a weight limit for server racks and equipment located on the floor tile, a range of IP addresses for the equipment, a client name associated with the equipment, and a system name for the equipment. RFID tags 205 and 207 include similar information to RFID tag 203. Floor tiles 208-218 each include RFID tags that are similar to RFID tags 203, 205, and 207, and that include information related to each floor tile's location, weight limit, and equipment identification. The skilled artisan will recognize that the information included in RFD tags 203, 205, and 207, as described above, is exemplary, and that other information can be stored in an RFID tag, as needed or desired. For example, an RFID tag located on a floor tile can include network routing information associated with the equipment located on the floor tile, such as VLAN mappings, network sub-masks, and the like, asset information such as a model number and a serial number for the floor tile, or other information, as needed or desired.

RFID tags 203, 205, and 207 are activated by a magnetic field created by an RFID tag reader, and provide the stored information via radio waves that are received by the RFID tag reader. In a particular embodiment, RFID tags 203, 205, and 207 are passive devices that receive operating power from the magnetic field. In another embodiment, RFID tags 203, 205, and 207 are active devices that are activated by the magnetic field, but, that include a power source, such as a battery, to generate the radio waves to provide the stored information to the RFID reader. In either case, REID tags 203, 205, and 207 can be provided in the form of adhesive stickers that are applied to the respective floor tiles 202, 204, and 206, or the RFID tags can be embedded in the respective floor tiles, as needed or desired. Further, RFID tags 203, 205, and 207 can be pre-programmed with the information prior to delivery to a data center, or the RFID tags can be programmed at the data center.

In a particular embodiment, floor tiles 202-218 can include near-field communication (NFC) devices in the place of the REID tags. Here, the NFC devices can store information similar to the information stored in the RFID tags. However, here, the NFC devices can be configured such that the stored information is rewriteable. In this way, floor tiles 202-218 can be mass produced and programmed with the desired information at the data center, and can also be reprogrammed if the needs of the data center change, or if a particular floor tile needs to be replaced. The skilled artisan will recognize that, in certain situations, not all floor tiles of a floor will need to include an RFID tag or a NFC device. For example, in a common configuration, one server rack is located on two floor tiles, and multiple floor tiles may be provided as walkway space in front of and in back of the server racks. Here, only one of the floor tiles under each server rack would need to include location information, and the other floor tiles under the server racks and the floor tiles in the aisles would not need to include RFID tags or NFC devices. The skilled artisan will recognize that other passive devices can be utilized to perform the functions of the RFID tags as disclosed herein, as needed or desired. Further, the skilled artisan will recognize that devices other than REID tags can be utilized, such as another memory device, as needed or desired. In a particular embodiment, RFID tags 203, 205, and 207 include a subset of the information, such as a grid location and a pointer to a remote storage device, from which the complete information can be retrieved.

Figure 3:
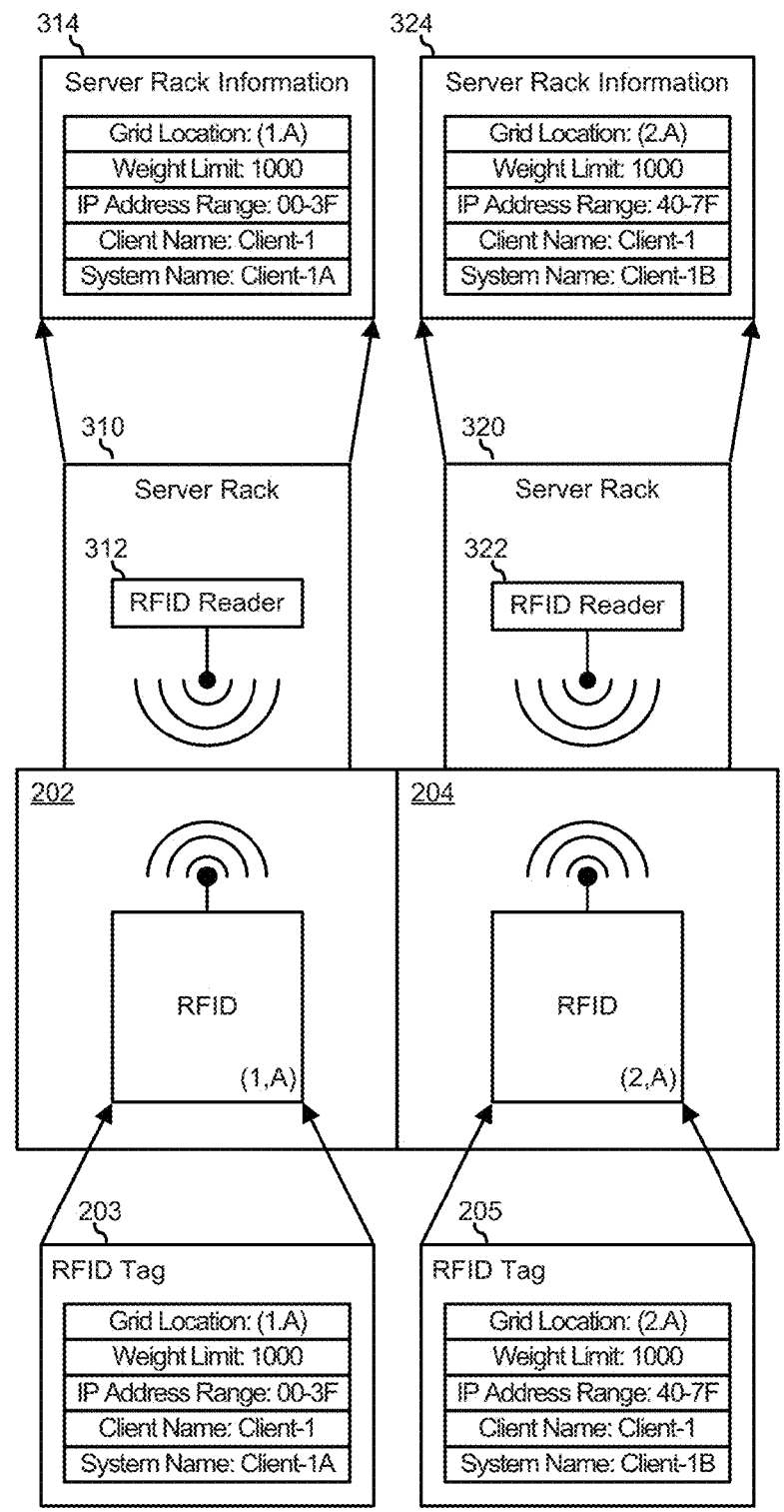
FIG. 3 is a block diagram of a portion of the data center floor of FIG. 2.

FIG. 3 illustrates a portion of floor 200 of FIG. 2, including floor tiles 202 and 204. A server rack 310 is located on floor tile 202, and a server rack 320 is located on floor tile 204. Server rack 310 includes an RFID tag reader 312, and server rack 320 includes an RFID tag reader 322. RFID tag 203 is activated by a magnetic field created by RFID tag reader 312, and provides the stored information via radio waves that are received by the RFID tag reader. Server rack 310 stores the information 314 as described further, below. RFID tag 205 is activated by a magnetic field created by RFID tag reader 322, and provides the stored information to the RFID tag reader, and server rack 320 stores the information 324. In a particular embodiment, RFID tag readers 312 and 322 are located proximate to the bottom of respective server racks 310 and 320, in order to meet the range requirements of the RFID tags. For example, where an operating range for a particular REID standard may be less than one meter, REID tag readers 312 and 314 may be placed in the bottom of server racks 310 and 320, so as to be able to reliably read the information from RFID tags 203 and 205. In the embodiment where floor tiles 202 and 204 include NFC devices in the place of the REID tags, server racks 310 and 320 are provided instead with NFC readers. In this embodiment, the NFC reader in server rack 310 can establish a peer-to-peer (P2P) connection with the NFC device in floor tile 202, and the NFC reader in server rack 320 can establish a P2P connection with the NFC device in floor tile 204. In a particular embodiment, one of server racks 310 and 320 are removed from the data center, and a new server rack is located on the empty floor tile 202 or 204. When the new server rack is installed in the data center, the new server rack obtains the location information from the floor tile. In this way, the new server rack can be configured similarly to the server rack that was removed. The skilled artisan will recognize that RFID tags 203, 205, and 207 can be written to, in order to change or reconfigure the information included in the RFID tags.

Figure 4:
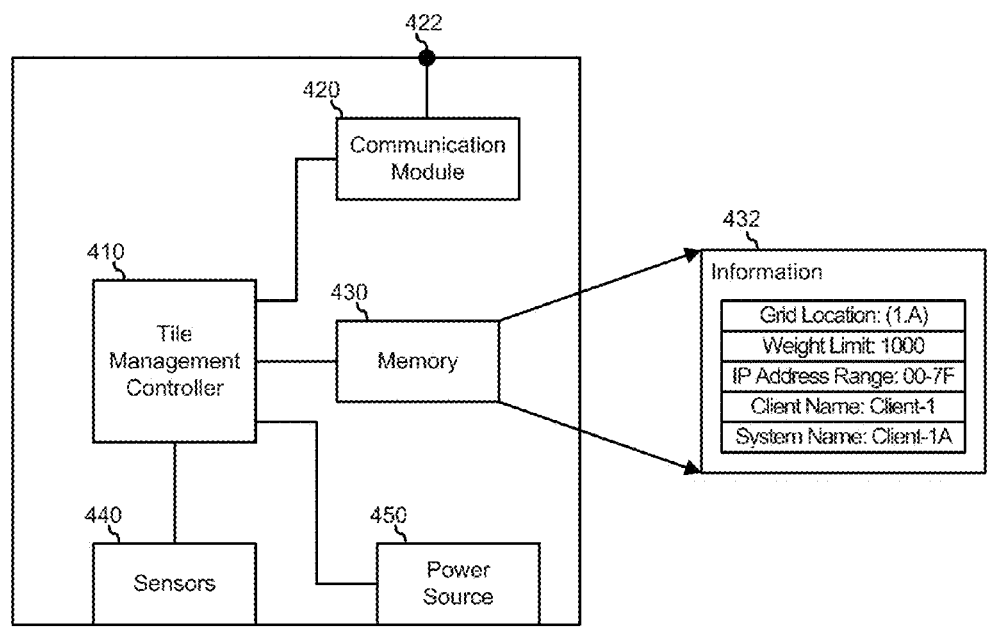
FIG. 4 is a block diagram of an active floor tile including a tile management controller according to an embodiment of the present disclosure.

FIG. 4 illustrates an embodiment of an active floor tile 400 including a tile management controller (TMC) 410, a communication module 420, a memory 430, one or more sensors 440, and a power source 450. TMC 410 represents a service processor that is connected to communication module 420, memory 430, sensors 440, and power source 450, and operates to provide intelligence to floor tile 400 to gather, process, and store information 432 related to the location and operation of the floor tile, and to permit the communication of the information. Information 432 is stored in memory 430 and includes a grid location of floor tile 400 on a floor that identifies the floor tile, a weight limit for server racks and equipment located on the floor tile, a range of IP addresses for the equipment, a client name associated with the equipment, and a system name for the equipment. Information 432 can also include other information, such as network routing information associated with the equipment located on floor tile 400, such as VLAN mappings, network sub-masks, and the like, asset information such as a model number and a serial number for the floor tile, climate information such as the temperature and humidity above or below the floor tile or elsewhere in the data center, climate settings for active cooling or heating, described further below, or other information, as needed or desired. In a particular embodiment, TMC 410 is connected to a management network that includes other service processors of the equipment and the server rack and a management system associated with the data center. In a particular embodiment, TMC 410 operates in accordance with an Intelligent Platform Management Interface (IPMI) functional implementation. Memory 430 represents a data storage device such as a non-volatile random access memory (NVRAM) or another data storage device.

Communication module 420 includes a communication port 422 that is operable to provide communications outside of floor tile 400. In particular, communication port 422 can be connected to a server rack to provide information 432 to the server rack. In addition, the server rack can direct TMC 410 to update or modify the contents of information 432. For example, if a server rack located on floor tile 400 is reconfigured to have a different range of IP addresses, the server rack can direct TMC 410 to update the IP address ranges in information 432. In this way, if the server rack is removed and a new server rack is located in its place, floor tile 400 includes the updated server rack configuration information which can be uploaded to the new server rack. Further, a manufacturer of floor tile, 400 can use communication port 422 to pre-program information 432 on the floor tile, in accordance with a customer request, and the floor tile can be supplied to a data center with the configuration information already in place, thereby speeding the installation of the server rack located at the floor tile. another embodiment, floor tile 400 is received in an unconfigured state, and information 432 is provided at the time of installation. An example of communication port 422 includes a wired communication port, such as an RS-232 port, an Ethernet port, a Universal Serial Bus (USB) port, an IEEE 1394 (Firewire) port, a Controller Area Network (CAN) port, an Inter-Integrated Circuit (I2C) port, a Serial Peripheral interface (SPI) port, or another wired communication port, a wireless communication port, such as an NFC port, an IEEE 803.11 (WiFi) port, a Bluetooth port, or another wireless communication port, or a combination thereof.

In a particular embodiment, described fully below, floor tile 400 operates to communicate with one or more adjacent floor tiles. In this embodiment, communication module 410 operates to provide communication to both the server rack and the adjacent floor tiles via communication port 422. In another case, communication module 410 includes one or more additional communication ports similar to communication port 422. Here, communication port 422 can be dedicated to the communication between TMC 410 and the server rack, and the additional communication port can be dedicated to communication between the TMC and the one or more adjacent floor tiles.

Sensors 440 operate to provide TMC 410 with information related to the environment surrounding floor tile 400. For example, sensors 440 can include temperature and humidity sensors on the top side and the bottom side of floor tile 400, and TMC 410 can provide the temperature and humidity information to a server rack or to a DCMC to provide accurate, localized feedback as to the performance of an AC system in the data center. In another example, sensors 440 can include a strain gage or other weight sensor to measure the weight of a server rack that is located on floor tile 400, and TMC 410 can provide the weight information to the server rack or the DCMC to provide a warning that the server rack is over loaded. Power source 450 represents a source of power for operating TMC 410, communication module 420, memory 430, and sensors 440. An example of power source 450 includes an off-tile power source, such as a plug in power connection to an AC power supply, a DC power supply, a Power-Over-Ethernet source, or another power connection, an on-tile power source such as a battery or generator, or a combination thereof. In a particular embodiment, information 432 includes a subset of the information, such as a grid location and a pointer to a remote storage device, from which the complete information can be retrieved.

Figure 5:
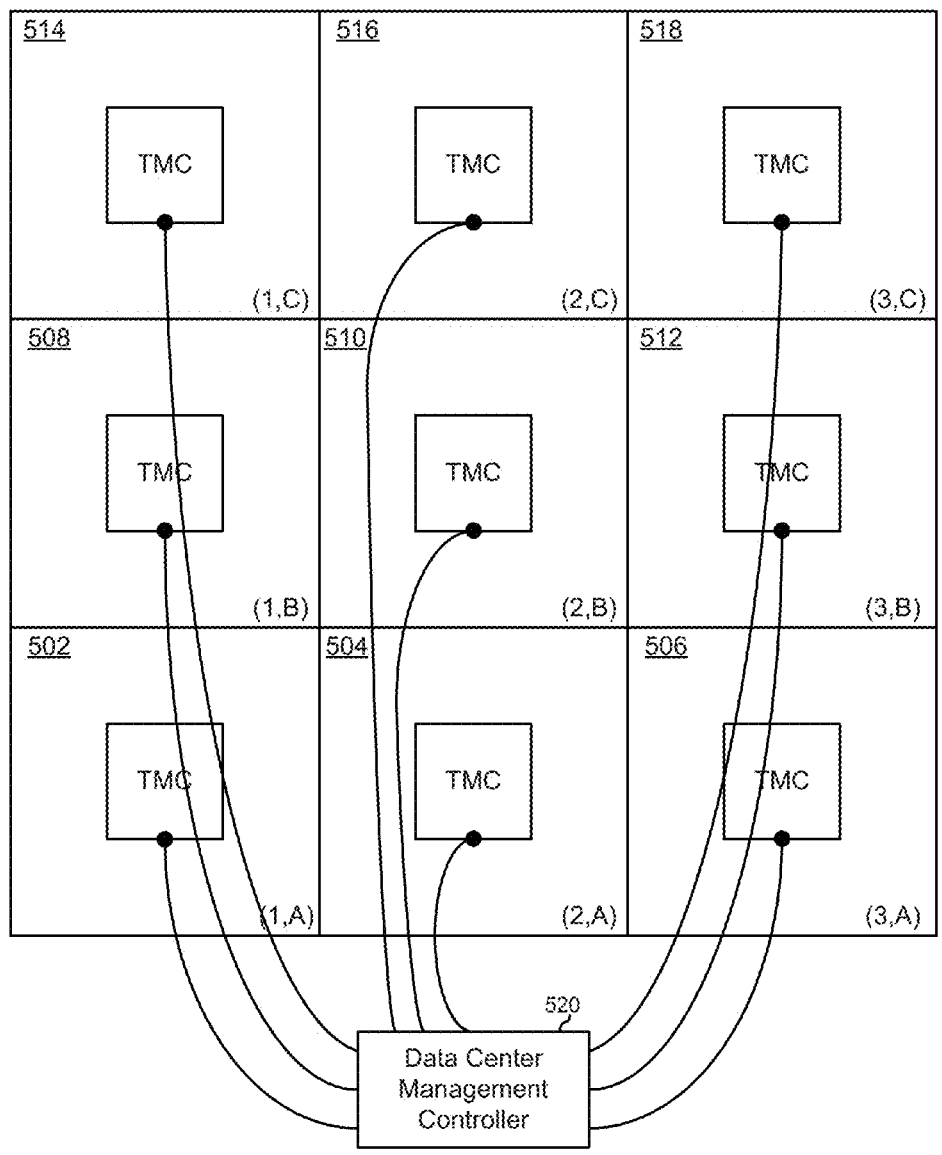
FIGS. 5-8 are block diagrams of data center floors according to various embodiments of the present disclosure.

FIG. 5 illustrates an embodiment of a data center floor 500 including active floor tiles 502, 504, 506, 508, 510, 512, 514, 516, and 518, and a DCMC 520. Active floor tiles 502-518 are similar to active floor tile 400 and each includes a TMC and a communication port that is connected to DCMC 520. As such, active floor tiles 502-518 operate to gather, process, and store information related to the location and operation of the floor tiles, and to permit the communication of the information with DCMC 520. The communication ports represent wired connections such as an RS-232 port, an Ethernet port, a USB port, a Firewire port, a CAN port, an I2C port, a SPI port, or another wired communication port, as needed or desired. Here, DCMC 520 operates to direct the TMCs to store, update, or modify the information stored on active floor tiles 502-518. In a particular embodiment, because active floor tiles 502-518 are connected to DCMC 520 via a wired connection, the active floor tiles can receive the information based upon the wired connection that is provided to the DCMC. In particular, each of active floor tiles 502-518 can include a unique identification such as a media access control (MAC) address, an Internet Protocol (IP) address, a globally unique identification (GUID), or another unique identification, and DCMC 520 can send unique information to each of the active floor tiles based upon the unique identification and a known mapping of the connections to the active floor tiles. For example, DCMC 520 can know that an active floor tile that is connected to a port that is located in the lower left-hand corner of floor 500 has a grid coordinate of (1,A), and then can send information unique to that location to any active floor tile that is connected to that port. In this way, any active floor tile can be replaced, and DCMC 520 will automatically update the replacement active floor tile with the information that is unique to the location. In a particular embodiment, each TMC can communicate with a server rack management controller of a server rack that is located on respective floor tiles 502-518, as described further below.

Figure 6:
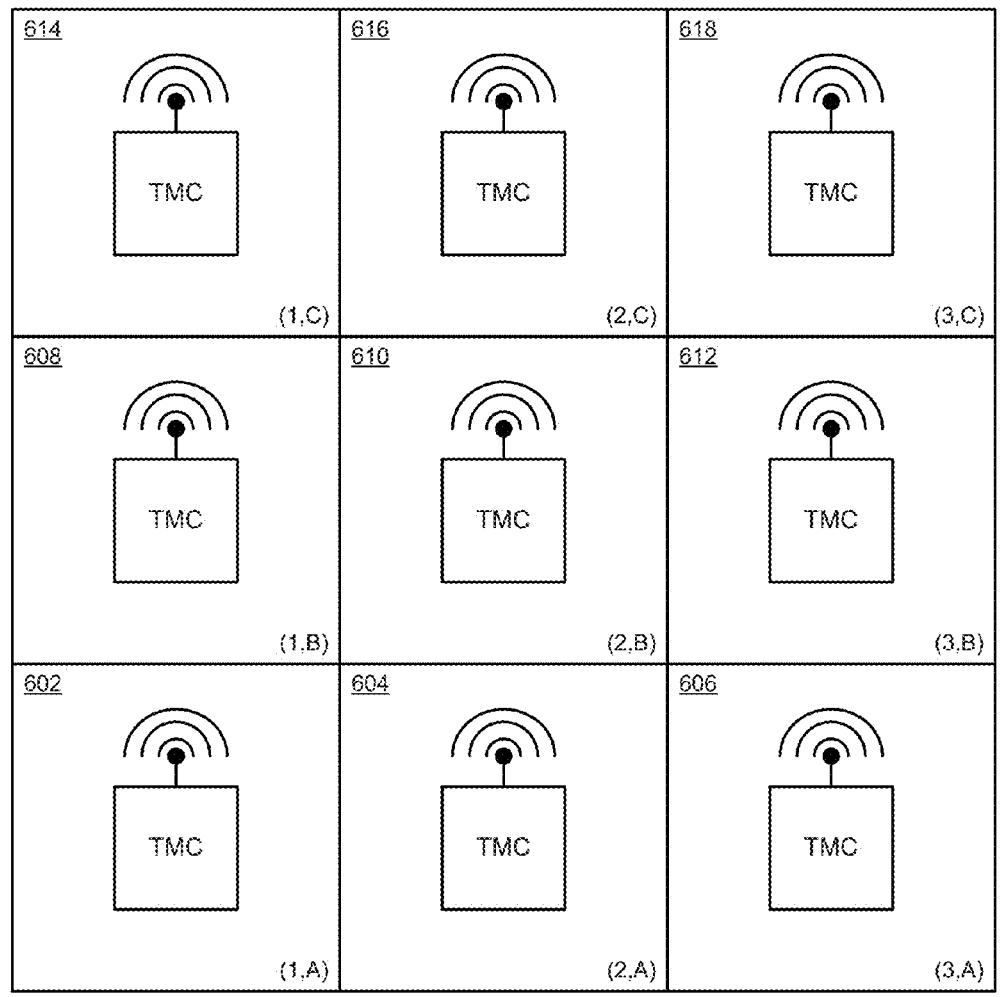

FIG. 6 illustrates an embodiment of a data center floor 600 including active floor tiles 602, 604, 606, 608 610, 612, 614, 616 and 618, and a DCMC 620. Floor 600 is similar to floor 500, except that active floor tiles 602-618 each include a wireless communication port, such as an NFC port, an IEEE 803.11 (WiFi) port, a Bluetooth port, or another wireless communication port, and each of the active floor tiles includes a unique identification. As such, DCMC 620 can communicate wirelessly with the active floor tiles to direct the TMCs to store, update, or modify unique information for each of the active floor tiles. In a particular embodiment, each TMC can communicate with a server rack management controller of a server rack that is located on respective floor tiles 602-618, as described further below.

Figure 7:
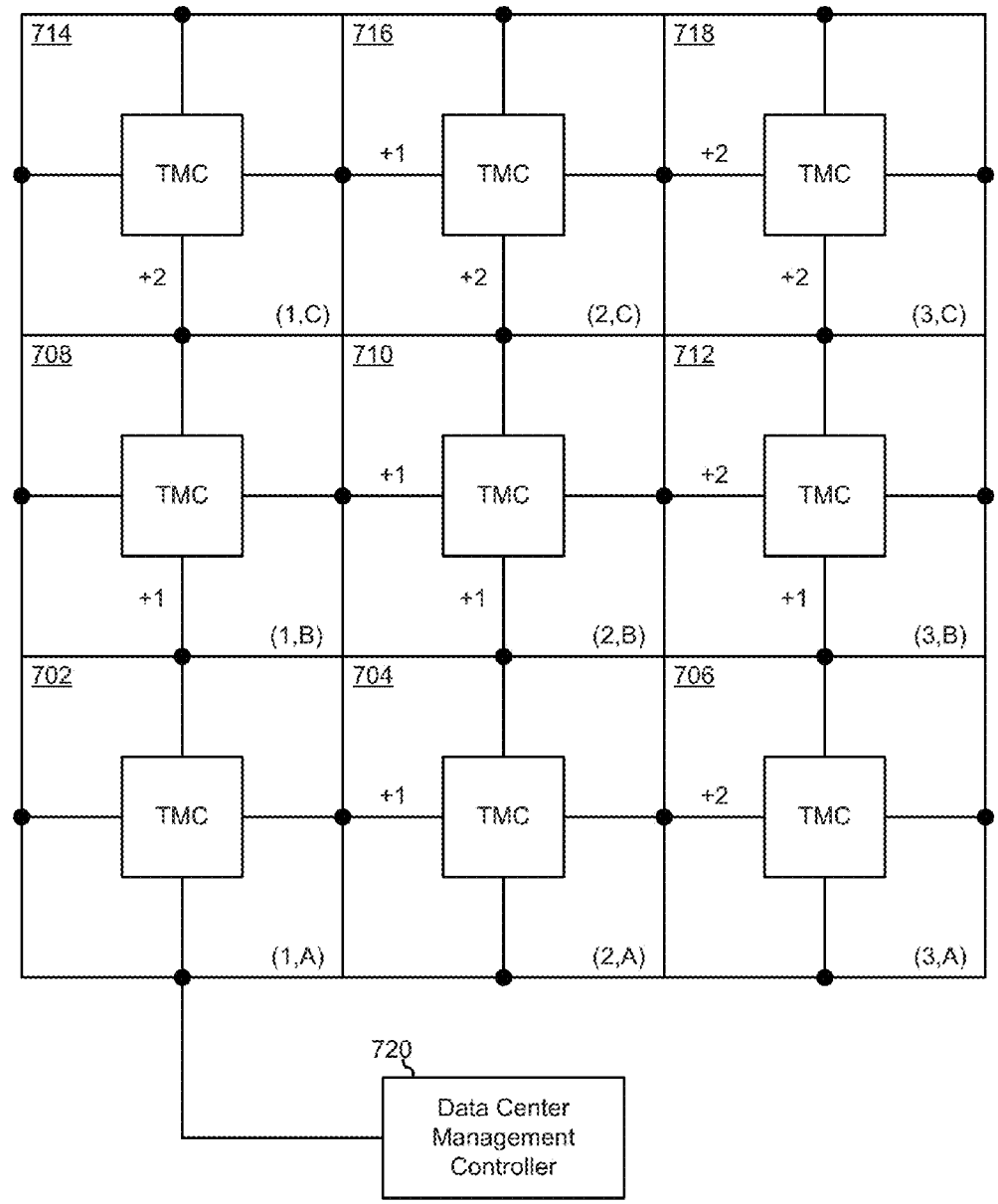

FIG. 7 illustrates an embodiment of a data center floor 700 including active floor tiles 702, 704, 706, 708 710, 712, 714, 716, and 718, and a DCMC 720. Floor 700 is similar to floor 500 and active floor tiles 702-718 are similar to active floor tile 400, including a TMC and a communication port. As such, active floor tiles 702-718 operate to gather, process, and store information related to the location and operation of the floor tiles, and to permit the communication of the information with DCMC 720. The communication ports represent wired connections. Here, only active floor tile 702 is directly connected to DCMC 720. However, each of active floor tiles 702-718 have a communication port on each edge of the active floor tiles, such that two adjacent active floor tiles are connected to each other. In a particular embodiment, because active floor tiles 702-718 are connected to each other and to DCMC 720, the active floor tiles can receive the information from the DCMC or the RMC. In particular, each of active floor tiles 702-718 can include a unique identification, and DCMC 520 can send unique information to each of the active floor tiles based upon the unique identification and a known mapping of the connections to the active floor tiles. For example, DCMC 520 can know that an active floor tile that is directly connected is located in the lower left-hand corner of floor 700, and has a grid coordinate of (1,A). Here DCMC 720 can direct active floor tiles 702-718 to perform a discovery of each active floor tile's neighbors and thereby create a map of floor 700, and then can send information unique to each location based upon the map. Further, DCMC 720 can derive a map of the physical locations of the server racks in the data center and the equipment in the server racks, and provide a graphical representation of the locations. In this way, any active floor tile can be replaced, and DCMC 720 will automatically update the replacement active floor tile with the information that is unique to the location. In a particular embodiment, each TMC can communicate with a server rack management controller of a server rack that is located on respective floor tiles 702-718, as described further below.

Figure 8:
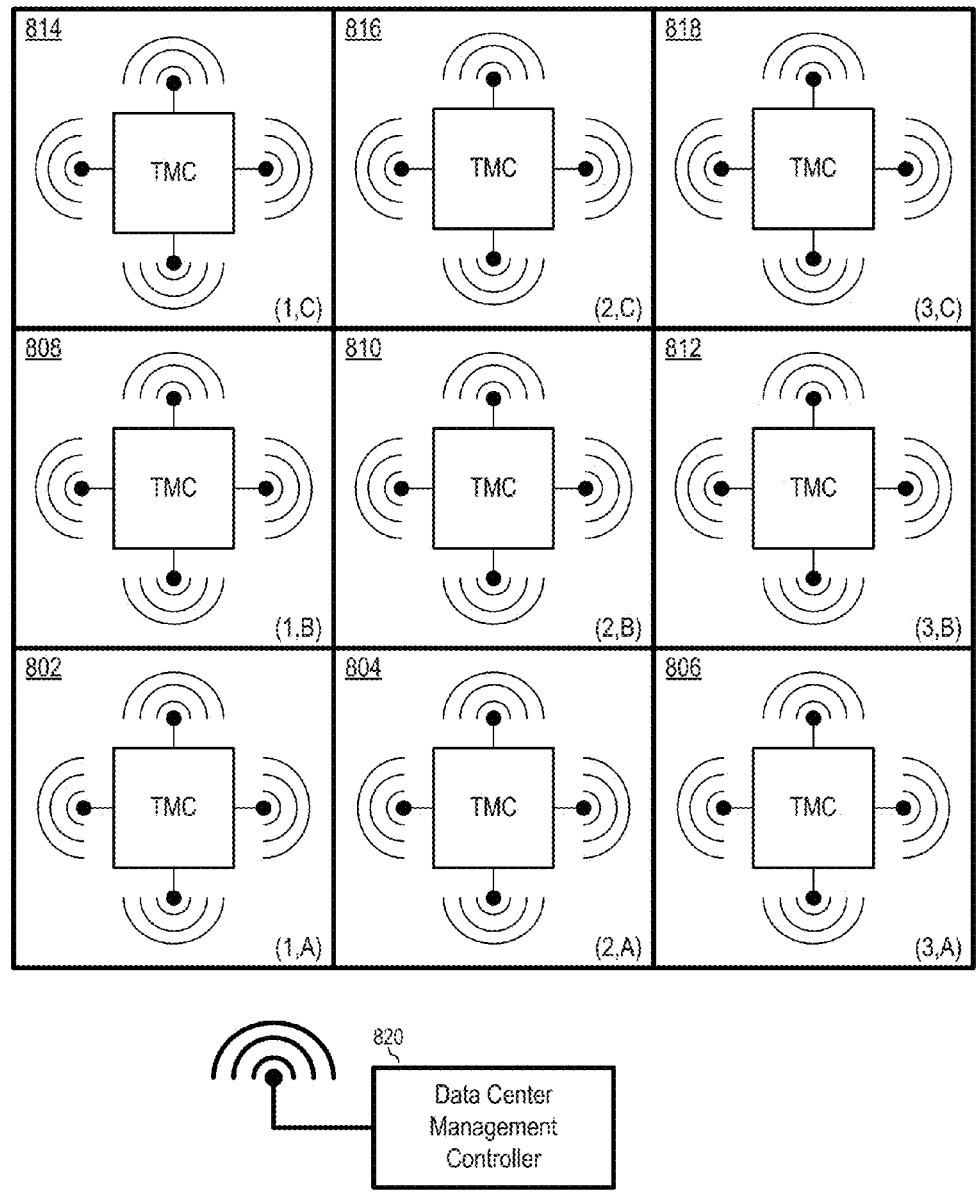

FIG. 8 illustrates an embodiment of a data center floor 800 including active floor tiles 802, 804, 806, 808, 810, 812, 814, 816, and 818, and a DCMC 820. Floor 800 is similar to floor 700, except that active floor tiles 802-818 each include a wireless communication port, such as an NFC port, an IEEE 803.11 (WiFi) port, a Bluetooth port, or another wireless communication port, such that DCMC 820 can communicate wirelessly with the active floor tiles. Active floor tiles 802-818 can be directed to perform a discovery of each active floor tile's neighbors and thereby create a map of floor 800, and DCMC 820 can send information unique to each location based upon the map. In a particular embodiment, each TMC can communicate with a server rack management controller of a server rack that is located on respective floor tiles 802-818, as described further below.

Figure 9:
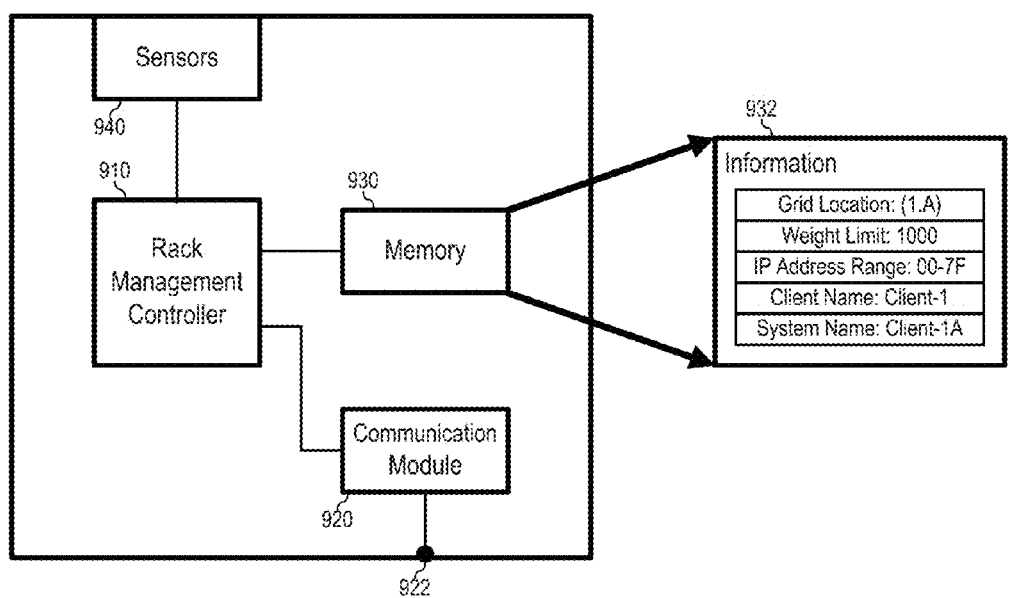
FIG. 9 is a block diagram of a server rack including a rack management controller according to an embodiment of the present disclosure.

FIG. 9 illustrates an embodiment of a server rack 900 including a rack management controller (RMC) 910, a communication module 920, a memory 930, and one or more sensors 940. RMC 910 represents a service processor that is connected to communication module 920, memory 930, and sensors 940, and operates to provide intelligence to server rack 900 to gather, process, and store information 932 related to the location and operation of the server rack and the equipment in the server rack, and to permit the communication of the information. Information 932 is stored in memory 930 and includes a grid location on a floor of a datacenter that server rack 900 is located, a weight limit for the server rack and equipment, a range of IP addresses for the equipment, a client name associated with the equipment, and a system name for the equipment. Information 932 can also include other information, such as network routing information associated with the equipment in server rack 900, such as network port and VLAN mappings, network sub-masks, and the like, asset information such as a model number and a serial number for the floor tile, climate information such as the temperature and humidity above or below the server rack, climate settings for active cooling or heating, described further below, or other information, as needed or desired. In a particular embodiment, RMC 910 is connected to a management network that includes other service processors of the equipment in server rack 900 and a management system associated with the data center. In a particular embodiment, RMC 910 operates in accordance with an IPMI functional implementation. Memory 930 represents a data storage device such as a non-volatile random access memory (NVRAM) or another data storage device.

Communication module 920 includes a communication port 922 that is operable to provide communications outside of server rack 900. In particular, communication port 922 can be connected to an active floor tile such as active floor tile 400 to provide information 932 to the active floor tile. In addition, the active floor tile can direct RMC 910 to update or modify the contents of information 932 and to modify the configurations of the equipment in server rack 900. For example, if server rack 900 is reconfigured to have a different range of IP addresses, the server rack can direct the active floor tile to update the IP address ranges in the information stored therein. In this way, if server rack 900 is removed and a new server rack is located in its place, the active floor tile includes the updated server rack configuration information which can be uploaded to the new server rack. Further, a manufacturer of server rack 900 can use communication port 922 to pre-program information 932 on the server rack, in accordance with a customer request, and the server rack can be supplied to a data center with the configuration information already in place, thereby speeding the installation of the server rack. In another embodiment, server rack 900 is received in an unconfigured state, and information 932 is provided at the time of installation. An example of communication port 922 includes a wired communication port, such as an RS-232 port, an Ethernet port, USB port, a Firewire port, a CAN port, an I2C port, a SPI port, or another wired. communication port, a wireless communication port, such as an NFC port, a WiFi port, a Bluetooth port, or another wireless communication port, or a combination thereof.

Sensors 940 operate to provide RMC 910 with information related to the environment surrounding server rack 900 and of the data center. For example, sensors 940 can include temperature and humidity sensors on the top side and the bottom side of server rack 900, and RMC 910 can provide the temperature and humidity information to an active floor tile or to a DCMC to provide accurate, localized feedback as to the performance of an AC system in the data center. In another example, sensors 940 can include a strain gage or other weight sensor to measure the weight of server rack 900, and RMC 910 can provide the weight information to DCMC to provide a warning that the server rack is over loaded. For example, a static weight capacity can be exceeded, a location/floor weight capacity can be exceeded, or a server rack dynamic weight capacity can be exceeded.

In a particular embodiment, RMC 910 operates to provide a management access point for the equipment in server rack 900, such that the RMC can manage the service processor functions for the entire server rack, For example, RMC 910 can provide for the management of the sensor data and power functions of the servers and chassis that are installed in server rack 900, manage the inventory of the server rack, monitor equipment hardware, operating software and environmental statuses in the servers and chassis, provide lifecycle management and firmware updates, or other service processor functions, as needed or desired. In another case, RMC 910 also operates as a management access point for passive and active floor tiles upon which server rack 900 is located. In another embodiment, RMC 900 operates to aggregate the management functions of other similar server racks, providing a centralized access point between the other server racks and the data center management system.

Figure 10:
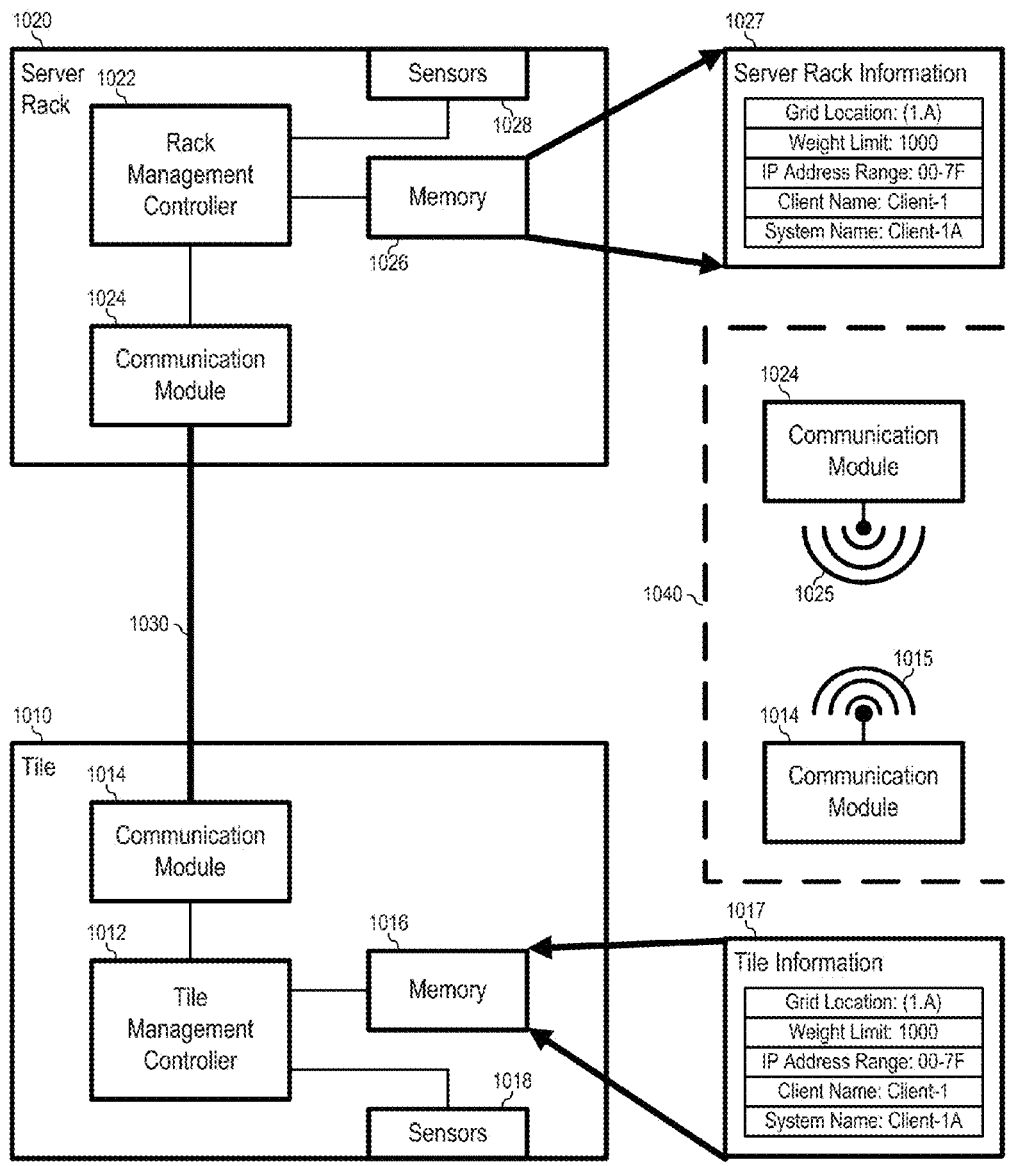
FIG. 10 is a block diagram of a data center including an active floor tile and a server rack according to an embodiment of the present disclosure.

FIG. 10 illustrates an embodiment of a data center 1000 including an active floor tile 1010 and a server rack 1020. Active floor tile 1010 is similar to active floor tile 400, and includes a TMC 1022, a communication module 1024, a memory 1026, and one or more sensors 1028. Server rack 1020 is similar to server rack 900, and includes a RMC 1022, a communication module 1024, a memory 1026, and one or more sensors 1028. Here, memory 1016 includes tile information 1017 similar to information 432 in memory 430 of active floor tile 400. When server rack 1020 is installed on active floor tile 1010, a wired connection 1030 is provided between communication module 1014 and communication module 1024. Tile information 1017 is then provided to RMC 1022 for storage in memory 1026 as server rack information 1027. In a particular embodiment, tile information 1017 includes configuration information for the equipment in server rack 1020, that can be implemented via the equipment's service processor network, such as a BMC, an iDRAC, or another service processor. In this way, the operations of server rack 1020 are tethered to the location of active floor tile 1010. An example of wired connection 1030 includes an RS-232 port, an Ethernet port, a USB port, a Firewire port, a CAN port, an I2C port, a SPI port, another wired communication port, or a combination thereof. In another embodiment, communication module 1014 includes a wireless communication port 1015 and communication module 1024 includes a wireless communication port 1025, and when server rack 1020 is installed on active floor tile 1010, a wireless connection 1040 is provided between communication module 1014 and communication module 1024. An example of wireless connection 1040 includes an NFC port, a WiFi port, a Bluetooth port, a other wireless communication port, or a combination thereof.

Figure 11:
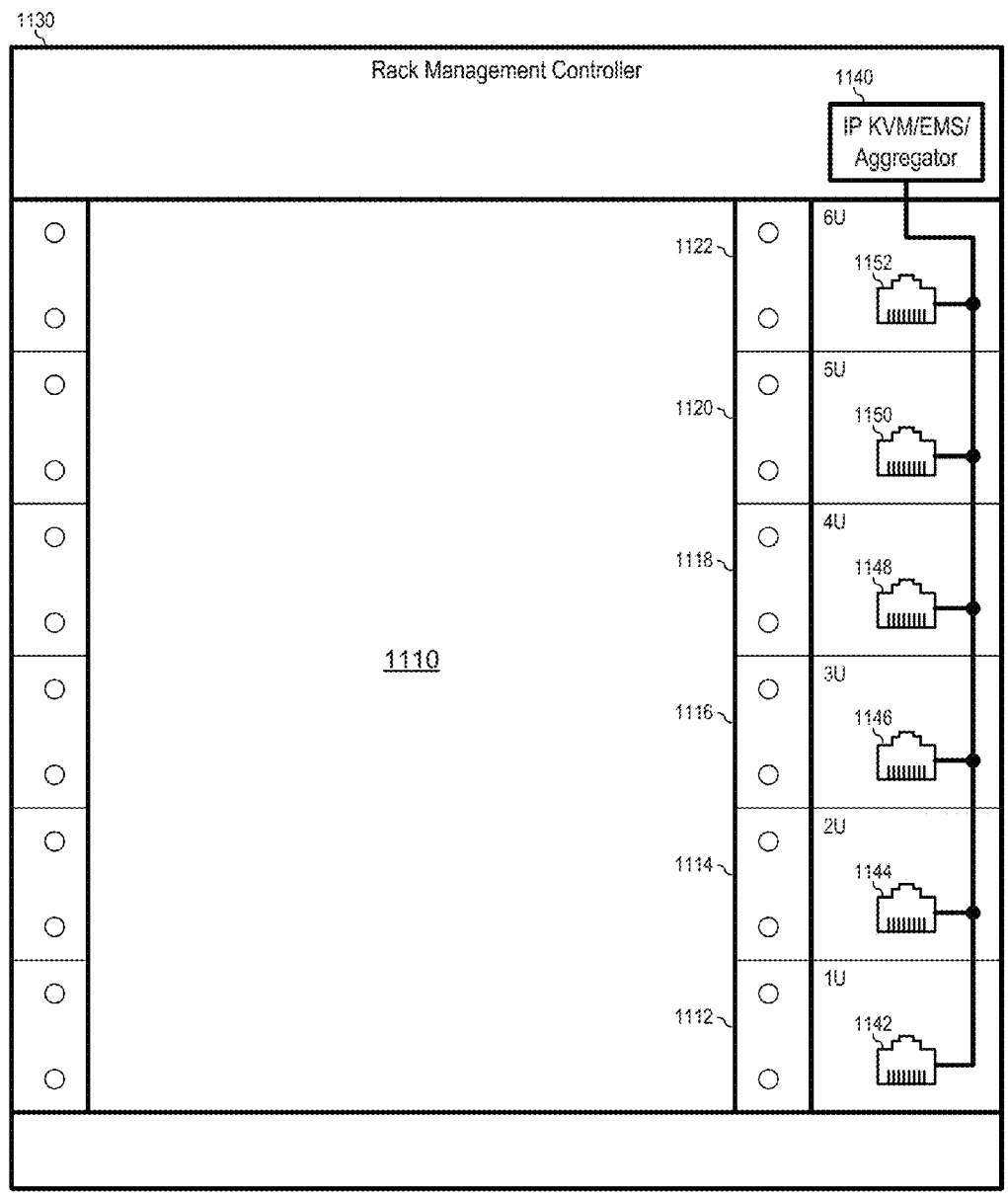
FIGS. 11-15 are illustrations of server racks according to various embodiments of the present disclosure.
Figure 12:
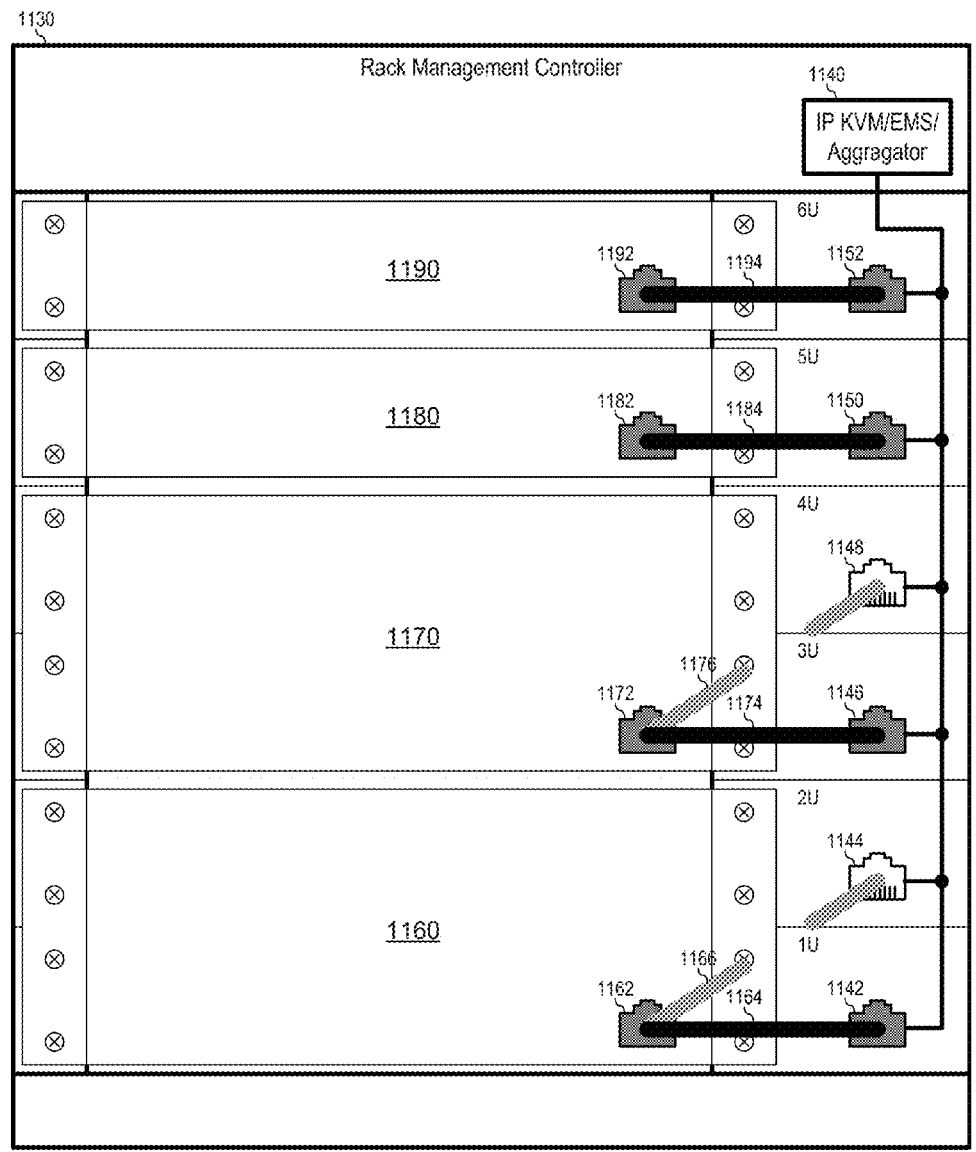

FIGS. 11 and 12 illustrate an embodiment of a server rack 1100 including a rack space 1110, and a RMC 1130 with an IP Keyboard/Video/Mouse (KVM)-Ethernet Management Switch-Serial Aggregator 1140, hereinafter "aggregator 1140." Rack space 1110 represents a standard server rack, such as a 19-inch rack equipment mounting frame or a 23-inch rack equipment mounting frame, and includes rack units 1112, 1114, 1116, 1118, 1120, and 1122. Rack units 1112-1122 represent special divisions of rack space 1110 that are a standardized unit of 1.75 inches high. For example, a piece of equipment that will fit an one of rack units 1112-1122 shall herein be referred to as a 1-U piece of equipment, another piece of equipment that takes up two of the rack units is commonly referred to as a 2-U piece of equipment, and so forth. As such, rack units 1112-1122 are numbered sequentially from the bottom to the top as 1U, 2U, 3U, 4U, 5U, and 6U. The skilled artisan will recognize that other configurations for rack units 1112-1122 can be utilized as needed or desired. For example, a rack unit can be defined by the Electronic Components Industry Association standards council.

Server rack 1100 is similar to server rack 900, and thus RMC 1130 is connected to a communication module, a memory, and one or more sensors (not illustrated) of server rack 1100. Aggregator 1140 includes the functions of an IP KVM that permits the remote access to the keyboard, video, and mouse functions of the equipment that is installed in server rack 1100. For example, a remote operator can access the keyboard, video, and mouse functions of a server that is installed in server rack 1100 by addressing IP packets to the Ethernet port of the server. The skilled artisan will recognize that other network protocols can be used to access the keyboard, video, and mouse functions of the equipment that is installed in server rack 1100, as needed or desired. Aggregator 1140 also includes the functions of a Ethernet management switch that establishes a management network between the service processors of the equipment installed in server rack 1100, and a management system of the data center. Aggregator 1140 also includes the functions of an I/O aggregator for stand-atone servers installed in server rack 1100. As such, aggregator 1140 integrates separate functions that would otherwise consume rack space 1110 into a separate unit that can be located in the top, the bottom, or the sides of server rack 1100. As illustrated, aggregator 1140 is included as an element of RMC 1130, but this implementation is only exemplary, and the functions of RMC 1130 and aggregator 1140 can be integrated into other devices as needed or desired. For example, an Ethernet management switch can be embodied which includes the functions of an IP KVM, an I/O aggregator, and a RMC, an IP KVM can be embodied to include the functions of an Ethernet management switch, and I/O aggregator, and a RMC, or another combination can be embodied, as needed or desired.

Aggregator 1140 is connected to a service port 1142 associated with rack unit 1112, a service port 1144 associated with rack unit 1114, a service port 1146 associated with rack unit 1116, a service port 1148 associated with rack unit 1118, a service port 1150 associated with rack unit 1120, and a service port 1152 associated with rack unit 1122. For the purposes of this disclosure, a service port represents a data communication link that provides for a connection to one or more service processors on a management network of the data center. For example service ports 1142-1152 provide a connection to RMC 1130 and equipment that is connected to one of the service ports forms a node on the management network.

Aggregator 1140 operates to distinguish between equipment that is connected to a first service port 1142, 1144, 1146, 1148, 1150, or 1152, and equipment that is connected to a second service port. In a particular embodiment, aggregator 1140 distinguishes between service ports because each service port is connected to a unique port of the aggregator. For example, utilizing the Ethernet management switch function of aggregator 1140, each of service ports 1142-1152 can be connected to a port of the aggregator that is uniquely associated with respective rack units 1112-1122, but this is not necessarily so, and the skilled artisan will recognize that other schemes for associating the service ports with the rack units can be utilized, as needed or desired. In a particular embodiment, service ports 1142-1152 are collocated physically with the associated rack units 1112-1122, as illustrated. In this embodiment, RMC 1130, aggregator 1140 and service ports 1142-1152 can be integrated into a single field replaceable unit (FRU) that is installed along the side of server rack 1100, such that the inclusion of the RMC, the aggregator, and the service ports does not necessitate an increase in the height of the server rack. For example, as described more fully below, RMC 1130, aggregator 1140 and service ports 1142-1152 can be integrated with a power distribution unit (PDU) of server rack 1100. The skilled artisan will recognize that rack units 1112-1122 can be ordered from the bottom of server rack 1130 to the top of the server rack, or can be ordered from the bottom of the server rack to the top of the server rack, as needed or desired.

FIG. 12 illustrates server rack 1100 wherein rack space 1110 is populated with two 2-U servers 1160 and 1170, and with two 1-U servers 1180 and 1190. 2-U server 1160 is installed in rack spaces 1112 and 1114, 2-U server 1170 is installed in rack spaces 1116 and 1118, 1-U server 1180 is installed in rack space 1120, and 1-U server 1190 is installed in rack space 1122, 2-U server 1160 includes a service port 1162, 2-U server 1170 includes a service port 1172, 1-U server 1180 includes a service port 1182, and 1-U server 1190 includes a service port 1192. As illustrated, service port 1162 is connected to service port 1142 via a connector cable 1164, service port 1172 is connected to service port 1146 via a connector cable 1174, service port 1182 is connected to service port 1150 via a connector cable 1184, and service port 1192 is connected to service port 1152 via a connector cable 1194. Service ports 1162, 1172, 1182 and 1192 are each connected to a respective service processor (not illustrated) that comprises a node on the management network provided by RMC 1130.

Note that, because aggregator 1140 operates to distinguish between equipment that is connected to service ports 1142-1152, RMC 1130 is operable to identify that 2-U server 1160 is connected at rack space 1112, that 2-U server 1170 is connected at rack space 1116, that 1-U server 1180 is connected at rack space 1120, and that 1-U server 1190 is connected at rack space 1122. In a particular embodiment, connector cables 1164, 1174, 1184, and 1194 are custom made such that they can only reach between one of service ports 1142-1152 a service port on a piece of equipment that is adjacent to the respective rack spaces 1112, 1114, 1116, 1118, 1120, and 1122. Thus, for example, connector cable 1184 is unable to span between service port 1150 and either service ports 1172 or 1192. In this way, not only are servers 1160, 1170, 1180, and 1190 uniquely associated with respective service ports 1142, 1146, 1150, and 1152, but also, the servers are identified as being physically located in respective rack spaces 1112, 1116, 1120, and 1122. Further, in a situation where 2-U servers 1160 and 1170 identify themselves to RMC 1130 as being 2-U pieces of equipment, then 2-U server 1160 is also identified as being physically located in rack spaces 1112 and 1114, and 2-U server 1170 is identified as being physically located in rack spaces 1116 and 1118. Even in an embodiment where connector cables 1164, 1174, 1184, and 1194 are general purpose cables that can reach between any one of service ports 1142, 1144, 1146, 1148, 1150, and 1152 and a service port on any piece of equipment installed in server rack 1100, the benefit of identifying the physical location of each piece of equipment is achieved by simply connecting each piece of equipment to the service port 1142-1152 that is most closely associated with the piece of equipment.

Figure 13:
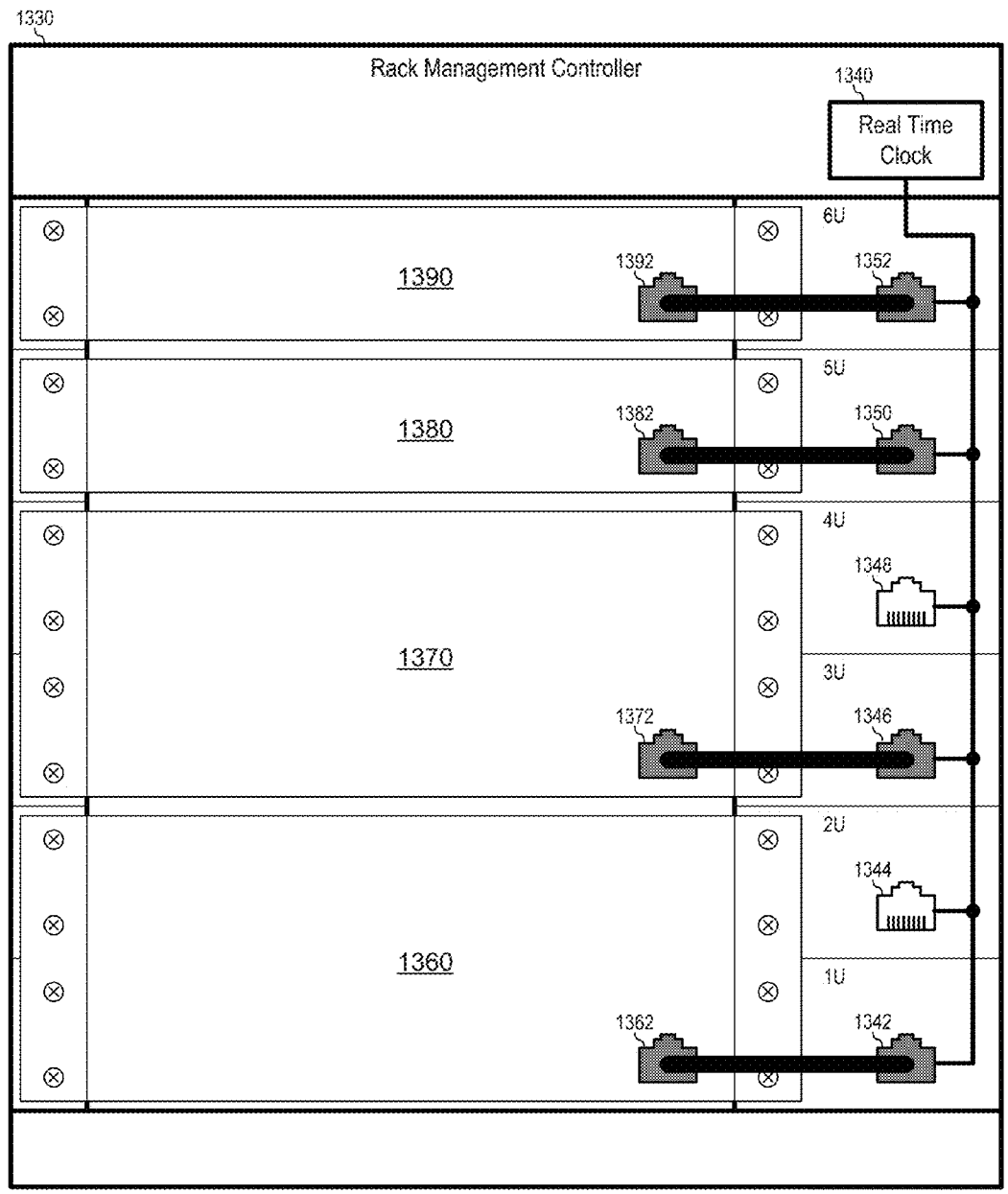

In a particular embodiment, RMC 1130 provides a map of the physical locations of the equipment installed in server rack 1100 to a DCMC. Here, the DCMC operates to receive such location maps from each server rack in a data center, and creates a map of the physical locations of all of the equipment in the data center. In this way, when there is a problem with a particular piece of equipment, a service technician can be provided information that identifies the server rack that includes the piece of equipment, and the location within the server rack, eliminating the time-consuming process of tracking down the piece of equipment by hand. In a particular embodiment, a piece of equipment that is a multi-rack-unit piece of equipment can have a service port located proximate to other than a bottom rack unit. For example, a 2-U server can have a service port that is located proximate to a top of the server, a 3-U server can have a service port that is located proximate to a middle of the server, or another configuration for the service port can be provided by a server. Here, aggregator 1140 operates to determine the location of the equipment based upon information provided by the server as to the location of the service port in the equipment. In another embodiment, where apiece of equipment is a multi-rack-unit piece of equipment, the service port on the piece of equipment can be connected. to the service port of the server rack that is associated with the top rack unit of the piece of equipment, and RMC 1130 operates to locate the piece of equipment based upon the connection. In this embodiment, the choice of connection to the service port associated with the top rack unit or to the service port associated with the bottom rack unit is user selectable. For example, service port 1162 can be connected to service port 1144, and service port 1172 can be connected to service port 1148, as illustrated by connectors 1166 and 1176, respectively FIG. 13 illustrates an embodiment of a server rack 1300 similar to server rack 1100 and including a RMC 1330 with a real time clock 1340, and RMC 1330 is connected to a communication module, a memory, and one or more sensors (not illustrated) of the server rack. Real time clock 1340 is connected to a service port 1342 associated with a rack unit 1U, a service port 1344 associated with a rack unit 2U, a service port 1346 associated with a rack unit 3U, a service port 1348 associated with a rack unit 4U, a service port 1350 associated with a rack unit 5U, and a service port 1352 associated with a rack unit 6U. Server rack 1300 is populated with two 2-U servers 1360 and 1370, and with two 1-U servers 1380 and 1390. 2-U server 1360 includes a service port 1362 that is connected to service port 1342, 2-U server 1370 includes a service port 1372 that is connected to service port 1346, 1-U server 1380 includes a service port 1382 that is connected to service port 1350, and 1-U server 1390 includes a service port 1392 that is connected to service port 1352. Service ports 1362, 1372, 1382 and 1392 are each connected to a respective service processor (not illustrated) that comprises a node on the management network provided by RMC 1330.

Real time clock 1340 operates to provide a consistent time base for server rack 1300. In a particular embodiment, real time clock 1340 includes a battery operable to maintain power to a clock circuit that maintains an accurate time stamp. For example, real time clock 1340 can operate to provide an accuracy of 2 to 3 seconds per day. Additionally, RMC 1220 operates to make periodic contact with a time-base service such as an atomic clock system that provides a Network Time Protocol (NTP) based synchronized time-stamp to maintain the accuracy of real time clock 1340. For example, using the NTP timestamp, real time clock 1340 can maintain an accuracy of better than one millisecond. Moreover, by coordinating real time clocks in other server racks of the data center, the entire data center can maintain a similar accuracy.

In a particular embodiment, servers 1360, 1370, 1380, and 1390 operate to obtain the timestamp from real time clock 1340, such that the servers also maintain a high degree of accuracy. Moreover, because servers 1360, 1370, 1380, and 1390 obtain the timestamp from real time clock 1340, the servers do not include their own separate real time clock functions, thereby saving on the cost of the components to provide the real time clock function, and also saving space on the motherboards of the servers. In another embodiment, RMC 1310 also represents other shared functions for servers 1360, 1370, 1380, and 1390. For example, RMC 1310 can include warning or critical status handlers for servers 1360, 1370, 1380, and 1390, log handlers for the servers, housekeeping information for the servers, and the like.

Figure 14:
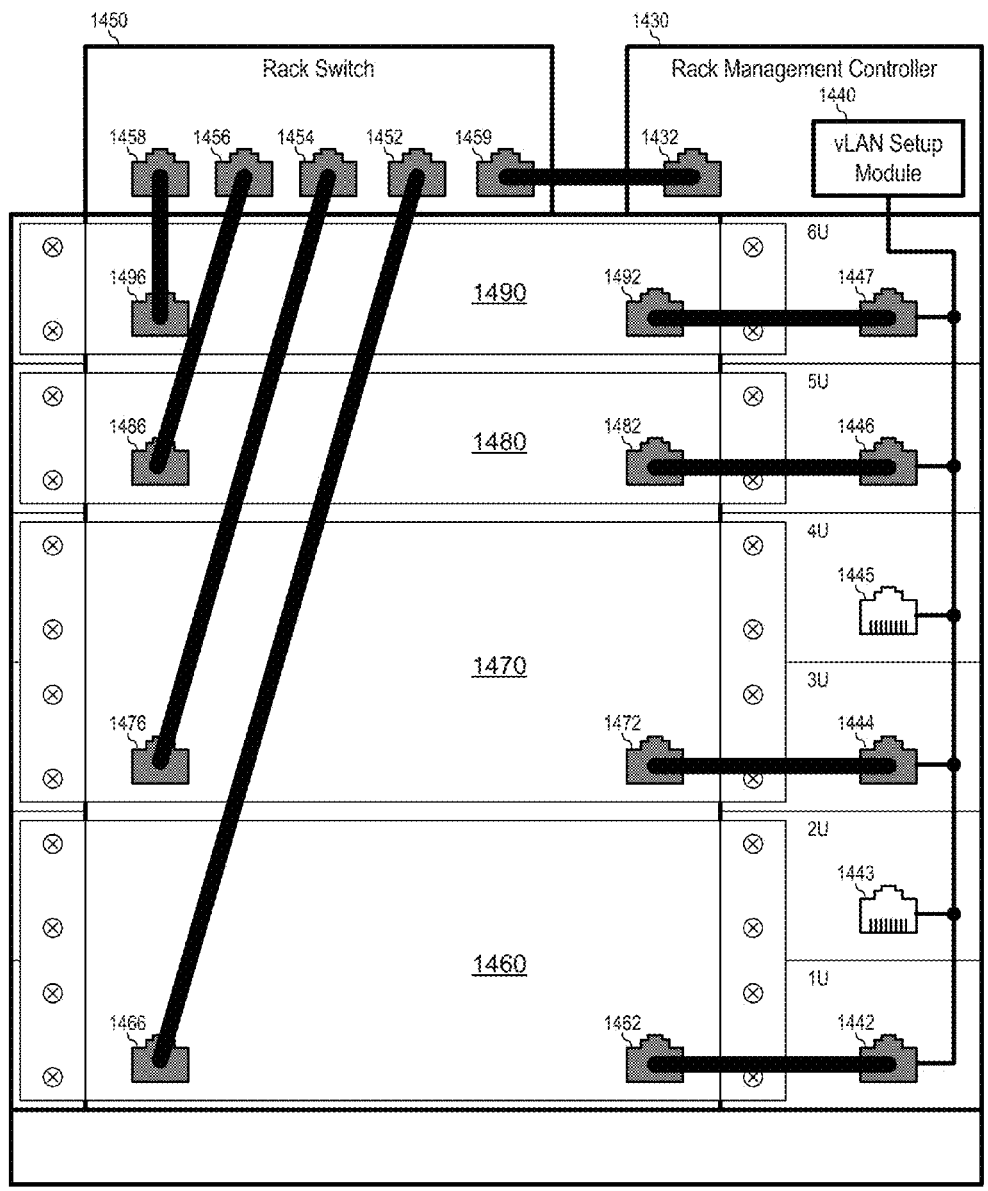

FIG. 14 illustrates an embodiment of a server rack 1400 similar to server rack 1100 and including a RMC 1430 with a vLAN setup module 1440, and a rack switch 1450, and RMC 1430 is connected to a communication module, a memory, and one or more sensors (not illustrated) of the server rack. vLAN setup module 1440 is connected to a service port 1442 associated with a rack unit 1U, a service port 1443 associated with a rack unit 2U, a service port 1444 associated with a rack unit 3U, a service port 1445 associated with a rack unit 4U, a service port 1446 associated with a rack unit 5U, and a service port 1447 associated with a rack unit 6U. Server rack 1400 is populated with two 2-U servers 1460 and 1470, and with two 1-U servers 1480 and 1490. 2-U server 1460 includes a service port 1462 that is connected to service port 1442, 2-U server 1470 includes a service port 1472 that is connected to service port 1444, 1-U server 1480 includes a service port 1482 that is connected to service port 1446, and 1-U server 1490 includes a service port 1492 that is connected to service port 1447. Service ports 1462, 1472, 1482 and 1492 are each connected to a respective service processor (not illustrated) that comprises a node on the management network provided by RMC 1430.

Rack switch 1450 includes a host port 1452 connected to a host port 1466 of server 1460, a host port 1454 connected to a host port 1476 of server 1470, a host port 1456 connected to a host port 1486 of server 1480, a host port 1458 connected to a host port 1496 of server 1490, and a service port. 1459 connected to a service port 1432 of RMC 1430. For the purposes of this disclosure, a host port represents a data communication link that provides a connection between one or more host processors on a server to a primary network of the data center. For example host ports 1452-1458 provide a connection for servers 1460, 1470, 1480, and 1490 to have access to a network backbone or other server racks on the primary network of the data center.

In a particular embodiment, RMC 1430 operates to detect, based upon the physical location within server rack 1400 of the servers 1460, 1470, 1480, and 1490, which host port 1452 1454, 1456, or 1458 is connected to which server. Here, RMC 1430 communicates via the management network to service processors of servers 1460, 1470, 1480, and 1490, and receives information related to the identifications of the respective host ports 1466, 1476, 1486, and 1496. For example, RMC 1430 can receive the MAC addresses of host ports 1466, 1476, 1486, and 1496, the IP addresses of the host ports, or other information that identifies the host ports. Further, RMC 1430 communicates via the management network to a service processor of rack switch 1450 and receives information related to which of host ports 1452-1458 are connected to the particular identified host ports 1466, 1476,1486, and 1496 (i.e., to which particular MAC or IP address). In this way, RMC 1430 provides a physical port map of the connections on server rack 1400. Further, RMC 1430 operates to provide the port map to a DCMC of the data center, and the DCMC combines the port map with other similar port maps received from the other server racks to provide a physical port map of the connections within the data center.

In a particular embodiment, vLAN setup module 1440 operates to determine, via the management network to service processors of servers 1460, 1470, 1480, and 1480, whether or not one or more of the servers are provisioned for any vLANs. For example, one or more of servers 1460, 1470, 1480, and 1490 can provide a virtualized operating environment that can establish a separate vLAN for each virtual machine that is instantiated on the server. Then, based upon the connection map, vLAN setup module 1440 directs, via the management network to a service processor of rack switch 1450, the rack switch to configure host ports 1452-1458 for the detected vLANs. Further, vLAN setup module 1440 operate to communicate via the management network to the DCMC and to other server racks, the configuration information for the vLANs, such that other network switching devices in the data center can be configured for the detected vLANs. In a particular embodiment, vLAN setup module 1440 operates to detect when a new vLAN is established and to automatically configure the backbone of the data center for the newly detected vLAN.

In a particular embodiment, rack switch 1450 operates using a Spanning-Tree Protocol (STP) to prevent loops from being formed. In addition, RMC 1430 implements SPT to prevent loops when one or more of service ports 1442-1447 are utilized in a failover condition. Moreover, because RMC 1430 communicates directly with rack switch 1450 via service ports 1432 and 1459, the RMC is in a position to detect when one of host ports 1452-1458 are operating in a loop, and to notify an administrator of the loop condition. Further, because RMC 1430 operates to create a port map of the host port connections on server rack 1400, loops can be proactively prevented, because the RMC can detect via the port map that redundant paths are available, and can direct rack switch 1450 to eliminate redundant paths in the rack switch's routing tables, thereby superseding the need of SPT operations to shut down host ports or the rack switch.

Figure 15:
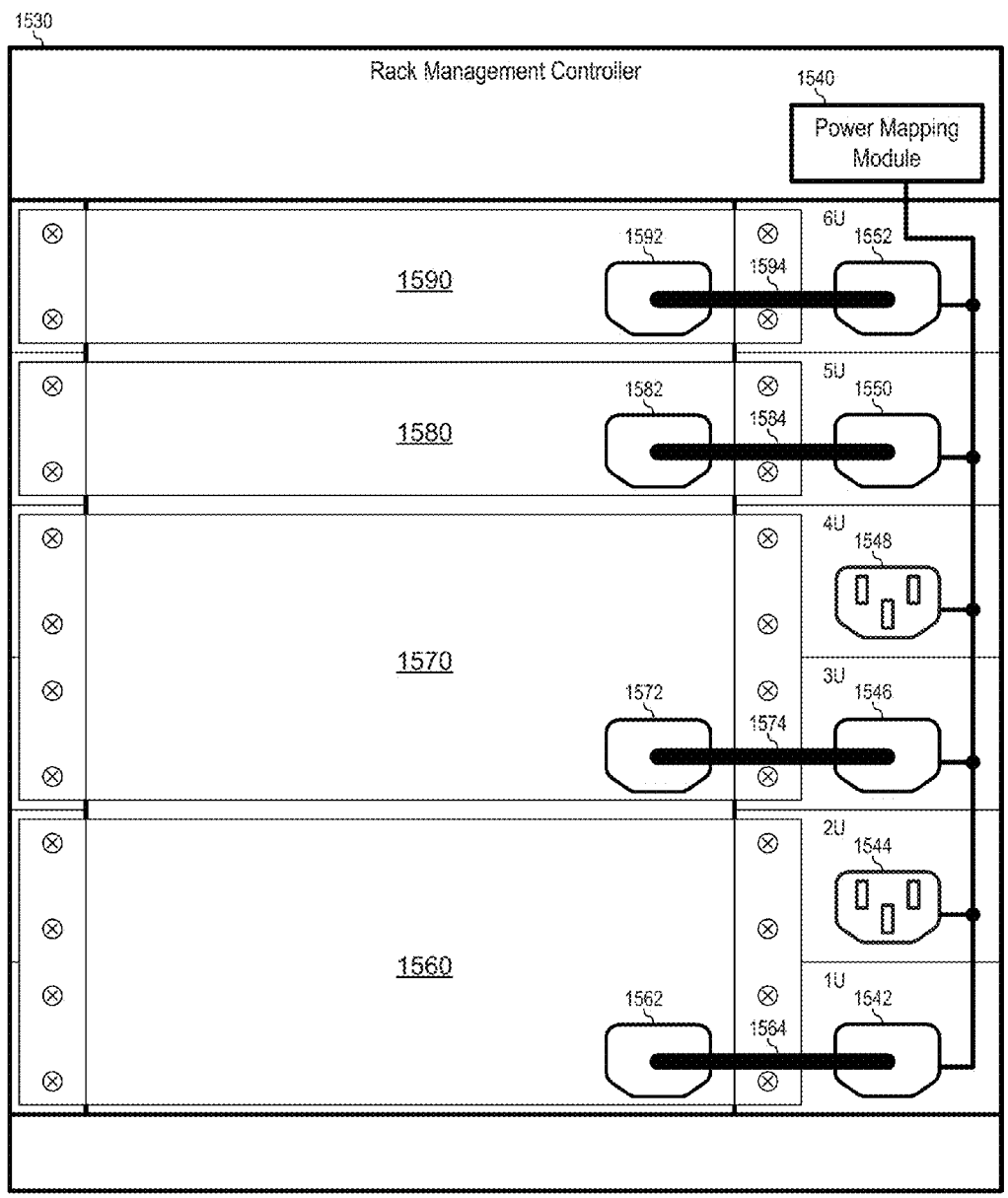

FIG. 15 illustrates an embodiment of a server rack 1500 similar to server rack 1100 and including a RMC 1530 with a power mapping module 1540, and RMC 1530 is connected to a communication module, a memory, and one or more sensors (not illustrated) of the server rack. Power mapping module 1540 is connected to a power receptacle 1542 associated with a rack unit 1U, a power receptacle 1544 associated with a rack unit 2U, a power receptacle 1546 associated with a rack unit 3U, a power receptacle 1548 associated with a rack unit 4U, a power receptacle 1550 associated with a rack unit 5U, and a power receptacle 1552 associated with a rack unit 6U. Server rack 1500 is populated with two 2-U servers 1560 and 1570, and with two 1-U servers 1580 and 1590. 2-U server 1560 includes a power receptacle 1562 that is connected to power receptacle 1542 via a power cord 1564, 2-U server 1570 includes a power receptacle 1572 that is connected to power receptacle 1546 via a power cord 1574, 1-U server 1580 includes a power receptacle 1582 that is connected to power receptacle 1550 via a power cord 1584, and 1-U server 1590 includes a power receptacle 1592 that is connected to power receptacle 1552 via a power cord 1594. Power receptacles 1562, 1572, 1582 and 1592 are each connected to a respective service processor (not illustrated) that comprises a node on the management network provided by RMC 1330.

Power mapping module 1540 operates to distinguish between equipment that is connected to a first one of power receptacles 1542, 1544, 1546, 1548, 1550, or 1552, and equipment that is connected to a second power receptacle. In particular, power mapping module 1540 can be coupled to power receptacles 1542-1552 to receive an indication when a power cord is plugged into a power receptacle. In a particular embodiment, power cords 1564, 1574, 1584, and 1594 are custom made such that they can only reach between one of power receptacles 1542, 1544, 1546, 1548, 1550, and 1552 a power receptacle on a piece of equipment that is adjacent to the respective rack spaces. Thus, for example, power cord 1584 is unable to span between power receptacle 1550 and either power receptacles 1572 or 1592. In this way, not only are servers 1560, 1570, 1580, and 1590 uniquely associated with respective power receptacles 1542, 1546, 1550, and 1552, but also, the servers are identified as being physically located in the respective rack spaces. Even in an embodiment where power cords 1564, 1574, 1584, and 1594 are general purpose power cords that can reach between any one of power receptacles 1542, 1544, 1546, 1548, 1550, and 1552 and a power receptacle on any piece of equipment installed in server rack 1500, the benefit of identifying the physical location of each piece of equipment is achieved by simply connecting each piece of equipment to the power receptacle 1542-1542 that is most closely associated with the piece of equipment. In a particular embodiment, more than one power receptacle is provided for each rack space, such that, if a piece of equipment requires more power than the number of rack spaces that the piece of equipment occupies, the power cords to each power receptacle on the piece of equipment can still be plugged into the power receptacles associated with the occupied rack spaces. In another embodiment, multiple power receptacles are included for each rack space, and each power receptacle is associated with a different power whip of the data center. In this way, redundant power and power balancing can be achieved while maintaining the benefits of having the power receptacles associated with the rack spaces.

In a particular embodiment, RMC 1530 provides a map of the physical locations of the equipment installed in server rack 1500 to a DCMC. Here, the DCMC operates to receive such location maps from each server rack in a data center, and creates a map of the physical locations of all of the equipment in the data center. In this way, when there is a problem with a particular piece of equipment, a service technician can be provided information that identifies the server rack that includes the piece of equipment, and the location within the server rack, eliminating the time-consuming process of tracking down the piece of equipment by hand. In a first case, power receptacles 1542-1552 include power line communication modules (PLC) which permit the transmitting and receiving of information from similarly equipped pieces of equipment over the power cords that connect the pieces of equipment to the power receptacles. Here, power mapping module 1540 directs each power receptacle 1542, 1546, 1550, and 1552 to broadcast a power receptacle identification to the respective servers 1560, 1570, 1580, and 1590, and the servers in turn report the power receptacle identification to RMC 1530 via the management network. In this way, RMC 1530 obtains the map of the physical locations of the equipment installed in server rack 1500. In a variation of the first case, power mapping module 1540 provides a unique identifier to each power receptacle 1542, 1546, 1550, and 1552 to be broadcast the respective servers 1560, 1570, 1580, and 1590, and the servers in turn report the unique identification to RMC 1530 via the management network. In a second case, RMC 1530 broadcasts a unique identifier over the management network to each of servers 1560, 1570, 1580, and 1590, and the servers each append their own identifications to the received unique identification and rebroadcast the unique identifiers via respective power receptacles 1562, 1572, 1582, and

1592 to the associated power receptacles 1542, 1546, 1550, and 1552. RMC 1530 then receives the unique identifiers back from power receptacles 1542, 1546, 1550, and 1552 and obtains the map of the physical locations of the equipment installed in server rack 1500.

In a particular embodiment, RMC 1530 operates to track the amount of power delivered by power receptacles 1542-1552 to the pieces of equipment that are installed in server rack 1500. RMC 1530 also maintains power limits for each piece of equipment and for server rack 1500 as a whole. Then, when RMC 1530 detects that a power limit has been exceeded, the RMC can direct the equipment to take steps to reduce the power consumption associated with the power limit. For example if one of servers 1560, 1570, 1580, or 1590 is consuming more power than the limit set for the power consumption of that server, RMC 1530 can direct the server to take steps to reduce the power consumption, such as to throttle one or more processors of the server, reduce the I/O bandwidth of the server, or prioritize tasks that are being performed by the server. In a case where a piece of equipment that is exceeding its power limit is operating a virtualized environment, RMC 1430 can direct the piece of equipment to reduce the priority of a virtual machine that is determined to be consuming a large portion of the power. In another example, if server rack 1500 is exceeding its power limit, then RMC 1530 can take steps to reduce the running average power of the server rack by throttling one or more of the pieces of equipment that are installed in the server rack. The skilled artisan will recognize that the power levels can be tracked on a per-phase basis, and that the power levels can be balanced per phase.

In another embodiment, RMC 1530 provides the power status of server rack 1500 to the DCMC of the data center, and other similarly enabled server racks provide their power status to the DCMC. Here, the DCMC operates to manage the running average power of the data center as a whole. For example, if a particular server rack is consistently consuming too much power, the DCMC can direct the migration of one or more workloads to a different server rack that is consuming less power, or can direct the RMC to throttle one or more pieces of equipment that are installed in the server rack.

In a particular embodiment, RMC 1530 operates to manage power standby of the equipment that is installed in server rack 1500. For example, where a user of the data center provides a requirement for a number of servers to be placed in a standby (S5) state, RMC 1530 can monitor the utilization of servers 1560, 1570, 1580, and 1590, and determine that a usage threshold has been exceeded. In this case, RMC 1530 operates to power up one or more of servers 1560, 1570, 1580, or 1590 such that, if the usage continues to increase, the powered up server is already booted and ready to be added to the user's needs. In another case, when the utilization decreases, RMC 1530 operates to power down one or more of servers 1560, 1570, 1580, or 1590 to conserve power. In a particular embodiment, RMC 1530, power mapping module 1540, and power receptacles 1542-1552 can be integrated with a PDU of server rack 1500.

Figure 16:
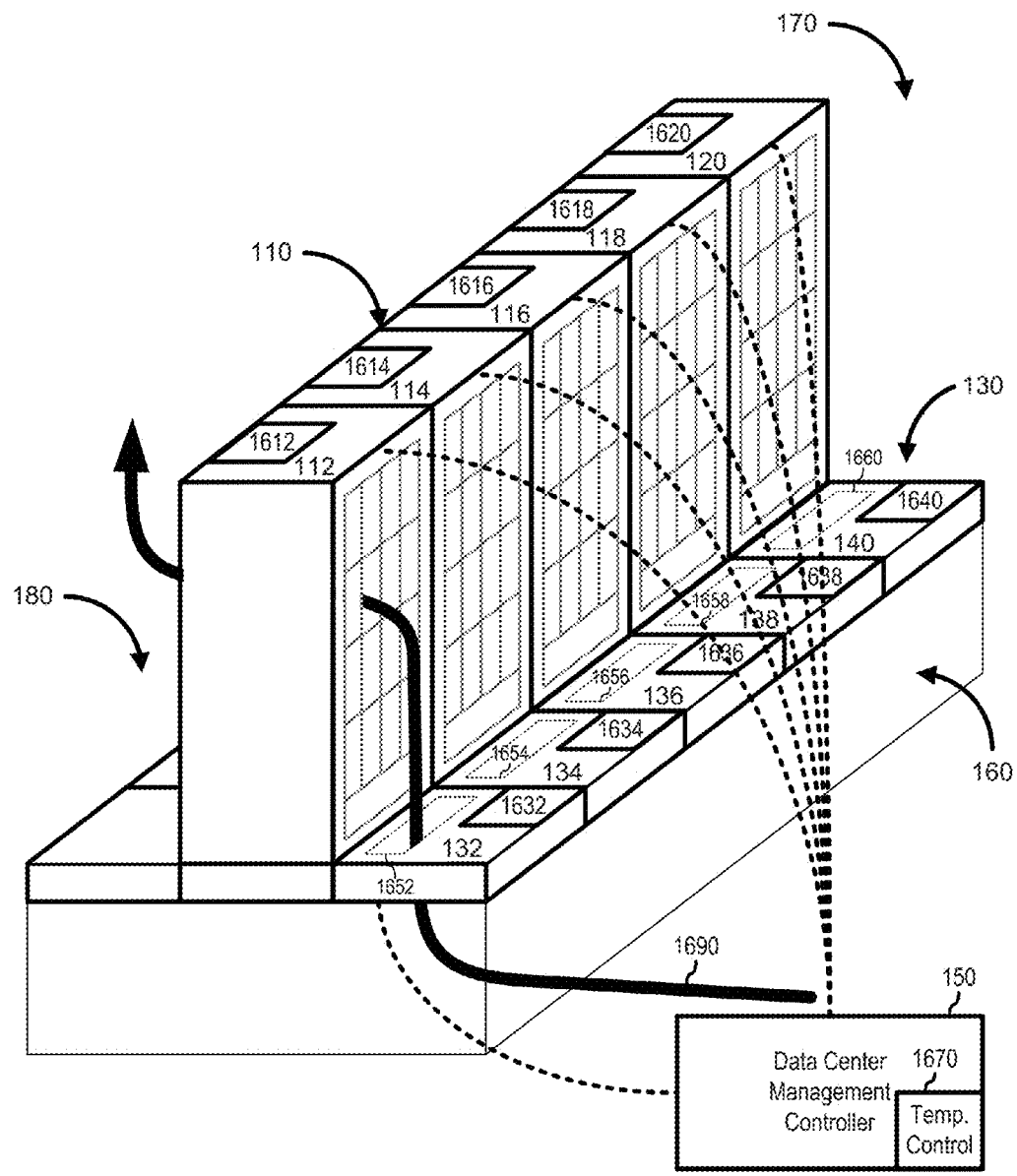
FIG. 16 is an illustration of the data center of FIG. 1 including an air flow from a data center AC system.

FIG. 16 illustrates data center 100 of FIG. 1, where server racks 112-120 include respective RMCs 11612-1620, floor tiles 132-140 include respective TMCs 1632-1640, and respective vents 1652-1660, and DCMC 150 includes a temperature control module 1670. Data center 100 operates to manage AC in the data center to control provide temperature a controlled air flow, such as an exemplary air flow 1690, to the server racks 112-120. Vents 1652-1660 permit the temperature controlled air to pass from sub-floor 160 to cold aisle 170. There, the temperature controlled air is drawn through the equipment in server racks 112-120 to cool the equipment, and the air flows out the back of the server racks, removing the heat from the equipment, and passing to hot aisle 180, where the hot air is recirculated through an AC system. In a particular embodiment, one or more of floor tiles 132-140 and server racks 112-120 operate to provide closed loop thermal control for the equipment in the server racks.

In a particular embodiment, described more filly with respect to FIG. 17, below, a floor tile operates to control whether or not air is permitted to flow through the vent of the floor tile. In another embodiment, described more fully with respect to FIG. 18, below, a server rack operates to control air flow through the server rack. In another embodiment, one or more of RMCs 1612-1620, TMCs 1632-1640, and temperature control module 1670 operates to provide preemptive/proactive cooling of the equipment in server racks 112-120 on a per rack basis and on a data center wide basis, as described more fully below. In another embodiment, described more fully with respect to FIG. 19, below, an air flow based power generator is provided for floor tile, in order to provide power for the TMC.

Figure 17:
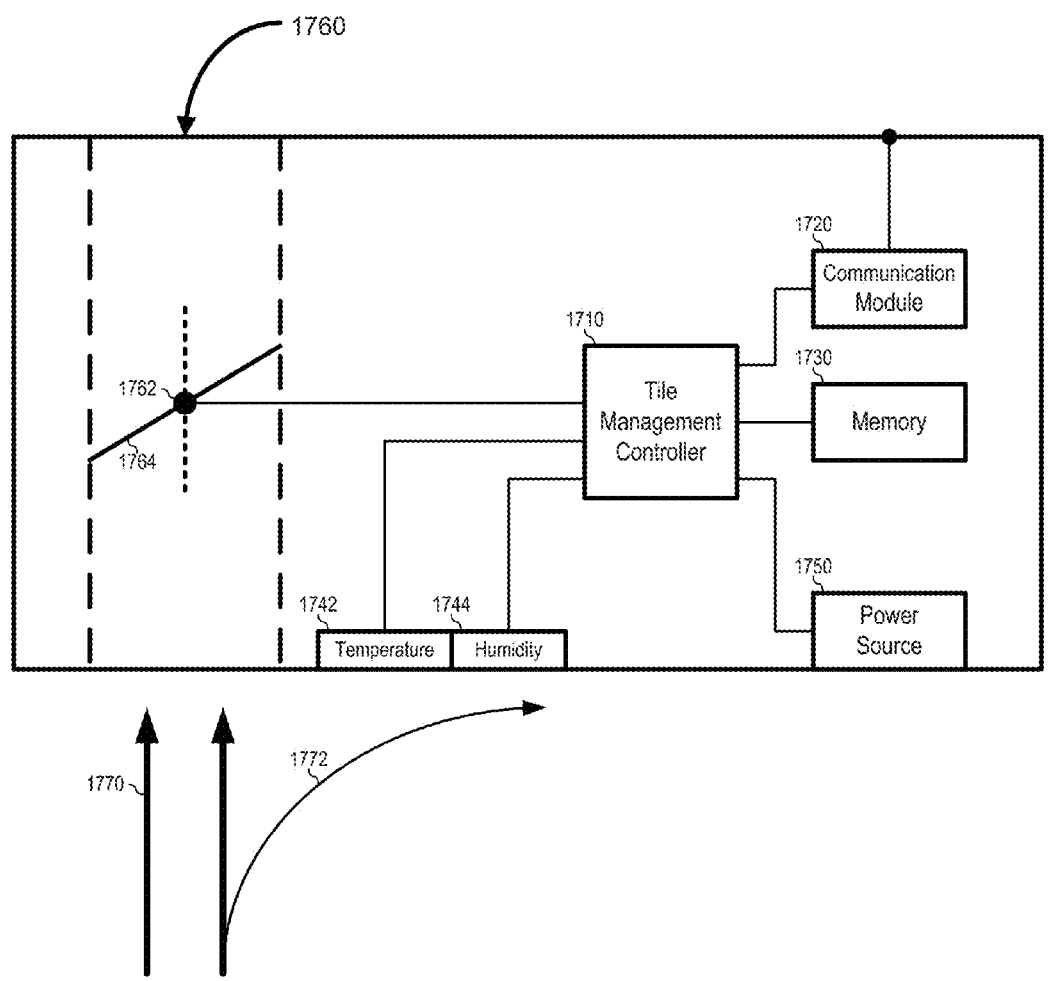
FIG. 17 is a block diagram of an active floor tile including a tile management controller and a vent according to an embodiment of the present disclosure.

FIG. 17 illustrates an embodiment of an active floor tile 1700, similar to active floor tile 400, including a TMC 1710, a communication module 1720, a memory 1730, a temperature sensor 1742, a humidity sensor 1744, a power source 1750, and a vent 1760. Vent 1760 includes an actuator 1762 and a baffle 1764. TMC 1710 represents a service processor that is connected to communication module 1720, memory 1730, sensors 1742 and 1744, power source 1750, and actuator 1762, and operates to provide intelligence to floor tile 1700 to gather, process, and store information related to the location and operation of the floor tile, and to permit the communication of the information. The information in memory 1730 includes climate information such as the temperature and humidity above or below floor tile 1700, climate settings for active cooling or heating, described further below, or other information, as needed or desired. In a particular embodiment, TMC 1710 is connected to a management network that includes other service processors of the equipment and the server rack and a management system associated with the data center. In a particular embodiment, TMC 1710 operates in accordance with an IPMI functional implementation. Memory 1730 represents a data storage device such as a non-volatile random access memory (NVRAM) or another data storage device.

Communication module 1720 includes a communication port that is operable to provide communications outside of floor the 1700. In particular, the communication port can be connected to a server rack such as server rack 1800, described below, to provide the information from memory 1730 to the server rack. In addition, the server rack can direct TMC 1710 to update or modify the contents of the information. An example of the communication port includes a wired communication port, such as an RS-232 port, an Ethernet port, a USB port, a Firewire port, a CAN port, an I2C port, a SPI port, or another wired communication port, a wireless communication port, such as an NFC port, a WiFi port, a Bluetooth port, or another wireless communication port, or a combination thereof.

Sensors 1742 and 1744 operate to provide TMC 1710 with information related to the environment surrounding floor tile 1700. For example, sensors 1742 and 1744 can be located on the top side of floor tile 1700, on the bottom side of the floor tile, or on both the top side and the bottom side, and TMC 1710 can provide the temperature and humidity information to a server rack or to a DCMC to provide accurate, localized feedback as to the performance of an AC system in the data center. In another embodiment, sensors 1742 and 1744 can be remote from floor tile 1700, and the information from the sensors can be received via communication module 1720.

Vent 1760 permits air flow 1770 of thermally controlled air from a data center AC system to pass from the bottom side of floor tile 1700 to the top side of the floor tile, to permit the thermally controlled air to pass to the equipment in server racks proximate to the floor tile. A portion 1772 of air flow 1770 passes next to sensors 1742 and 1744, and the sensors obtain a measurement of the temperature and humidity, respectively of the air flow. TMC 1710 operates to determine if the environment surrounding floor tile 1700 is such to necessitate the supply of more or less of air flow 1770 to the equipment in the server racks proximate to the floor tile, and to direct actuator 1762 to position baffle 1764 to restrict more or less of the air flow, as dictated by the environment surrounding the floor tile. In a particular embodiment, floor tile 1700 includes one or more additional sensors, such as pressure sensors, mass air flow sensors, and air flow velocity sensors, and TMC 1710 operates to regulate air flow 1770 based upon the one or more additional sensors. For example, air flow 1770 can be limited to a certain air flow volume, and if sensors 1742 and 1744 indicate that more air flow is needed than is permitted by the air flow volume limit, other steps to reduce the cooling demand of the server rack, such as migrating workloads, or throttling equipment in the server rack, can be performed.

Figure 18:
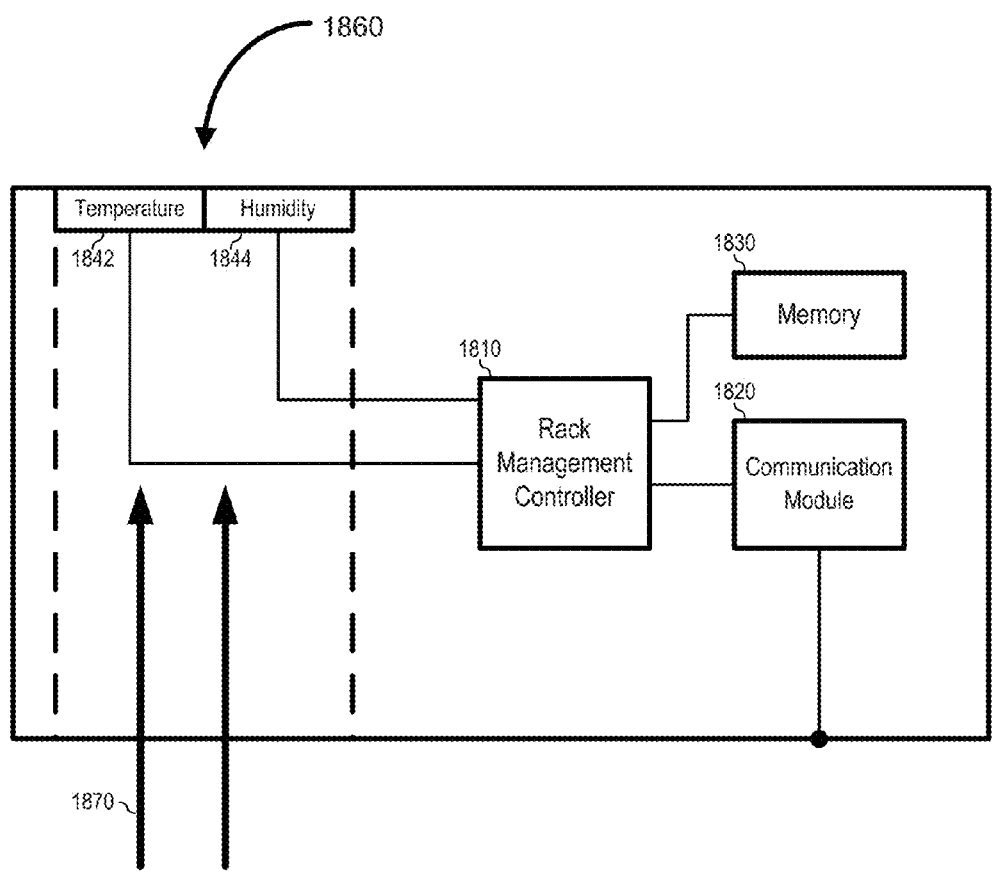
FIG. 18 is a block diagram of a server rack including a rack management controller according to an embodiment of the present disclosure.

FIG. 18 illustrates an embodiment of a server rack 1800, similar to server rack 900, including a RMC 1810, a communication module 1820, a memory 1830, a temperature sensor 1842, a humidity sensor 1844, and a vent 1860. RMC 1810 represents a service processor that is connected to communication module 1820, memory 1830, and sensors 1842 and 1844, and operates to provide intelligence to server rack 1800 to gather, process, and store information related to the location and operation of the server rack, and to permit the communication of the information to a DCMC. The information includes climate information such as the temperature and humidity above or below the server rack 1800, climate settings for active cooling or heating, or other information, as needed or desired. In a particular embodiment, RMC 1810 is connected to a management network that includes other service processors of the equipment in server rack 1800 and a management system associated with the data center. In a particular embodiment, RMC 1810 operates in accordance with an IPMI functional implementation. Memory 1830 represents a data storage device such as a non-volatile random access memory (NVRAM) or another data storage device.

Communication module 1820 includes a communication port that is operable to provide communications outside of server rack 1800. In particular, the communication port can be connected to an active floor tile such as active floor tile 1700 to provide the information from memory 1830 to the active floor tile. In addition, the active floor tile can direct RMC 1810 to update or modify the contents of the information. An example of the communication port includes a wired communication port, such as an RS-232 port, an Ethernet port, a USB port, a Firewire port, a CAN port, an I2C port, a SPI port, or another wired communication port, a wireless communication port, such as an NFC port, WiFi port, a Bluetooth port, or another wireless communication port, or a combination thereof.

Sensors 1842 and 1844 operate to provide RMC 1810 with information related to the environment surrounding server rack 1800. For example, sensors 1842 and 1844 can be located on the top side of server rack 1800, on the bottom side of the server rack, or on both the top side and the bottom side, and RMC 1810 can provide the temperature and humidity information to a floor tile or to a DCMC to provide accurate, localized feedback as to the performance of an AC system in the data center. In another embodiment, sensors 1842 and 1844 can be remote from server rack 1800, and the information from the sensors can be received via communication module 1820.

Server rack 1800 is illustrated as including a vent 1860 for permitting air flow 1870 of thermally controlled air to pass through the equipment the server rack. The skilled artisan will recognize that vent 1860 represents one or more actual air flows through the equipment in server rack 1800, ant that the individual air flows in the equipment may be assisted by ventilation fans in the equipment to pass the thermally controlled air to cool the components of the equipment. Air flow 1870 passes next to sensors 1842 and 1844, and the sensors obtain a measurement of the temperature and humidity, respectively of the air flow. RMC 1810 operates to determine if the environment surrounding server rack 1800 is such to necessitate the supply of more or less of air flow 1870 to the equipment in the server rack, and to communicate the environmental information to the floor tile which can direct an actuator to position a baffle to restrict more or less of the air flow, as dictated by the environment surrounding the server rack, as described above. Alternatively, RMC 1810 operates communicate the environmental information to a temperature control module, such as temperature control module 1670 to provide preemptive/proactive cooling of the equipment in server rack 1800. In a particular embodiment, temperature sensors 1842 include a temperature sensor located at the bottom front of server rack 1800 to measure the temperature of the temperature controlled air entering the environment of the server rack, and another temperature sensor located at the top rear or the server rack to measure the temperature of the air leaving the environment of the server rack. In another embodiment, humidity sensors 1844 include a humidity sensor located at the bottom front of server rack 1800 to measure the humidity of the temperature controlled air entering the environment of the server rack, and another humidity sensor located at the top rear or the server rack to measure the humidity of the air leaving the environment of the server rack.

Returning to FIG. 16, in a particular embodiment, server racks 112-120 are similar to server rack 1800, and floor tiles 132-140 are similar to floor tile 1700. Here, one or more of RMC 1612, TMC 1632, and temperature control module 1670 operate to control whether or not air is permitted to flow through vent 1652. In particular the environment surrounding floor tile 132, such as below the floor tile and above the floor tile, and the environment surrounding server rack 112, such as at the bottom front of the server rack and from the top rear of the server rack, is provided to the selected one or more of RMC 1612, TMC 1632, and temperature control module 1670. Here the selected device determines if the equipment in server rack 112 is in need of more or less air flow 1690, and operates an actuator similar to actuator 1762 to position a baffle similar to baffle 1764 to restrict more or less of the air flow, as dictated by the environment surrounding the server rack and floor tile 132. Similarly, server racks 114-120, floor tiles 134-140, and temperature control module 1670 operate to control whether or not air is permitted to flow through respective vents 1654-1660.

In another embodiment, one or more of RMC 1612, TMC 1632, and temperature control module 1670 operates to provide preemptive/proactive cooling of the equipment in server rack 112 on a per rack basis or on a data center wide basis. Here, in a first case, RMC 1612 operates to detect a change in the power usage of server rack 112. For example, server rack 112 can be similar to server rack 1500, and is operable to detect changes in the power consumption of the equipment in the server rack. In this case, one or more of RMC 1612, TMC 1632, and temperature control module 1670 operate to control whether or not air is permitted to flow through vent 1652 to preemptively anticipate the air flow needs of server rack 112, based upon the detected change in power consumption and to proactively provide the needed air flow for the anticipated need. For example, where the power consumption of server rack 112 is detected to have increased, the selected device can direct the actuator to position the baffle to permit more air flow, and where the power consumption of the server rack is detected to have decreased, the selected device can direct the actuator to position the baffle to permit less air flow. Similarly, server racks 114-120, floor tiles 134-140, and temperature control module 1670 operate to control whether or not air is permitted to flow through respective vents 1654-4660 based upon changes in the power consumption of the equipment in the server racks.

In a second case, RMC 1612 operates to recognize a routine change in the power usage of server rack 112. For example, server rack 112 can be similar to server rack 1500, and is not only operable to detect changes in the power consumption of the equipment in the server rack, but also is operable to provide a power consumption analysis over time to determine that server rack 112 has recognizable time periods of increased power consumption and recognizable time periods of decreased power consumption. In this case, one or more of RMC 1612, TMC 1632, and temperature control module 1670 operate to control whether or not air is permitted to flow through vent 1652 to preemptively anticipate the air flow needs of server rack 112, based upon the power consumption analysis and to proactively provide the needed air flow for the anticipated need. For example, where the power consumption of server rack 112 is analyzed to be routinely higher between 8 am and 12 pm on Monday through Friday, the selected device can direct the actuator to position the baffle to permit more air flow to the server rack, beginning at 7:55 am on Monday through Friday, and where the power consumption of the server rack is analyzed to be routinely tower between 2 am and 5 am each day of the week, the selected device can direct the actuator to position the baffle to permit less air flow, beginning at 1:55 am on each day of the week. Similarly, server racks 114-120, floor tiles 134-140, and temperature control module 1670 operate to control whether or not air is permitted to flow through respective vents 1654-1660 based upon a power consumption analysis over time for the equipment in the server racks.

In a second case, temperature control module 1670 operates to recognize a routine change in the power usage of data center 100, Here, server racks 112-120 each provide a power consumption analysis over time to DCMC 150, and temperature control module 1670 aggregates the information to determine that data center 100 has recognizable time periods of increased power consumption and recognizable time periods of decreased power consumption. In this case, temperature control module 1670 operates to control a temperature setting for the AC system to preemptively anticipate the cooling needs of data center 100 based upon the power consumption analysis. For example, where the power consumption of data center 100 is analyzed to be routinely higher between 8 am and 12 pm on Monday through Friday, temperature control module 1670 can increase a temperature setting for the AC system beginning at 7:50 am on Monday through Friday, and where the thermal load of the data center is analyzed to be routinely lower between 2 am and 5 am each day of the week, the temperature control module can decrease the temperature setting for the AC system beginning at 1:50 am on each day of the week.

Figure 19:
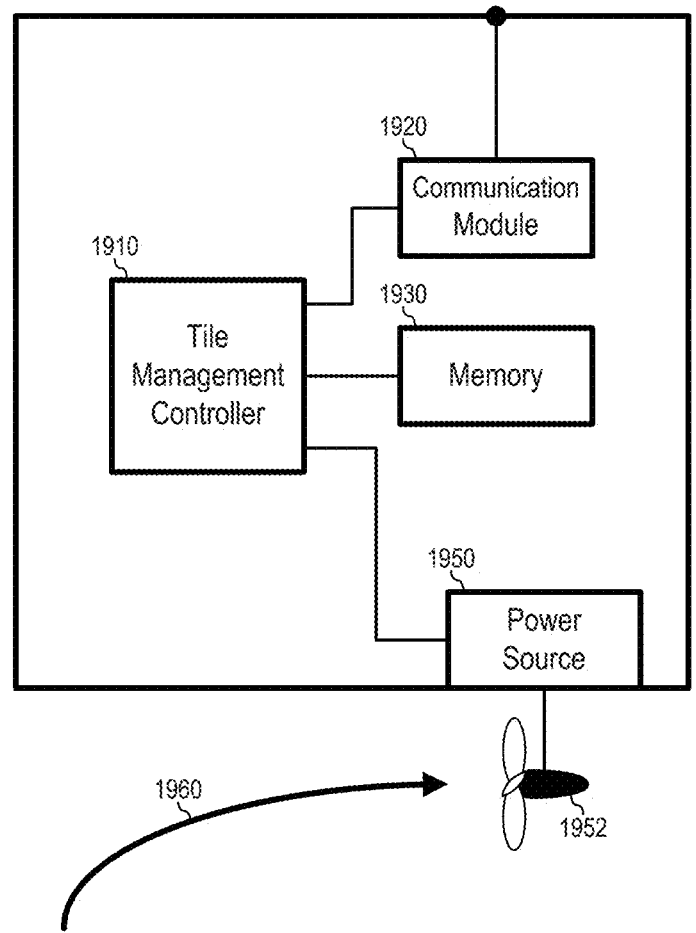
FIG. 19 is a block diagram of an active floor tile including a power generator according to an embodiment of the present disclosure.

FIG. 19 illustrates an embodiment of an active floor tile 1900, similar to active floor tile 400, including a TMC 1910, a communication module 1920, a memory 1930, and a power source 1950. Power source 1950 includes a power generator 1952. TMC 1910 represents a service processor that is connected to communication module 1920, memory 1930, and power source 1950, and operates to provide intelligence to floor tile 1900 to gather, process, and store information related to the location and operation of the floor tile, and to permit the communication of the information. In a particular embodiment, TMC 1910 is connected to a management network that includes other service processors of equipment and a server rack, and a management system associated with the data center. In a particular embodiment, TMC 1910 operates in accordance with an IPMI functional implementation. Memory 1930 represents a data storage device such as a non-volatile random access memory (NVRAM) or another data storage device.

Communication module 1920 includes a communication port that is operable to provide communications outside of floor tile 1900. In particular, the communication port can be connected to a server rack, to provide the information from memory 1930 to the server rack. In addition, the server rack can direct TMC 1910 to update or modify the contents of the information. An example of the communication port includes a wired communication port, such as an RS-232 port, an Ethernet port, a USB port, a Firewire port, a CAN port, an I2C port, a SPI port, or another wired communication port, a wireless communication port, such as an NFC port, a WiFi port, a Bluetooth port, or another wireless communication port, or a combination thereof.

Power generator 1952 is situated in air flow 1960 of conditioned air from the AC system, and to generate power for floor tile 1900 from the air flow. In particular, power generator 1952 represents a wind powered generator or alternator, and power source 1950 operates to receive a DC or AC voltage from the power generator and utilize the received voltage to power the components of floor tile 1900. In a particular embodiment, power source 1950 includes a battery and utilized the received voltage from power generator 1952 to keep the battery charged. In this way, power generator 1952 can be sized to provide an amount of power to floor tile 1900 that is matched to the average power consumption of the floor tile, and does not need to be sized to provide an amount of power that is matched to the peak power consumption of the floor tile.

Figure 20:
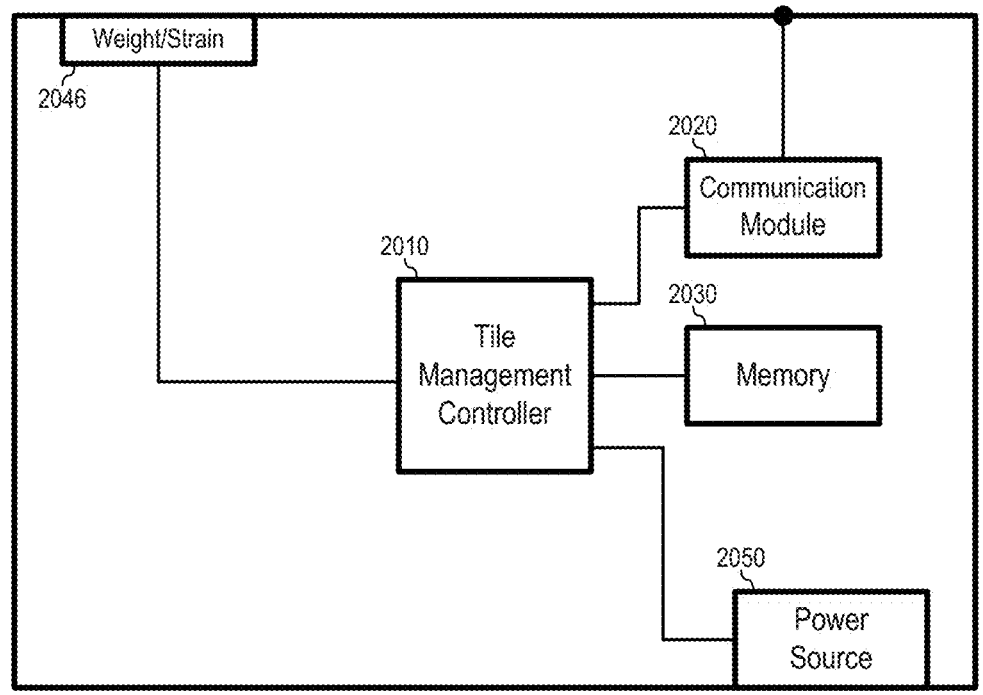
FIG. 20 is a block diagram of an active floor tile including a weight sensor according to an embodiment of the present disclosure.

FIG. 20 illustrates an embodiment of an active floor tile 2000, similar to active floor tile 400, including TMC 2010, a communication module 2020, a memory 2030, a weight sensor 2046, and a power source 2050. TMC 2010 represents a service processor that is connected to communication module 2020, memory 2030, weight sensor 2046, and power source 2050, and operates to provide intelligence to floor tile 2000 to gather, process, and store information related to the location and operation of the floor tile, and to permit the communication of the information. The information includes weight information such as a detected weight of a server rack and equipment that is located on floor tile 2000, a weight limit for the server rack and equipment that is located on the floor tile, or other information, as needed or desired. In a particular embodiment, TMC 2010 is connected to a management network that includes other service processors of the equipment and the server rack and a management system associated with the data center. In a particular embodiment, TMC 2010 operates in accordance with an IPMI functional implementation. Memory 2030 represents a data storage device such as a non-volatile random access memory (NVRAM) or another data storage device.

Communication module 2020 includes a communication port that is operable to provide communications outside of floor tile 2000. In particular, the communication port can be connected to a server rack such as server rack 1800, described below, to provide the information from memory 2030 to the server rack. In addition, the server rack can direct TMC 2010 to update or modify the contents of the information. An example of the communication port includes a wired communication port, such as an RS-232 port, an Ethernet port, a USB port, a Firewire port, a CAN port, an I2C port, a SPI port, or another wired communication port, a wireless communication port, such as an NFC port, a WiFi port, a Bluetooth port, or another wireless communication port, or a combination thereof.

Weight sensor 2046 operates to provide TMC 2010 with information related to the weight of equipment that is located on floor tile 2000. For example, sensor 2046 can represent a strain gage or a mechanical scale device embedded in the top side of floor tile 2000, and TMC 2010 can provide the weight information to a server rack or to a DCMC. In a particular embodiment, TMC 2010 receives the weight information from weight sensor 2046, compares it with a weight limit for floor tile 2000 as stored in memory 2030, and provides an alert to a RMC or a DCMC when the detected weight exceeds the weight limit. In another embodiment, TMC 2010 receives the weight information from weight sensor 2046, where the weight information shows that the weight of the equipment on floor tile 2000 is either increasing, indicating that equipment has been added to the server rack, or decreasing, indicating that the equipment has been removed from the server rack. Here, TMC 2010 provides an alert to the RMC or the DCMC that equipment has been added to or removed from the server rack. In another embodiment, where one server rack is located atop two or more floor tiles similar to floor tile 2000, the floor tiles add the weight information received from their respective weight sensors, and the weight limit stored in the respective memories represents a total weight limit for the two or more floor tiles.

Figure 21:
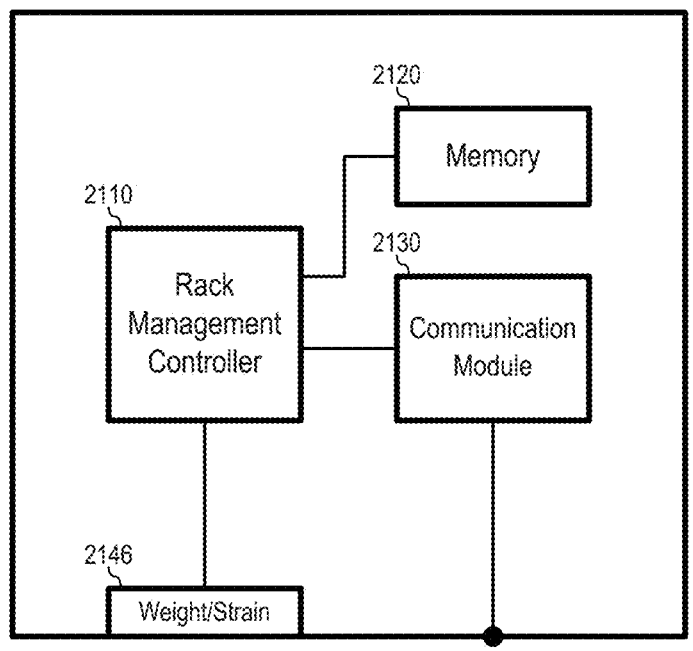
FIG. 21 is a block diagram of a server rack including a weight sensor according to an embodiment of the present disclosure.

FIG. 21 illusrates an embodiment of a server rack 2100, similar to server rack 900, including a RMC 2110, a communication. module 2120, a memory 2130, and a weight sensor 2146. RMC 2110 represents a service processor that is connected to communication module 2120, memory 2130, and weight sensor 2146, and operates to provide intelligence to server rack 2100 to gather, process, and store information related to the location and operation of the server rack, and to permit the communication of the information. The information includes weight information such as a detected weight of equipment that is installed in server rack 2100, a weight limit for the equipment that is installed in the server rack, or other information, as needed or desired. In a particular embodiment, RMC 2110 is connected to a management network that includes other service processors of the equipment in server rack 2100 and a management system associated with the data center. In a particular embodiment, RMC 2110 operates in accordance with an IPMI functional implementation. Memory 2130 represents a data storage device such as a non-volatile random access memory (NVRAM) or another data storage device.

Communication module 2120 includes a communication port that is operable to provide communications outside of server rack 2100. In particular, the communication port can be connected to an active floor tile such as active floor tile 1700 to provide the information from memory 2130 to the active floor tile. In addition, the active floor tile can direct RMC 2110 to update or modify the contents of the information. An example of the communication port includes a wired communication port, such as an RS-232 port, an Ethernet port, a USB port, a Firewire port, a CAN port, an I2C port, a SPI port, or another wired communication port, a wireless communication port, such as an NFC port, a WiFi port, a Bluetooth port, or another wireless communication port, or a combination thereof.

Weight sensor 2146 operates to provide RMC 2110 with information related to the weight of equipment that is installed in server rack 2100. For example, sensor 2146 can represent a strain gage or a mechanical scale device embedded in the bottom of server rack 2100, and RMC 2110 can provide the weight information to an active floor tile or to a DCMC. In a particular embodiment, RMC 2110 receives the weight information from weight sensor 2146, compares it with a weight limit for floor tile 2100 as stored in memory 2130, and provides an alert to a TMC or a DCMC when the detected weight exceeds the weight limit. In another embodiment, RMC 2110 receives the weight information from weight sensor 2146, where the weight information shows that the weight of the equipment in server rack 2100 is either increasing, indicating that equipment has been added to the server rack, or decreasing, indicating that the equipment has been removed from the server rack. Here, RMC 2110 provides an alert to the TMC or the DCMC that equipment has been added to or removed from the server rack.

Figure 22:
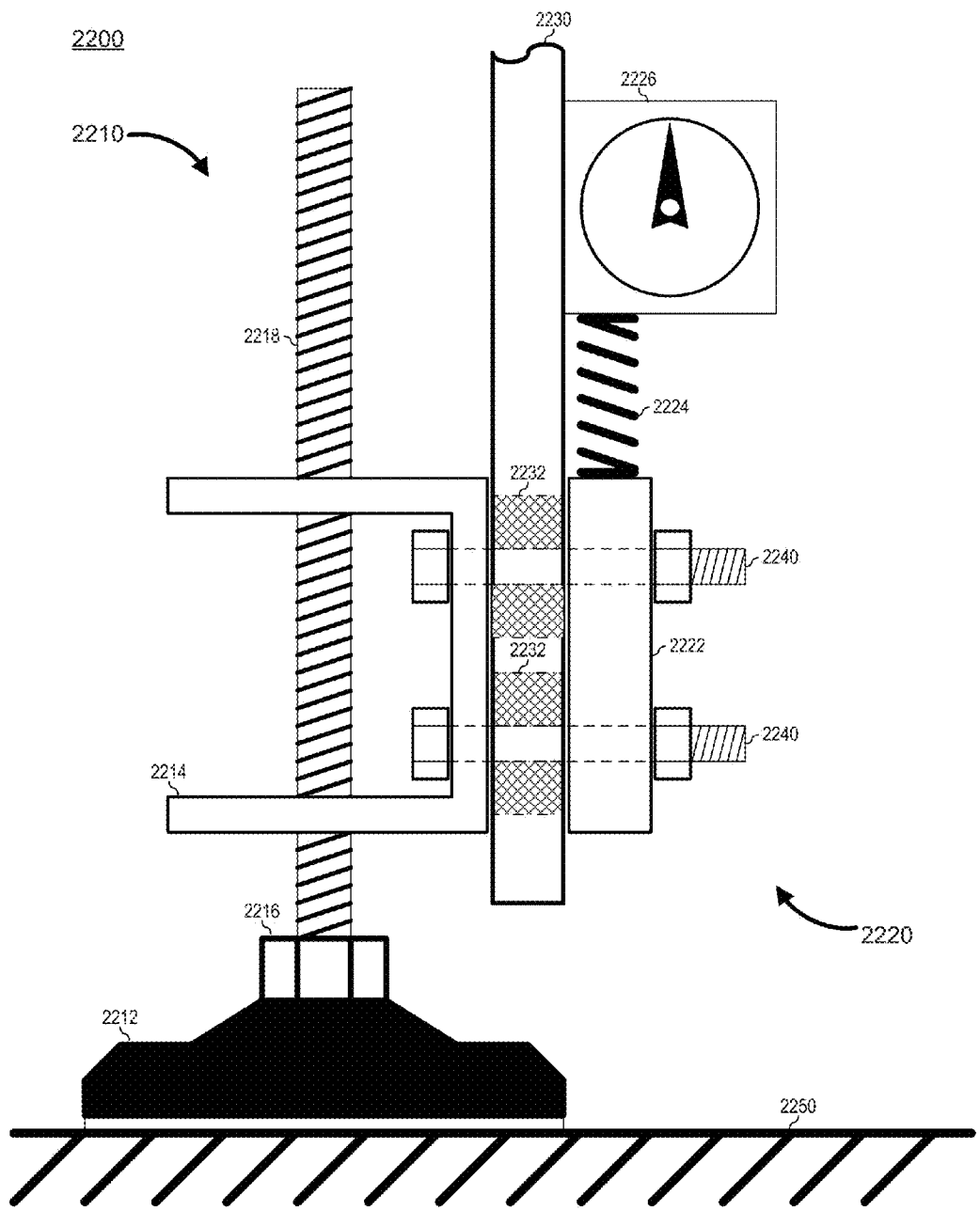
FIG. 22 is an illustration of a server rack foot assembly including a weight sensor according to an embodiment of the present disclosure.

FIG. 22 illustrates an embodiment of a server rack 2200 including a foot assembly 2210, a weight assembly 2220, a server rack structural element 2230, and fasteners 2240. Foot assembly 2210 includes a foot 2212, a retaining bracket 2214, an adjusting nut 2216, and a threaded shaft 2218. Weight assembly 2220 includes a sliding bracket 2222, a scale element 2224, and a weight sensor 2226. Structural element 2230 includes slots 2232. Foot assembly 2210 represents one of multiple similar foot assemblies associated with server rack 2200. Foot assembly 2210 is mechanically affixed to server rack structural element 2230 by fasteners 2240 such that when retaining bracket 2214 is elevated, server rack 2200 is lifted away from a floor 2250, and when the retaining bracket is lowered, the server rack is dropped closer to the floor. Foot assembly 2210 is adjustable to engage foot 2212 with floor 2250 to lift server rack 2200 away from the floor in order to provide a stable base for the operation of the server rack, and to disengage the foot from the floor and to drop the server rack closer to the floor, permitting casters of the server rack (not illustrated) to be engaged with the floor such that the server rack can be moved from one location to another. To engage foot 2212 with floor 2250, a rotation is applied to adjusting nut 2216 which rotates threaded shaft 2218 in retaining bracket 2214 to move the foot downward and to lift server rack 2200 off of the casters. To disengage foot 2212 from floor 2250, an opposite rotation is applied to adjusting nut 2216 which rotates threaded shaft 2218 in retaining bracket 2214 to move the foot upward and to lower server rack 2200 onto the casters.

Foot assembly 2210 is movably affixed to server rack structural element 2230. In this regard, foot assembly 2210 is fixed to server rack structural element 2230 in a horizontal direction, but is free to move in a vertical direction to the extent that fasteners 2240 are limited by slots 2232. As such, when foot 2212 is adjusted such that the foot is off of floor 2250, foot assembly 2210, sliding bracket 2222 and fasteners 2240 are at a lower extreme of slots 2232. In this position, scale element 2224 is calibrated to register a minimum weight. For example, when positioned at the lower extreme of slots 2232, scale element 2224 can be calibrated to read a weight of server rack 2200 on foot 2212 of "zero" (e.g., pounds, kilograms, or other, as needed or desired), or the scale element can be calibrated to read a weight of the server rack as predetermined at a factory. Further, when foot 2212 is adjusted such that the foot is fully engaged with the floor (e.g., when the foot is supporting one quarter of the weight of server rack 2200 and the equipment installed therein), foot assembly 2210, sliding bracket 2222 and fasteners 2240 are at a higher extreme of slots 2232. In this position, scale element 2224 is calibrated to register a non-minimum weight. For example, when positioned at the higher extreme of slots 2232, scale element 2224 can be calibrated to read a weight of server rack 2200 and the installed equipment on foot 2212, or the scale element can be calibrated to read a weight of just the installed equipment. The skilled artisan will recognize that the above discussion was in terms of a single foot assembly 2100, but that the actual measurements will be of that portion of the weight of server rack 2100 and the installed equipment that is supported by the foot assembly, and that other portions of the weight of the server rack and the installed equipment will be measured by the other foot assemblies, giving a total weight of the server rack and the installed equipment. Moreover, the skilled artisan will recognize that the level of the higher extreme of slots 2232 to which foot assembly 2210, sliding bracket 2222 and fasteners 2240 are positioned will depend on the weight of server rack 2200 and the equipment installed therein, and that a greater or lesser weight will result in the foot assembly, the sliding bracket, and the fasteners being located at a different, higher or lower, respectively, position.

In a particular embodiment, weight sensor 2226 operates receive an indication of the weight detected by scale element 2224, and to provide a RMC associated with server rack 2200 with information related to the weight of equipment that is installed in the server rack. For example, the RMC can provide the weight information to an active floor tile or to a DCMC. In a particular embodiment, the RMC receives the weight information from weight sensor 2226, compares it with a weight limit for the floor tile, and provides an alert to a TMC or a DCMC when the detected weight exceeds the weight limit. In another embodiment, the RMC receives the weight information from weight sensor 2226, where the weight information shows that the weight of the equipment installed in server rack 2200 is either increasing, indicating that equipment has been added to the server rack, or decreasing, indicating that the equipment has been removed from the server rack. Here, the RMC provides an alert to the TMC or the DCMC that equipment has been added to or removed from server rack 2200.

In another embodiment, one or more of scale element 2224 and weight sensor 2226 operate to provide an indication as to whether or not foot 2212 is engaged with floor 2250. In a first case, scale element 2224 is configured to provide a visible indication of the position of foot 2212, such as a scale read out that shows a red indication when the foot is engaged and a green indication when the foot is not engaged based upon the amount of weight reported by the scale element. In a second case, weight sensor 2226 is configured to light a red indicator, such as a red LED indicator, when foot 2212 is engaged and a green indicator, such as a green LED indicator, when the foot is not engaged, based upon the weight indication received from scale element 2224. In an alternative, weight sensor 2226 can include a micro-switch that is engaged by foot 2212 when the foot is disengaged from floor 2250, such that the action of the micro-switch provides for the red and green indications. In a particular embodiment, a RMC can receive an indication of the position of foot 2212, and can report that indication via an indicator or to a DCMC.

Figure 23:
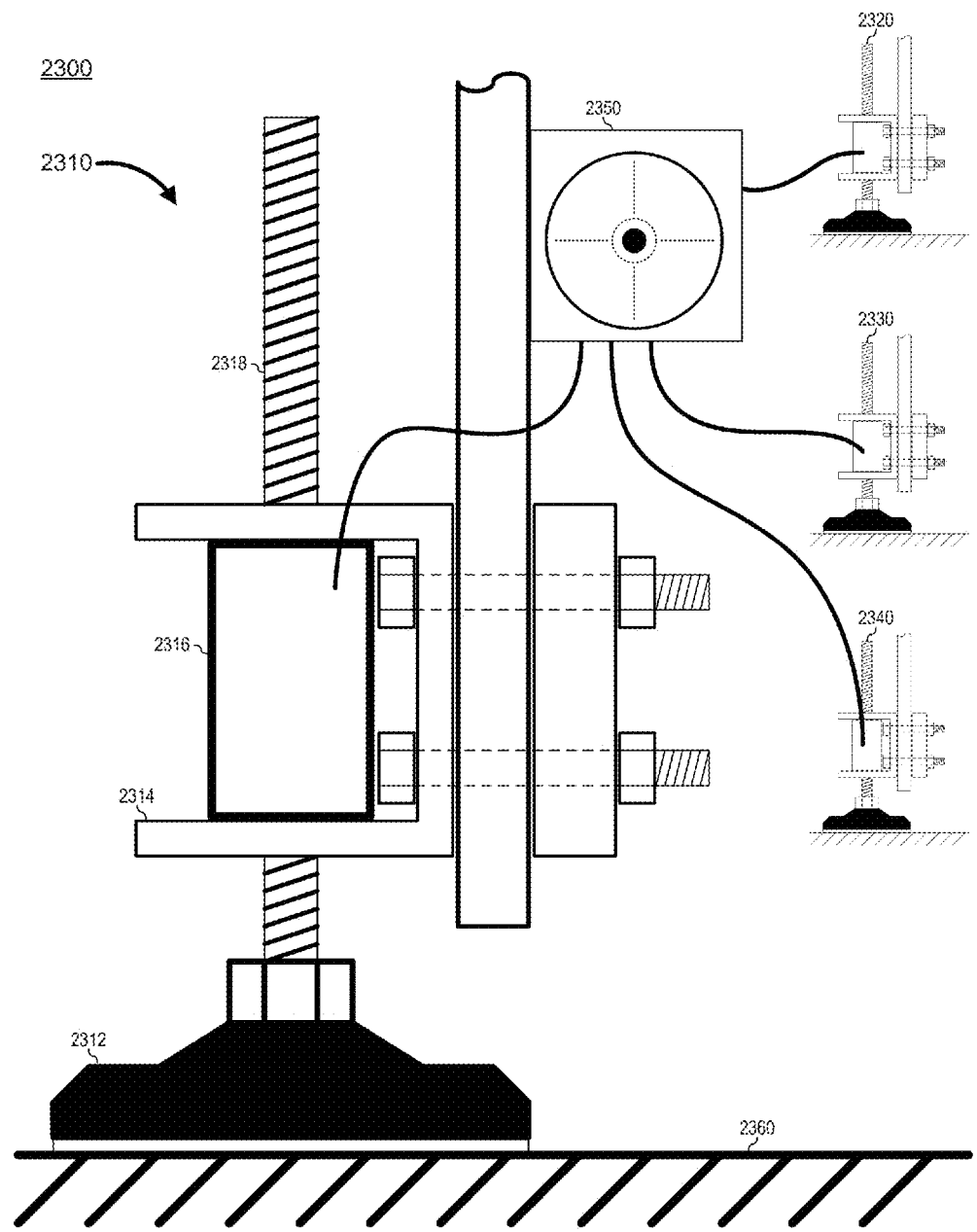
FIG. 23 is an illustration of a server rack foot assembly including a level sensor according to an embodiment of the present disclosure.

FIG. 23 illustrates an embodiment of a server rack 2300 including foot assemblies 2310, 2320, 2330, and 2340, and a leveling module 2350. Foot assembly 2310 includes a foot 2312, a retaining bracket 2314, an adjusting servo 2316, and a threaded shaft 2318. Each of foot assemblies 2320, 2330, and 2340 each include respective feet, retaining brackets, adjusting servos, and threaded shafts. Foot assemblies 2310, 2320, 2330, and 2340 are each mechanically affixed to a server rack structural element by fasteners such that when retaining bracket 2314 is elevated, server rack 2300 is lifted away from a floor 2360, and when the retaining bracket is lowered, the server rack is dropped closer to the floor. Foot assembly 2310 is adjustable to engage foot 2312 with floor 2350 to lift server rack 2300 away from the floor in order to provide a stable base for the operation of the server rack, and to disengage the foot from the floor and to drop the server rack closer to the floor, permitting casters of the server rack (not illustrated) to be engaged with the floor such that the server rack can be moved from one location to another. To engage foot 2312 with floor 2350, a rotation is applied to adjusting servo 2316 which rotates threaded shaft 2318 in retaining bracket 2314 to move the foot downward and to lift server rack 2300 off of the casters. To disengage foot 2312 from floor 2350, an opposite rotation is applied to adjusting servo 2316 which rotates threaded shaft 2318 in retaining bracket 2314 to move the food upward and to lower server rack 2300 onto the casters. Foot assemblies 2320, 2330, and 2340 operate similarly to foot assembly 2310.

Leveling module 2350 is connected to adjusting servo 2316 and to the adjusting servos of foot assemblies 2320, 2330, and 2340. In a particular embodiment, leveling module 2350 operates to detect when server rack 2300 is level, that is, oriented in a vertical relationship with floor 2360. If server rack 2300 is not level, then leveling module 2350 directs one or more of adjusting servo 2316 and the adjusting servos on foot assemblies 2320, 2330, and 2340 to apply a rotation to the associated threaded shaft in order to bring the server rack into a level orientation. In an embodiment, foot assemblies 2310, 2320, 2330, and 2340 include a weight sensor similar to weight sensor 2226, and the determination that server rack 2300 is in a level orientation can be made in conjunction with the weight distribution on the foot assemblies. An example of leveling module 2350 includes a gyroscopic sensor, a distance sensor, and level indicator, a camera, or other leveling sensor, as needed or desired. In another embodiment, a RMC receives the information from leveling module 2350 and directs the activities of the servos.

Figure 24:
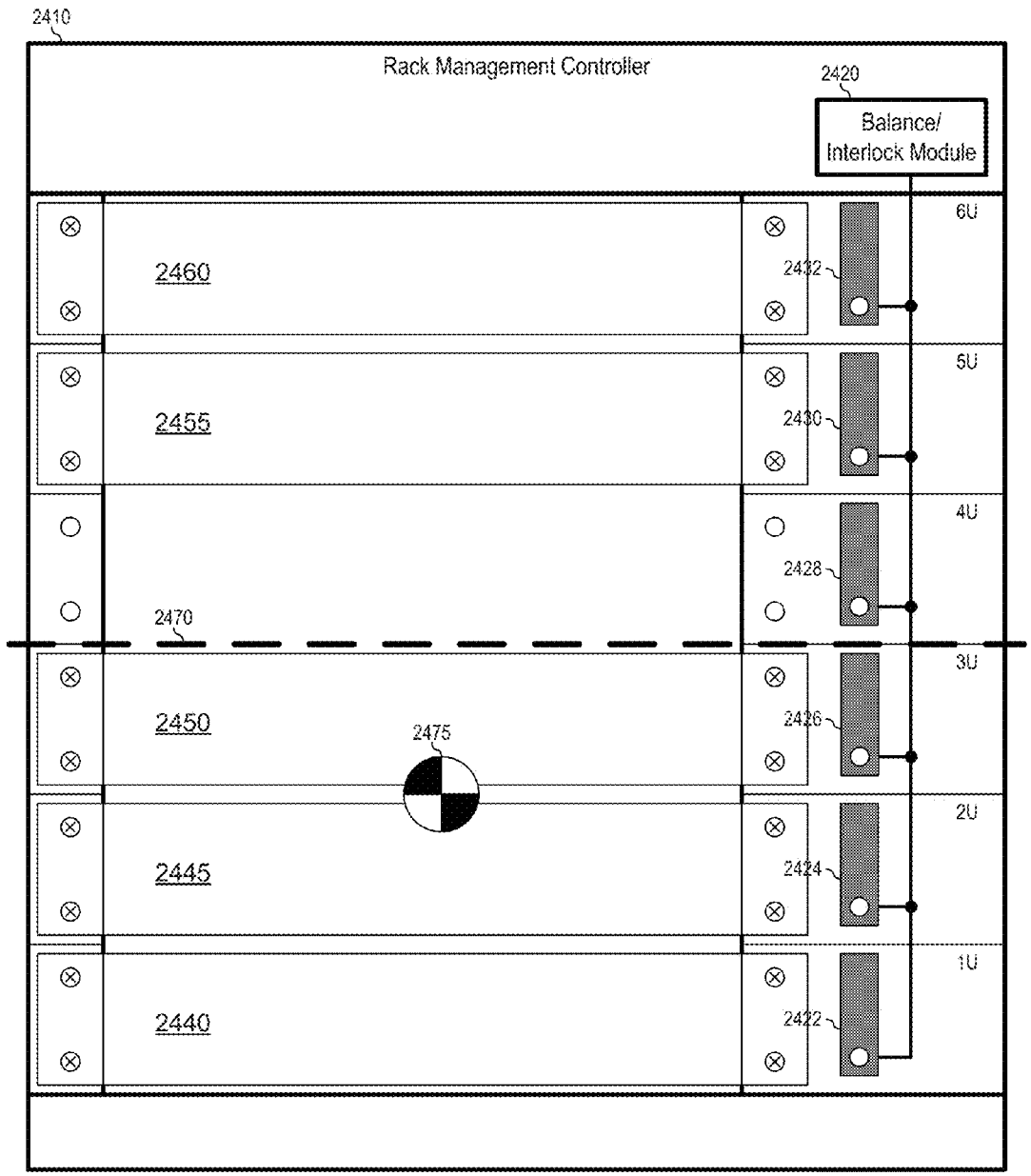
FIGS. 24 and 25 are illustrations of a server rack including a rack management controller and a balance interlock module according to an embodiment of the present disclosure.
Figure 25:
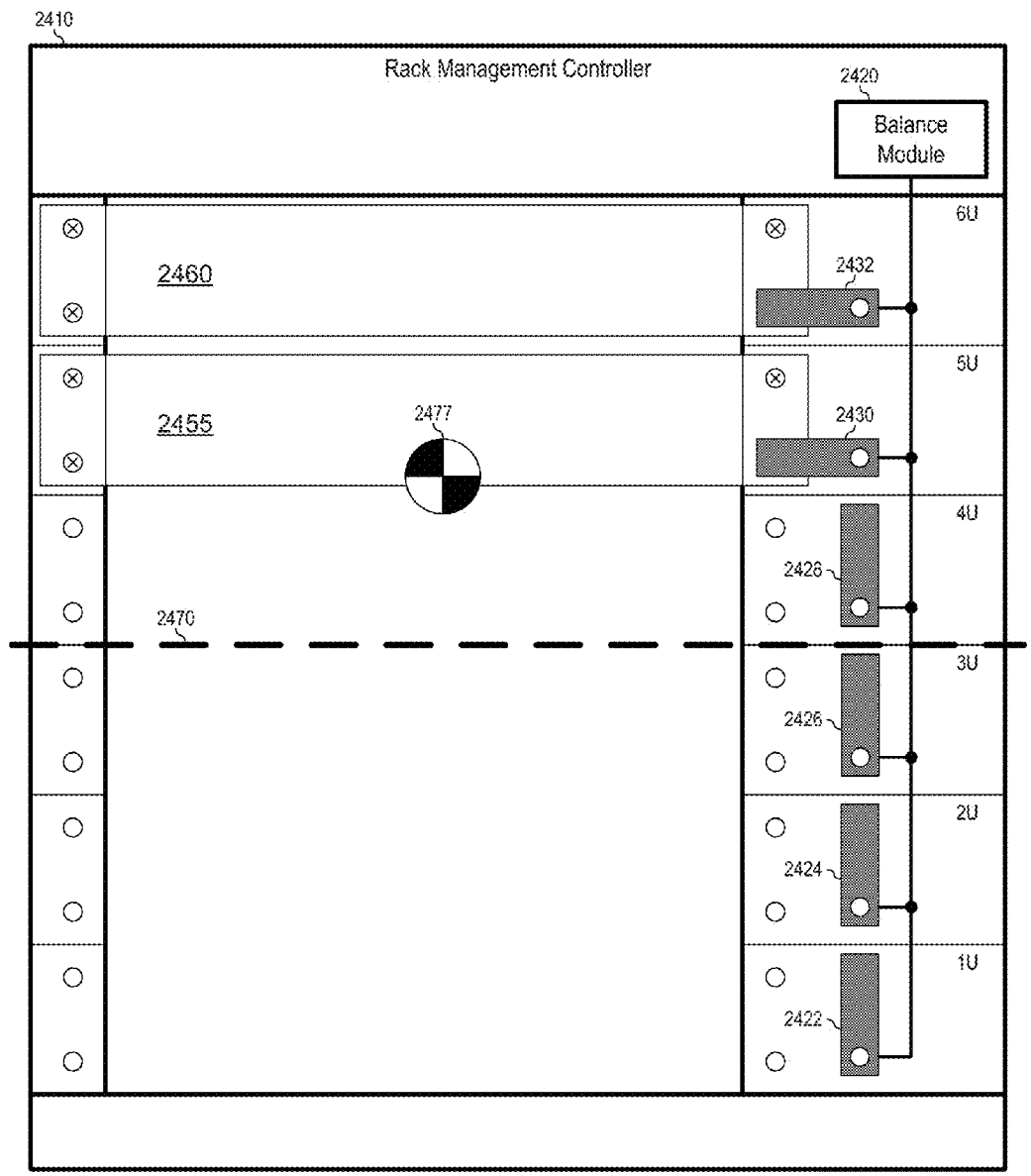

FIGS. 24 and 25 illustrate an embodiment of a server rack 2400 including a RMC 2410 with a balance interlock module 2420. Server rack 2400 is similar to server rack 900, and thus RMC 2410 is connected to a communication module, a memory, and one or more sensors (not illustrated) of server rack 2400. Balance interlock module 2420 is connected to an interlock 2422 associated with a rack unit an interlock 2424 associated with a rack unit 2U, an interlock 2426 associated with a rack unit 3U, an interlock 2428 associated with a rack unit 4U, an interlock 2430 associated with a rack unit 5U, and an interlock 2432 associated with a rack unit 6U. Balance interlock module 2420 operates to control interlocks 2422-2432 to operate either in an open position or in an interlocked position. In the open position interlocks 2422-2432 operate to permit the installation and removal of equipment from the associated rack units. In the interlocked position interlocks 2422-2432 operate to prevent the removal of equipment from the associated rack units. In a particular embodiment, balance interlock module 2420 operates to control interlocks 2422-2432 to prevent the removal of equipment from the associated rack units as a security measure. Here, once a piece of equipment is installed in server rack 2400, the associated interlocks 2422-2432 are set to the interlocked position, and the interlocks are not set to the open position without an override to open the interlocks.

In FIG. 24, the rack space of server rack. 2400 is populated with five 1-U servers 2440, 2445, 2450, 2455, and 2460. Server 2440 is installed in rack space 1U, server 2445 is installed in rack space 2U, server 2450 is installed in rack space 3U, server 2455 is installed in rack space 5U, and server 2460 is installed in rack space 6U. Balance interlock module 2420 operates to determine the weight of servers 2440, 2445, 2450, 2455, and 2460. In a particular embodiment, the weight of servers 2440, 2445, 2450, 2455, and 2460 is determined based upon information received by RMC 2410 from the servers, indicating each server's weight. In another embodiment, the weight of servers 2440, 2445, 2450, 2455, and 2460 is determined based upon an estimated or average weight for the servers. For example, balance interlock module 22420 can assume that a 1-U piece of equipment weighs 40 pounds, that a 241 piece of equipment weighs 80 pounds, and so on. Based upon the weight of servers 2440, 2445, 2450, 2455, and 2460, and the positions of the servers within server rack 2400, balance interlock module 2420 determines a center of gravity 2475 for the equipment installed in the server rack. Moreover, balance interlock module 2420 operates to determine if center of gravity 2475 is above or below a centerline 2470 of server rack 2400. When center of gravity 2475 is below centerline 2470, as illustrated here, an override permits balance interlock module 2420 to open interlocks 2422-2432. FIG. 25 illustrates a case where servers 2440, 2445, and 2450 have been removed from server rack 2400. Here, balance interlock module 2420 operates to recalculate anew center of gravity 2477 and to determine that the new center of gravity is above centerline 2470, and the balance interlock module operates to re-set interlocks 2430 and 2432 to the interlocked position to prevent the removal of servers 2455 and 2460. In this way, when server rack 2400 is top heavy, a technician is prevented from attempting to remove equipment from the server rack because of the danger of toppling the server rack when the equipment is removed. For example, when a server rack is top heavy, the removal of a large (i.e. 2-U, 3-U, or larger) piece of equipment may shift the center of gravity beyond the confines of the server rack and the server rack can fall over onto the technician. In a particular embodiment, server rack 2400 includes a handle at the back of the server rack, beyond the reach of a single technician, that includes an override switch that can be engaged to permit a technician to remove apiece of equipment from atop heavy server rack. In a particular embodiment, when RMC 2410 determines that center of gravity 2477 is above centerline 2470, the RMC operates to prevent foot assemblies of server rack 2400, similar to foot assemblies 2310, 2320, 2330, and 2340, from disengaging with the floor, thereby preventing the server rack from being moved when the server rack has a high center of gravity. Further, RMC 2410 can include an override feature to permit the foot assemblies to disengage with the floor.

Figure 26:
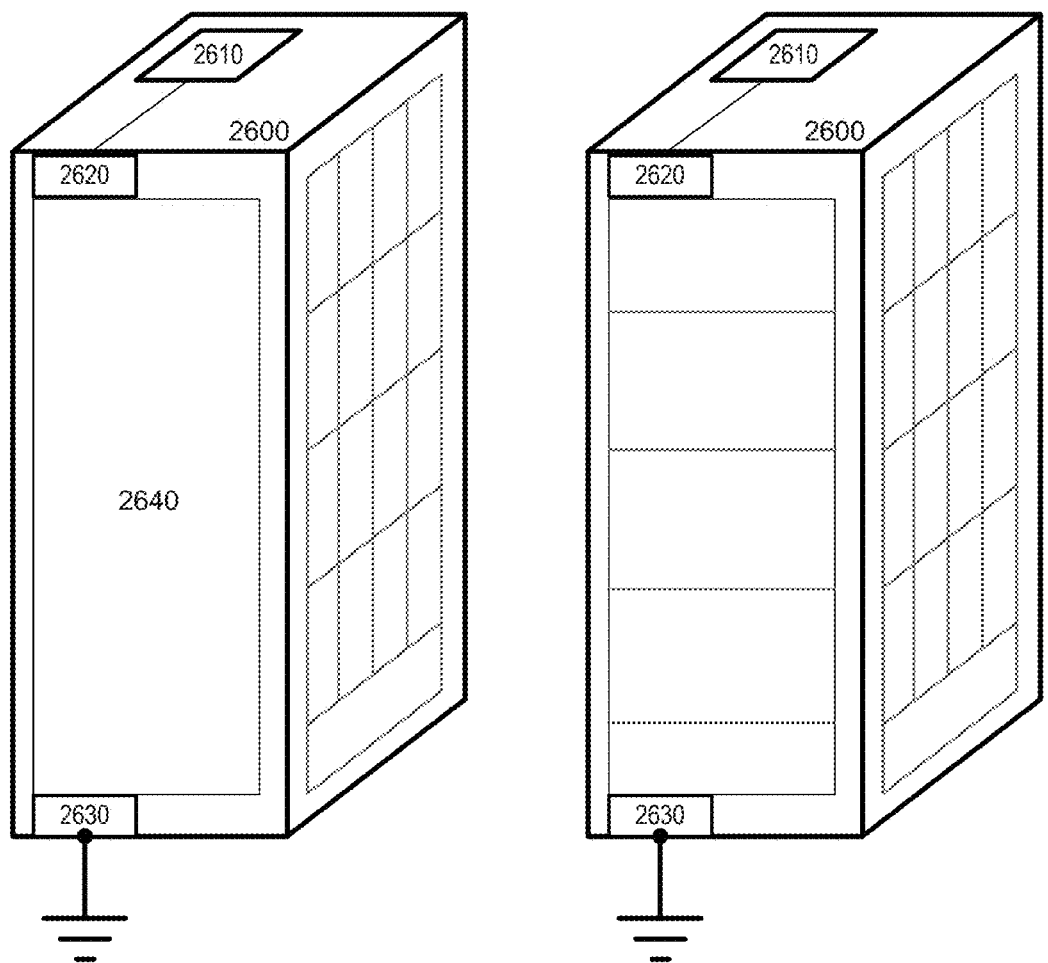
FIG. 26 is an illustration of a server rack including a rack management controller, a panel detection module, and a panel ground detection module according to an embodiment of the present disclosure.

FIG. 26 illustrates a server rack 2600 including a RMC 2610, a panel detection module 2620, and a panel ground detection module 2630. RMC 2610 is connected to panel detection module 2620, and to panel ground detection module 2630. Panel detection module 2620 operates to determine if a side panel 2640 is installed on server rack 2600 and to provide an indication to RMC 2610 as to the presence or absence of the panel. Panel ground detection module 2630 operates to provide an indication as to whether or not panel 2640 is properly grounded and to provide an indication to RMC 2610 as to whether or not the panel is properly grounded. The skilled artisan will recognize that panel detection module 2620 and panel ground detection module 2630 can be implemented as a single module operable to detect the presence of a panel and the ground status of the panel. Further, while described with respect to just one side of server rack 2600, the skilled artisan will recognize that a second panel detection module and a second panel ground detection module can be implemented on a second side of the server rack of for a door of the server rack.

Figure 27:
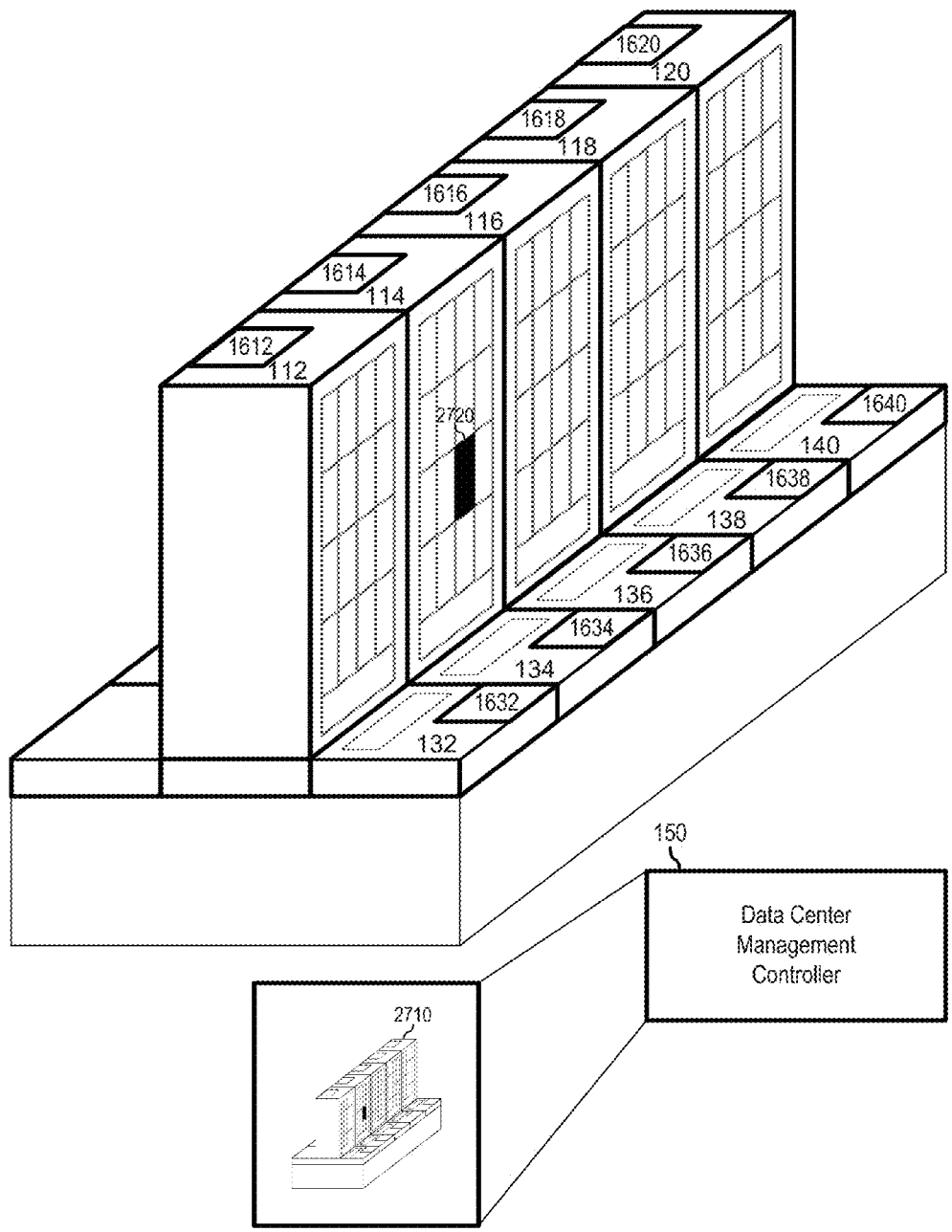
FIG. 27 illustrates data center 100 of FIG. 1 including a data center management appliance.

FIG. 27 illustrates data center 100 of FIG. 1, where DCMC 150 includes a data center management appliance 2710 that operates to integrate the management and control of the data center into a unified interface. In a particular embodiment, data center management appliance 2710 operates to aggregate and manage the information of the TMCs, RMCs, BMCs, environmental controls, and other elements of data center 100. As such, data center management appliance 2710 integrates the management and control functions of DCMC 150 into a graphical user interface (GUI) that permits a data center administrator to access the features of data center 100 as described herein. For example, data center management appliance 2710 can read, write, update, or modify information 432 of active floor tile 400 and information 932 of server rack 900, can access aggregator 1140 of server rack 1100 to obtain KVM access to the equipment installed in the server tack, to manage the EMS, and to manage the serial aggregator, can map physical locations of the equipment installed in server rack 1100, can update or modify the information in real time clock 1340 of server rack 1300, can map port of the equipment in server rack 1400, set up the vLANs for the equipment, and manage vLAN setup module 1440, can manage power mapping module 1540 and map the power connections of server rack 1500, can receive temperature and humidity information and adjust air flow in floor tile 1700, can receive temperature and humidity information from server rack 1800, can receive weight information and provide weight limits to floor tile 2000, can receive weight information and provide weight limits to server rack 2100, can receive weight information from weight sensor 2226, can receive rack leveling information from rack leveling module 2350 of server rack 2300, can receive center of gravity information from balance interlock module 2420 of server rack 2400, and can receive panel detection and grounding information from RMC 2610 of server rack 2600.

In a particular embodiment, data center management appliance 2710 represents a function of a data center management system that is accessible to an administrator, and the administrator interfaces with the data center management appliance via the data center management system. In another embodiment, data center management appliance 2710 provides a function that is portable to a mobile device, such as a smart telephone or a tablet device. In either case, an administrator can be presented with a graphical representation of the entire data center 100, and can select a portion of the data center to focus on. The administrator can further select a particular server rack or active floor tile to access the features presented by the server rack and the active floor tile. The administrator can also select a particular server or piece of equipment in the server rack and gain access to the management functions of the server or piece or equipment, such as via a BMC. The administrator can even access an operating system environment of the server or piece of equipment, such as via an aggregator similar to aggregator 1140.

In another embodiment, DCMC 150 includes a preset list of tasks to execute when a new server or server rack is installed into data center 100. Here, a BMC of a new server, or a RMC of a new server rack will provide information related to the server or server tack to DCMC 150. Based upon predetermined information, DCMC 150 operates to provide preset server names, prefixes, IP addresses, BMC names, and the like to the server or server rack, thereby automating the setup and install of equipment in data center 100. The preset list also includes other server configuration information, such as OS installation instructions, application software installation instructions, vLAN mappings, and the like, as needed or desired.

In another embodiment, data center management appliance 2710 operates to provide a repair guide for an administrator of data center 100. As such, data center management appliance 2710 identifies a piece of equipment 2710 that is in need of service, and provides a visual representation of the location of the equipment. The repair guide further provides instructions for the specific service. For example, the repair guide can include instructions for replacing a field replaceable unit (FRU) such as a disk drive, a power module, or the like. In a particular embodiment, when a service need is identified, data center management appliance 2710 automatically issues a service ticket and provides for a request dispatch for a replacement part if a failing part of the equipment is identified.

Figure 28:
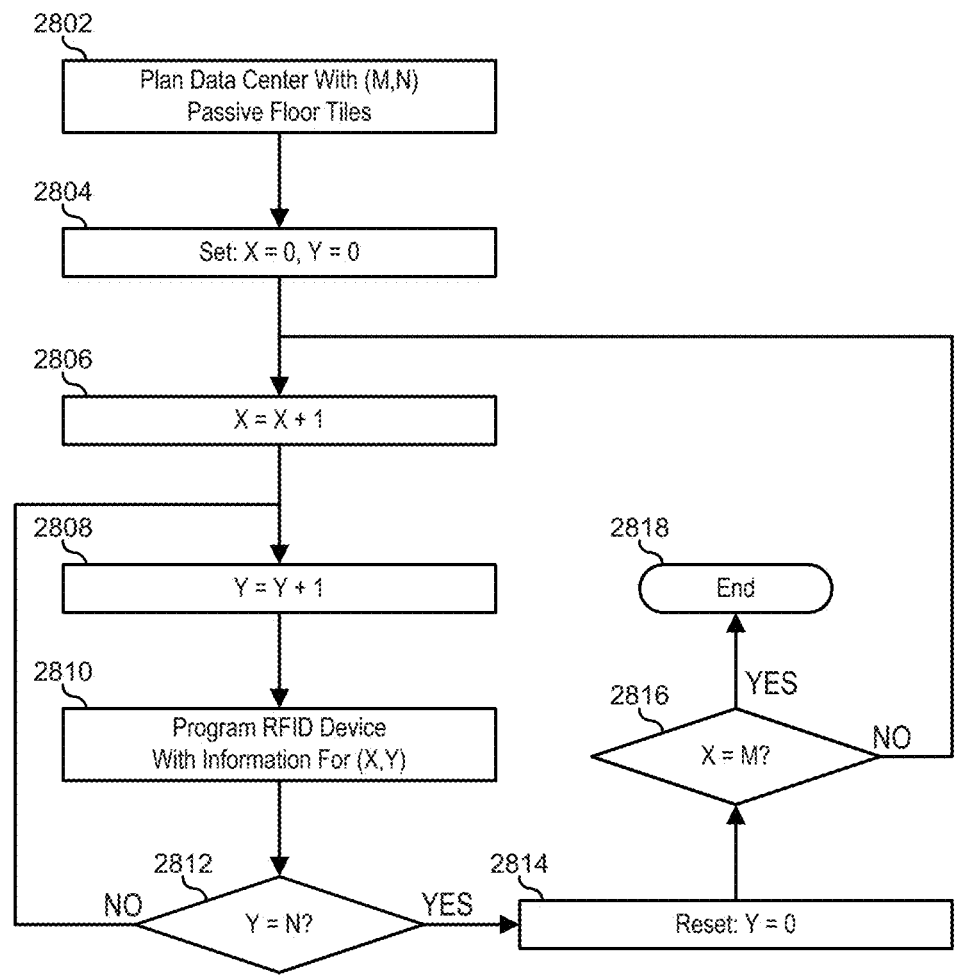
FIG. 28 is a flowchart illustrating a method for programming a passive floor tile according to an embodiment of the present disclosure.

FIG. 28 illustrates a method for programming a passive floor tile beginning at block 2802 where a plan for a data center is created including a grid of (M,N) passive floor tiles. For example, floor 200 can include passive floor tiles 202-218 in a grid of (3,3) floor tiles. An X-counter is set to 0 (zero) and a Y-counter is set to 0 (zero) in block 2804. The X-counter is incremented by 1 (one) in block 2806, and the Y-counter is incremented by 1 (one) in block 2808. A RFID device is programmed with information associated with the floor tile located at the grid location designated by the X-counter and the Y-counter in block 2810. For example, when the X- and Y-counters are both equal to 1 (one), RFID tag 203 can be programmed to store information related to the location of the associated floor tile 202, including the grid location, a weight limit for server racks and equipment located on. the floor tile, a rang of IP addresses for the equipment, a client name associated with the equipment, a system name for the equipment, or other information, as needed or desired.

A decision is made as to whether or not the Y-counter is equal to N in decision block 2812. If not, the "NO" branch of decision block 2812 is taken and the method returns to block 2808 where the Y-counter is incremented by 1 (one) and the next RFID device is programmed in block 2810. If the Y-counter is equal to N, the "YES" branch of decision block 2812 is taken and the Y-counter is reset to 0 (zero) in block 2814. A decision is made as to whether or not the X-counter is equal to M in decision block 2816. If not, the "NO" branch of decision block 2816 is taken and the method returns to block 2806 where the X-counter is incremented by 1 (one) and the next row of RFID devices is programmed as described above. If the X-counter is equal to the "YES" branch of decision block 2816 is taken, indicating that all of the RFID devices have been programmed, and the method ends in block 2818.

Figure 29:
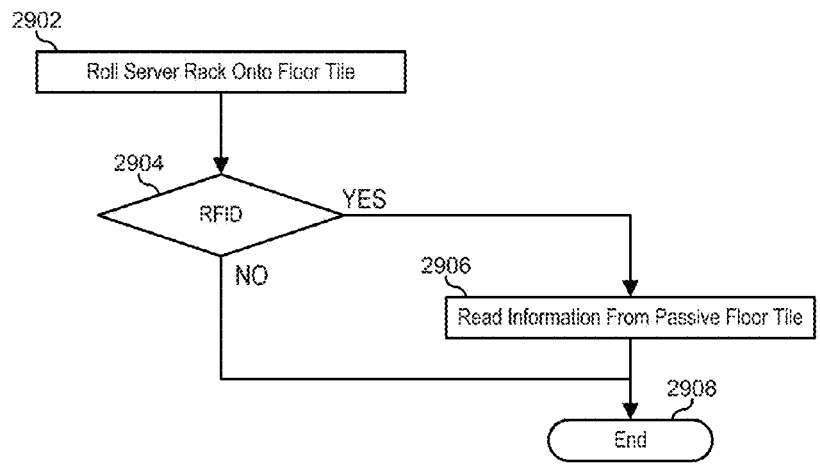
FIG. 29 is a flowchart illustrating a method for communicating information from a passive floor tile to a server rack according to an embodiment of the present disclosure.

FIG. 29 illustrates a method for communicating information from a passive floor tile to a server rack beginning at block 2902 where a server rack is rolled onto a floor tile. For example, server rack 310 can be rolled onto floor tile 202. A decision is made as to whether or not the floor tile includes an RFID device in decision block 2904. For example, RFID tag reader 312 in server rack 310 can detect the presence or absence of an RFID device in the floor tile. If the floor tile does not include an RFID device, the "NO" branch of decision block 2904 is taken and the method ends at block 2908. If the floor tile includes an RFID device, the "YES" branch of decision block 2904 is taken, the server rack reads the information from the passive floor tile in block 2906, and the method ends at block 2908.

Figure 30:
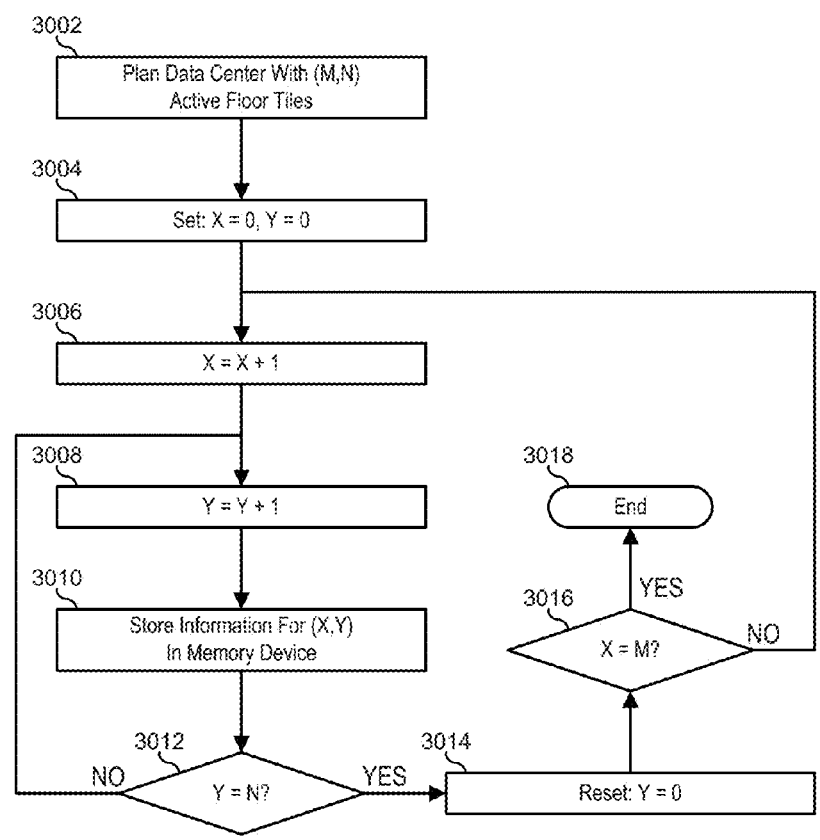
FIG. 30 is a flowchart illustrating a method for pre-programming an active floor tile according to an embodiment of the present disclosure.

FIG. 30 illustrates a method for pre-programming an active floor tile beginning at block 3002 where a plan for a data center is created including a grid of (M,N) active floor tiles. For example, floor 500 can include active floor tiles 502-518 in a grid of (3,3) floor tiles. An X-counter is set to 0 (zero) and a Y-counter is set to 0 (zero) in block 3004. The X-counter is incremented by 1 (one) in block 3006, and the Y-counter is incremented by 1 (one) in block 3008. A memory of an active floor tile is stored with information associated with the floor tile located at the grid location designated by the X-counter and the Y-counter in block 3010. For example, when the X- and Y-counters are both equal to 1 (one), active floor tile 502 can be programmed to store information related to the location of the floor tile, including the grid location, a weight limit for server racks and equipment located on the floor tile, a range of IP addresses for the equipment, a client name associated with the equipment, a system name for the equipment, or other information, as needed or desired.

A decision is made as to whether or not the Y-counter is equal to N in decision block 3012. If not, the "NO" branch of decision block 3012 is taken and the method returns to block 3008 where the Y-counter is incremented by 1 (one) and the information for the next active floor panes is stored in the memory device in block 3010. If the Y-counter is equal to N, the "YES" branch of decision block 3012 is taken and the Y-counter is reset to 0 (zero) in block 3014. A decision is made as to whether or not the X-counter is equal to M in decision block 3016. If not, the "NO" branch of decision block 3016 is taken and the method returns to block 3006 where the X-counter is incremented by 1 (one) and the next row of RFID devices is programmed as described above. If the X-counter is equal to M, the "YES" branch of decision block 3016 is taken, indicating that all of the RFID devices have been programmed, and the method ends in block 3018.

Figure 31:
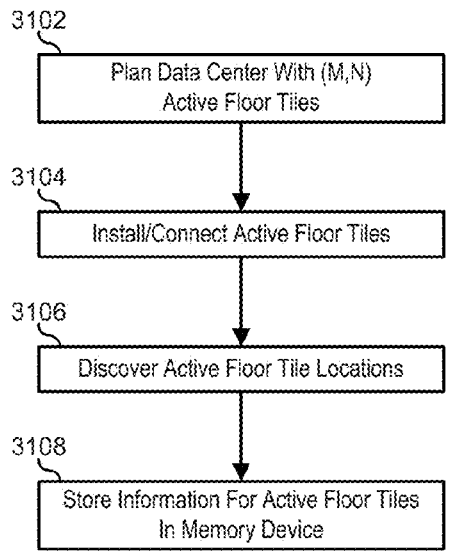
FIG. 31 is a flowchart illustrating a method for networking active floor tiles according to an embodiment of the present disclosure.

FIG. 31 illustrates a method for networking active floor tiles beginning at block 3102 where a plan for a data center is created including a grid of (M,N) active floor tiles. For example, floor 600 can include active floor tiles 602-618 in a grid of (3,3) floor tiles. The active floor tiles are installed in the data center floor, and the floor tiles are interconnected in block 3104. For example, the active floor tiles can each be connected to a DCMC, as depicted in FIGS. 5 and 6, the active floor tiles can be connected to each other with a single floor tile connected to the DCMC, as depicted in FIGS. 7 and 8, or the floor tiles can be otherwise interconnected, as needed or desired. The active floor tiles discover their positions on the grid of the floor in block 3106, and a memory of the active floor tiles is stored with information associated with each floor tile based upon their location on the grid. For example, active floor tile 502 can be programmed to store information related to the location of the floor tile, including the grid location, a weight limit for server racks and equipment located on the floor tile, a range of IP addresses for the equipment, a client name associated with the equipment, a system name for the equipment, or other information, as needed or desired.

Figure 32:
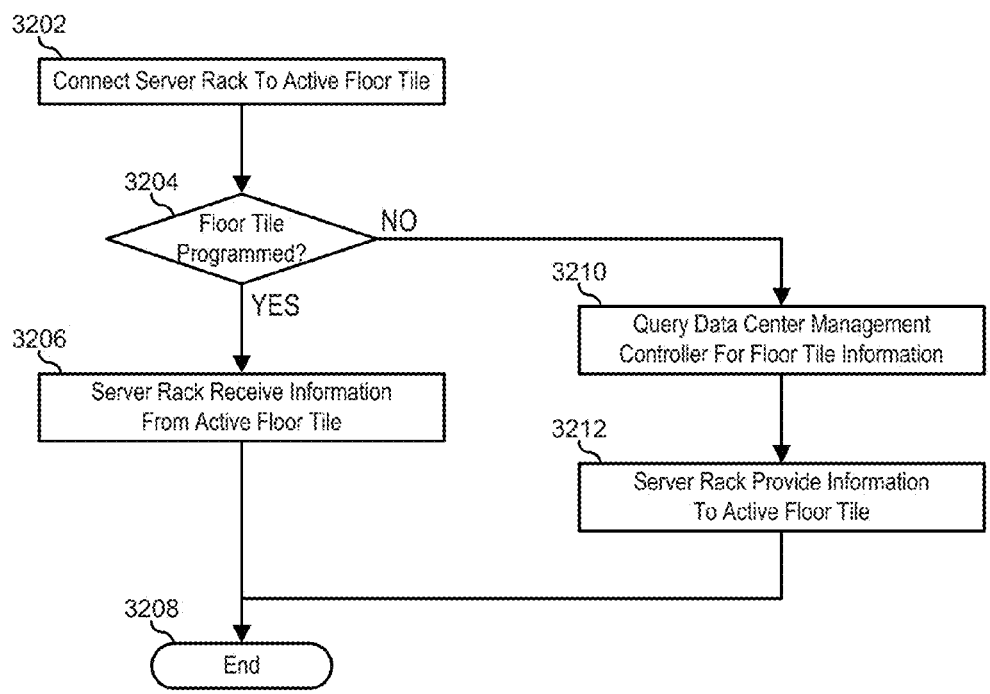
FIG. 32 is a flowchart illustrating a method for communicating information between an active floor tile and a server rack according to an embodiment of the present disclosure.

FIG. 32 illustrates a method for communicating information between an active floor tile and a server rack beginning at block 3202 where a server rack is connected to an active floor tile. For example, active floor tile 1010 can be connected to server rack 1020. A determination is made as to whether or not the active floor tile is programmed in decision block 3204. If so, the "YES" branch of decision block 3204 is taken and the server rack receives information related to the location of the server rack from the active floor tile in block 3206, and the method ends in block 3208. For example, memory 1016 of active floor tile 1010 can include tile information 1017 related to the location of the floor tile, including the grid location, a weight limit for server racks and equipment located on the floor tile, a range of IP addresses for the equipment, a client name associated with the equipment, a system name for the equipment, or other information, as needed or desired. If the active floor tile is not programmed, the "NO" branch of decision block 3204 is taken and a DCMC is queried by a RMC for information to provide to the active floor tile in block 3210. The RMC communicates the information to the active floor tile and the information is stored in the memory of the active floor tile in block 3212 and the method ends in block 3208.

Figure 33:
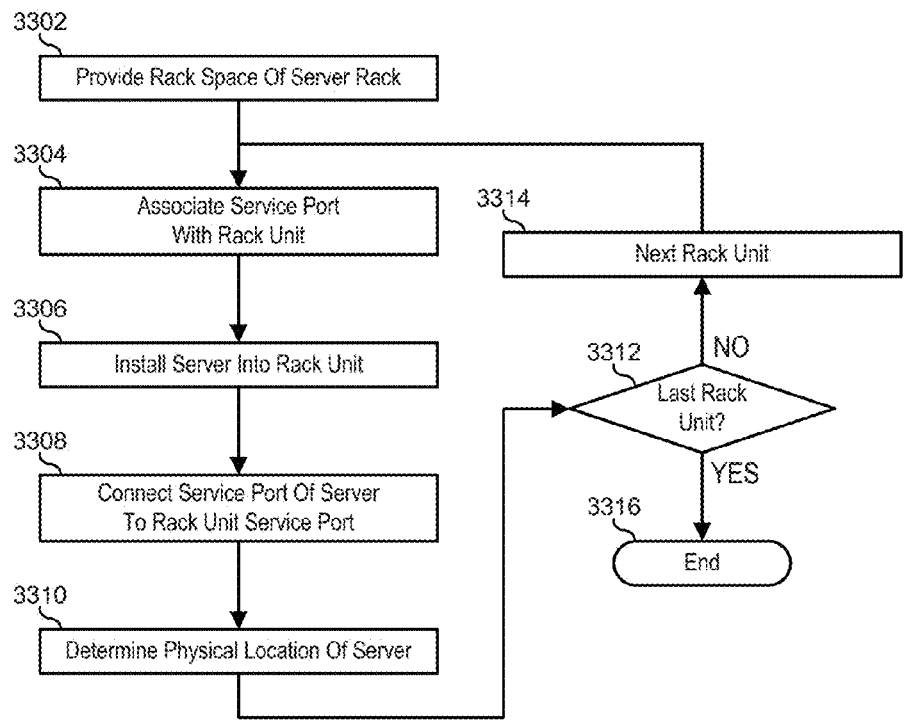
FIG. 33 is a flowchart illustrating a method for finding a physical location of equipment in a server rack according to an embodiment of the present disclosure.

FIG. 33 illustrates a method for finding a physical location of equipment in a server rack beginning at block 3302 where a server rack is provided with a rack space. For example server rack 1100 can include a rack space 1110. A service port is associated with a rack unit of the rack space in block 3304. For example, service port 1142 can be associated with rack unit 1112, such that aggregator 1140 can distinguish the service port because each service port is connected to a unique port of the aggregator. A server is installed into the rack unit in block 3306. For example, server 1190 can be installed into rack unit 1122. A service port of the server is connected to the service port of the rack unit in block 3308. For example, service port 1192 of server 1190 can be plugged into service port 1152 of rack unit 1122 via connector cable 1194. The physical location of the server is determined based upon the fact that the service port of the server is connected to the service port of the rack unit in block 3310. For example, because service port 1192 is plugged into service port 1152, the physical location of the server is determined to be in rack unit 1122. A decision is made as to whether or not the rack unit is the last rack unit of the server rack in decision block 3312. If so, the "YES" branch of decision block 3312 is taken and the method ends in block 3316. If the rack unit is not the last rack unit of the server rack, the "NO" branch of decision block 3312 is taken, the next rack unit is considered in block 3314, and the method proceeds to block 3304 where a next service port is associated with the next rack unit.

Figure 34:
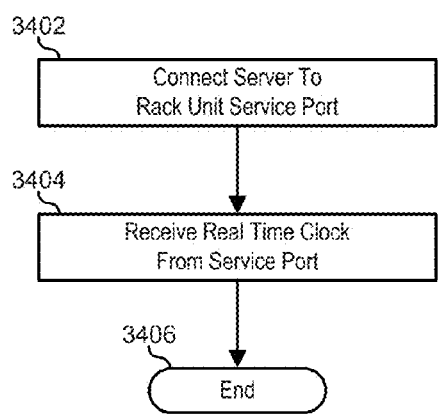
FIG. 34 is a flowchart illustrating a method for providing a real time clock to equipment in a server according to an embodiment of the present disclosure.

FIG. 34 illustrates a method for providing a real time clock to equipment in a server rack beginning at block 3402 where a server is connected to a rack unit service port. For example, service port 1362 of server 1360 can be connected to service port 1342. The server receives real time clock information from the service port of the rack unit in block 3404, and the method ends in block 3406. In a particular embodiment, the server does not include its own separate real time clock function, thereby saving on the cost of the components to provide the real time clock function, and also saving space on the motherboard of the server.

Figure 35:
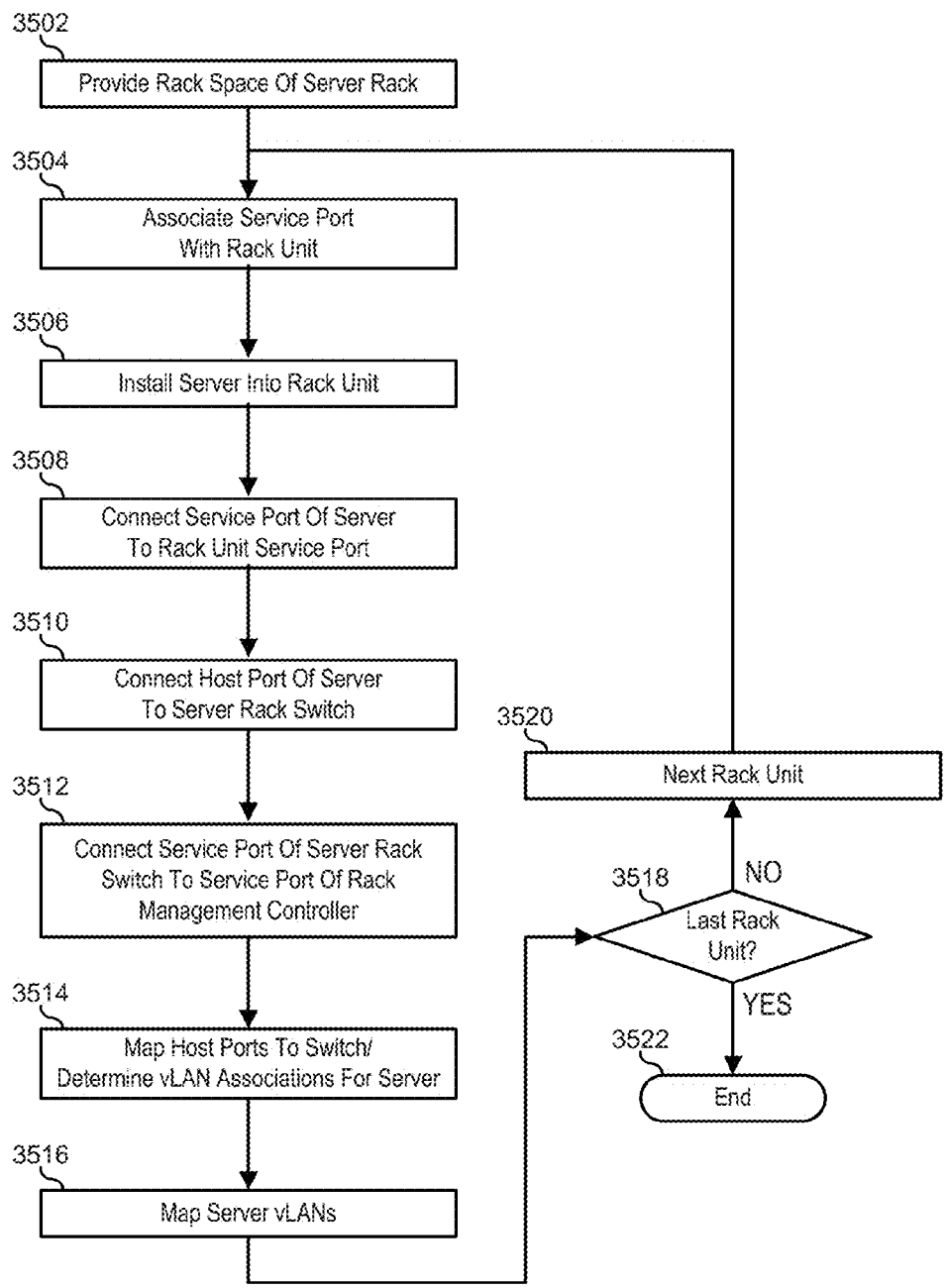
FIG. 35 is a flowchart illustrating a method for mapping network ports and vLANs in a server rack according to an embodiment of the present disclosure.

FIG. 35 illustrates a method for mapping network ports and vLANs in a server rack beginning at block 3502 where a server rack is provided with a rack space. For example server rack 1400 can include a rack space. A service port is associated with a rack unit of the rack space in block 3504. For example, service port 1442 can be associated with a rack unit, such that vLAN setup module 1440 can distinguish the service port because each service port is connected to a unique port of the vLAN setup module. A server is installed into the rack unit in block 3506. For example, server 1460 can be installed into the rack unit. A service port of the server is connected to the service port of the rack unit in block 3508. For example, service port 1462 of server 1460 can be plugged into service port 1442 of the rack unit. A host port of the server is connected to a server rack switch in block 3510. For example, host port 1466 of server 1460 can be connected to host port 1452 of rack switch 1450. A service port of the server rack switch is connected to a service port of a RMC in block 3512. For example, service port 1459 of server rack switch 1450 can be connected to service port 1432 of RMC 1430.

The host ports are mapped to the switch and the vLAN associations for the switch are determined based upon the service port connections and the host port connections with the server in block 3514, and the server vLANs are mapped in the server rack switch in block 3516. A decision is made as to whether or not the rack unit is the last rack unit of the server rack in decision block 3518. If so, the "YES" branch of decision block 3518 is taken and the method ends in block 3522. If the rack unit is not the last rack unit of the server rack, the "NO" branch of decision block 3518 is taken, the next rack unit is considered in block 3520, and the method proceeds to block 3504 where a next service port is associated with the next rack unit.

Figure 36:
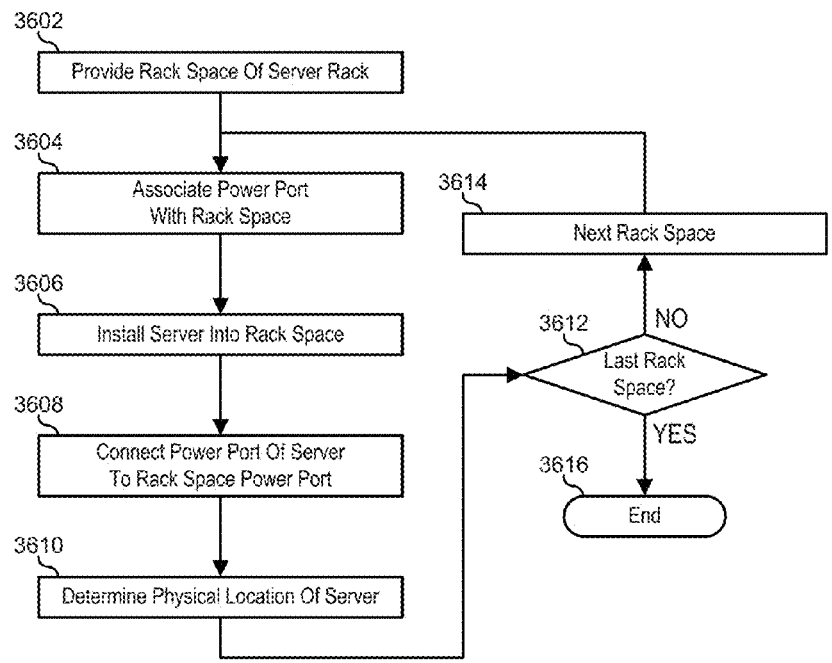
FIG. 36 is a flowchart illustrating a method for mapping power connections in a server rack according to an embodiment of the present disclosure.

FIG. 36 illustrates a method for mapping power connections in a server rack beginning at block 3602 where a server rack is provided with a rack space. For example server rack 1500 can include a rack space. A power receptacle is associated with a rack unit of the rack space in block 3604. For example, power receptacle 1542 can be associated with rack unit of server rack 1500, such that power mapping module 1440 can distinguish the power receptacle because each power receptacle provides an individual indication to the power mapping module. A server is installed into the rack unit in block 3606. For example, server 1590 can be installed into the rack unit. A power receptacle of the server is connected to the power receptacle of the rack unit in block 3608. For example, power receptacle 1592 of server 1590 can be plugged into power receptacle 1552 of the rack unit. The physical location of the server is determined based upon the fact that the power receptacle of the server is connected to the power receptacle of the rack unit in block 3610. For example, because power receptacle 1592 is plugged into power receptacle 1552, the physical location of the server is determined to be in the particular rack unit. A decision is made as to whether or not the rack unit is the last rack unit of the server rack in decision block 3612. If so, the "YES" branch of decision block 3612 is taken and the method ends in block 3616. If the rack unit is not the last rack unit of the server rack, the "NO" branch of decision block 3612 is taken, the next rack unit is considered in block 3614, and the method proceeds to block 3604 where a next service port is associated with the next rack unit.

Figure 52:
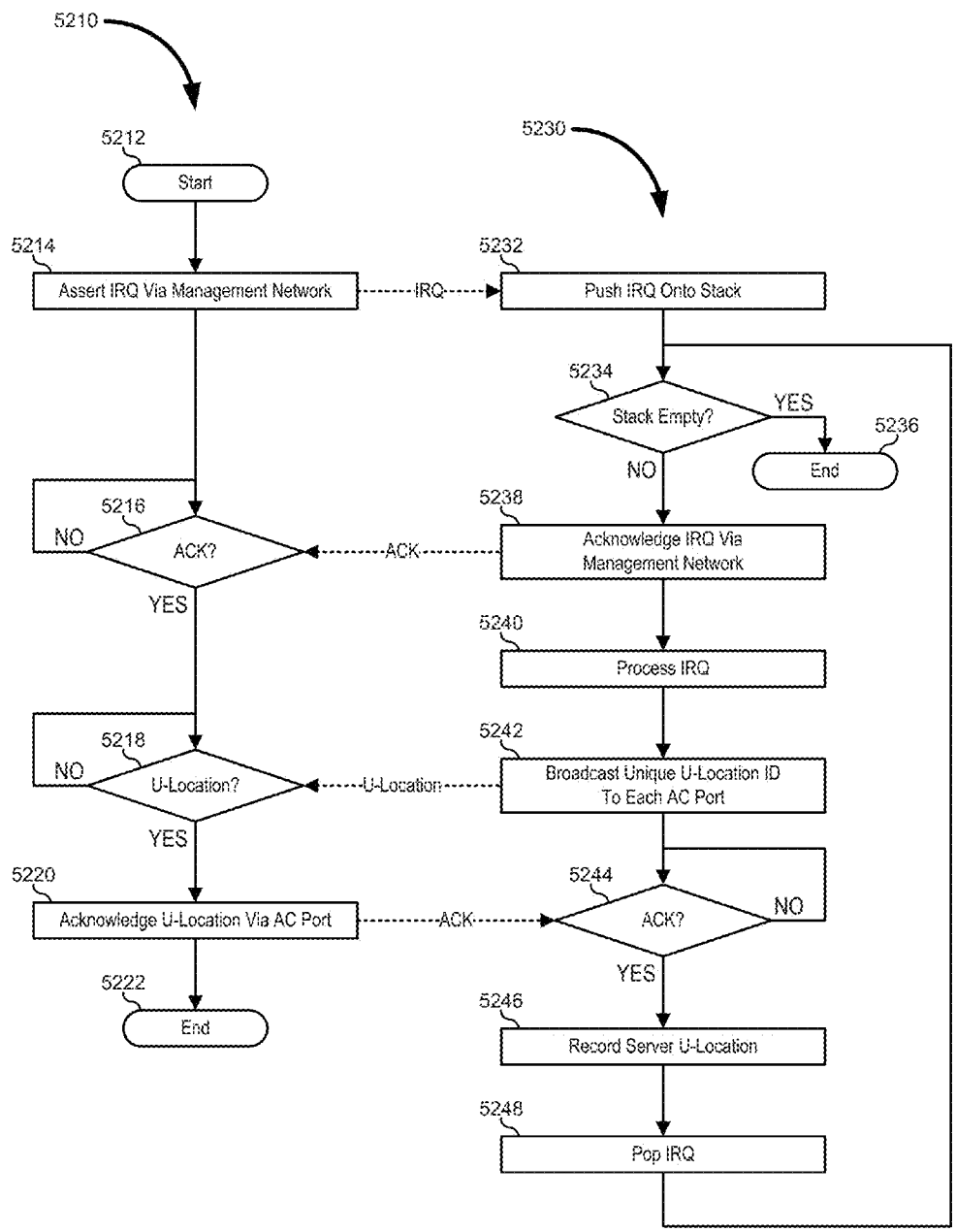
FIG. 52 is a flowchart illustrating a method of determining the physical location of a server in a server rack according to an embodiment of the present disclosure.

FIG. 52 illustrates a method of determining the physical location of a server in a server rack, such as is described in block 3610 of FIG. 36. The method includes steps 5210 performed in the server and steps 5230 performed in the server rack. In a particular embodiment, steps 5210 are performed by one or more of a BMC associated with the server, a PLC module in the power supply of the server, or by another device of the server, and steps 5230 are performed by one or more of a RMC of the server rack, a PDU of the server rack, or by another device of the server rack. The method starts in the server at block 5212, and the server asserts an interrupt request (IRQ) via a management network to the server rack in block 5214. The server awaits an acknowledgement (ACK) of the IRQ from the server rack in decision block 5216. When the server receives the ACK from the server rack, the "YES" branch of decision block 5216 is taken and the server awaits a unique U-space location identification from the server rack in decision block 5218. When the server receives the unique U-space location identification from the server rack, the "YES" branch of decision block 5218 is taken, the server sends an ACK to the server rack via a PLC over the AC port in block 5220, and the method ends in block 5222.

In the server rack, the IRQ from block 5214 is received and is pushed onto an IRQ stack in block 5232. A decision is made as to whether or not the stack is empty in decision block 5234. If so, the "YES" branch of decision block 5234 is taken and the method ends in block 5236. However, if the stack is not empty, the "NO" branch of decision block 5234 is taken and the server rack provides an ACK to the server, to decision block 5216, via the management network in block 5238. The IRQ from the server is processed in the server rack in block 5240 and a unique U-space location identification is broadcast on each AC Port, thereby providing the unique U-space location identification to the server, to decision block 5218, in block 5242. The server rack awaits an ACK of the unique U-space location identification from the server, from block 5220, in decision block 5244. When the server rack receives the ACK from the server, the "YES" branch of decision block 5244 is taken, the server location is recorded by the server rack in block 5246, the IRP is popped off of the stack in block 5248, and the method returns to decision block 5234 to process a next IRQ until all IRQs are processed.

Figure 37:
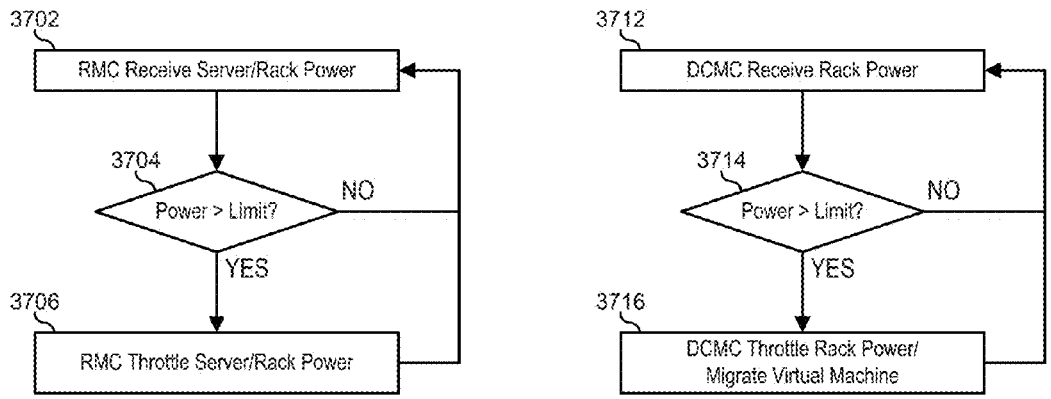
FIG. 37 is a flowchart illustrating a method for managing the running average power in a server rack and a data center according to an embodiment of the present disclosure.

FIG. 37 illustrates a method for managing the running average power in a server rack beginning at block 3702 where a RMC receives power usage levels for the power receptacles of the server rack. For example, RMC 1530 can receive the power usage level for power receptacle 1552. A decision is made as to whether or not the power usage level is greater than a power usage limit in decision block 3704. If not, the "NO" branch of decision block 3704 is taken and the method returns to block 3702 where the RMC receives power usage levels for the power receptacles of the server rack. If the power usage level is greater than a power usage limit, the "YES" branch of decision block 3704 is taken, the RMC throttles the server in block 3706, and the method returns to block 3702 where the RMC receives power usage levels for the power receptacles of the server rack.

FIG. 37 also illustrates a method for managing the running average power in a data center beginning at block 3712 where a DCMC receives power usage levels for a server rack. A decision is made as to whether or not the power usage level is greater than a power usage limit in decision block 3714. If not, the "NO" branch of decision block 3714 is taken and the method returns to block 3702 where the DCMC receives power usage levels for the server rack. If the power usage level is greater than a power usage limit, the "YES" branch of decision block 3714 is taken, the DCMC migrates one or more virtual machines from the server rack in block 3716, and the method returns to block 3712 where the DCMC receives power usage levels for the server rack.

Figure 38:
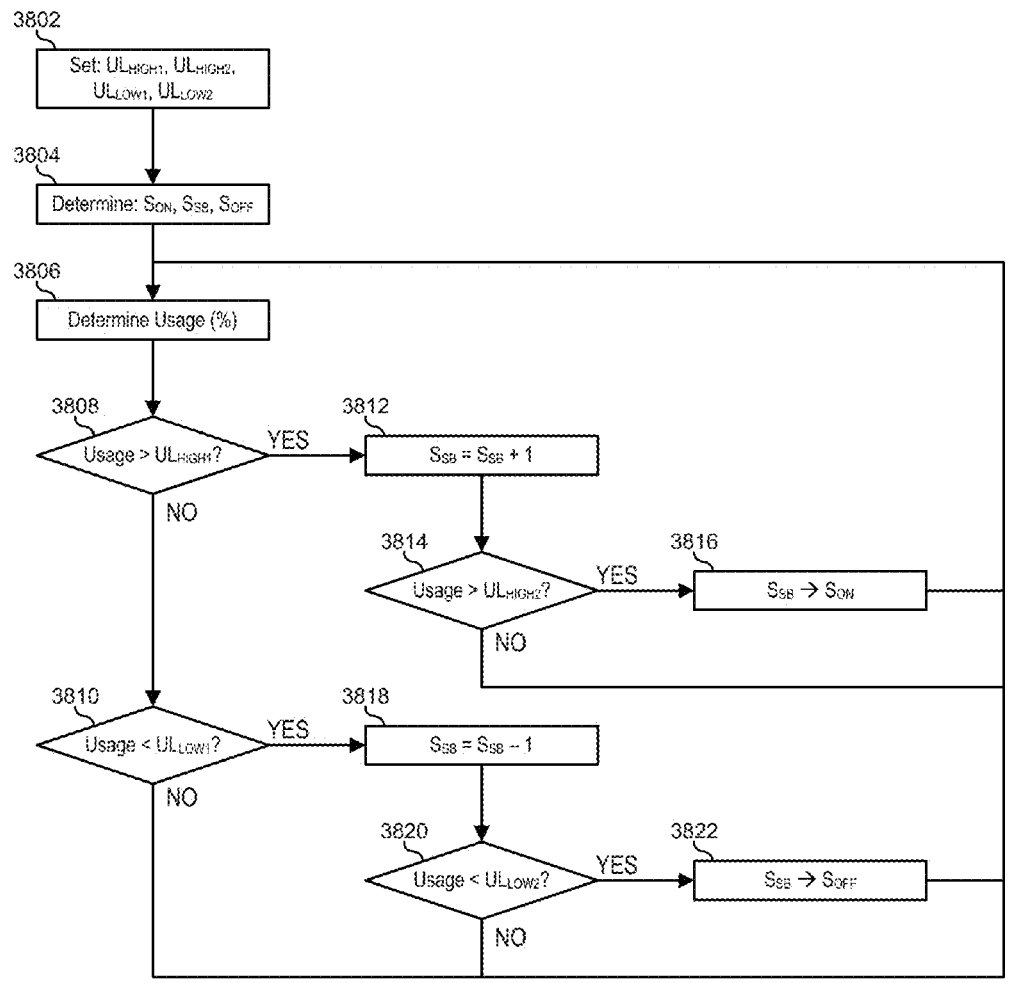
FIG. 38 is a flowchart illustrating a method for operating servers in various standby modes according to an embodiment of the present disclosure.

FIG. 38 illustrates a method for operating servers in various standby modes beginning at block 3802 where a first high utilization limit ($UL_{HIGH1}$), a second high utilization limit ($UL_{HIGH2}$), a first low utilization limit ($UL_{LOW1}$), and a second low utilization limit ($UL_{LOW2}$) are set. In a particular embodiment, the limits are set for a particular server rack in a data center. In another embodiment, the limits are set for the whole data center. A number of servers that are on ($S_{ON}$), a number of servers that are in standby ($S_{SB}$), and a number of servers that are off ($S_{OFF}$), are determined in block 3804. A server usage level is determined in block 3806. In a particular embodiment, the server usage level is determined for the server rack. In another embodiment, the server usage level is determined for the whole data center.

A decision is made as to whether or not the server usage level is greater than $UL_{HIGH1}$ in decision block 3808. If not, the "NO" branch of decision block 3808 is taken and a decision is made as to whether or not the server usage level is less than $UL_{LOW1}$ in decision block 3810. If not, the "NO" branch of decision block 3810 is taken and the method returns to block 3806 where the server usage level is re-determined. In this sequence of events, the server usage level is determined to be within a nominal range and no changes are made to $S_{ON}$, $S_{SB}$, or $S_{OFF}$.

Returning to decision block 3808, if the server usage level is greater than $UL_{HIGH1}$, the "YES" branch is taken, $S_{SB}$ is increased by 1 (one) server, that is, the number of severs in the standby state is increased by 1 (one), in block 3812, and a decision is made as to whether or not the server usage level is also greater than $UL_{HIGH2}$ in decision block 3814. If not, the "NO" branch of decision block 3814 is taken and the method returns to block 3806 where the server usage level is re-determined. If the server usage level is also greater than $UL_{HIGH2}$, the "YES" branch of decision block 3814 is taken, $S_{ON}$ is increased by 1 (one) server, that is, the number of severs in the in the power-on state is increased by 1 (one) in block 3816, and the method returns to block 3806 where the server usage level is re-determined.

Returning to decision block 3810, if the server usage level is less than $UL_{LOW1}$, the "YES" branch is taken, $S_{SB}$ is decreased by 1 (one) server, that is, the number of severs in the standby state is decreased by 1 (one), in block 3818, and a decision is made as to whether or not the server usage level is also less than $UL_{LOW2}$ in decision block 3820. If not, the "NO" branch of decision block 3820 is taken and the method returns to block 3806 where the server usage level is re-determined. If the server usage level is also less than $UL_{LOW2}$, the "YES" branch of decision block 3820 is taken, $S_{OFF}$ is increased by 1 (one) server, that is, the number of severs in the in the power-off state is increased by 1 (one) in block 3822, and the method returns to block 3806 where the server usage level is re-determined.

Figure 39:
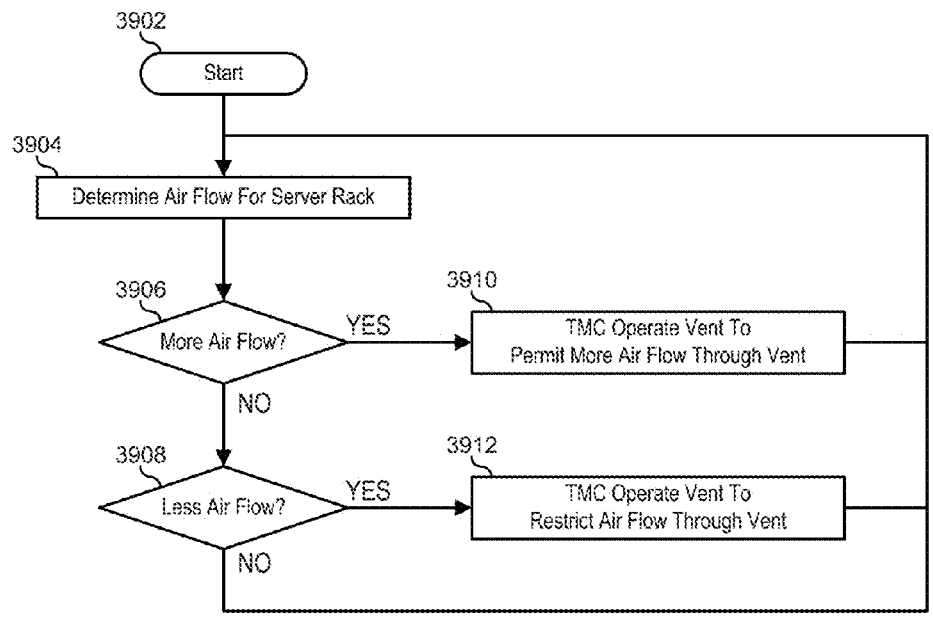
FIG. 39 is a flowchart illustrating a method for operating a floor tile with an active vent according to an embodiment of the present disclosure.

FIG. 39 illustrates a method for operating a floor tile with an active vent beginning at block 3902. An air flow needed for a server rack is determined in block 3904. For example, one or more of an active floor tile such as active floor tile 1700 and a server rack 1800 can measure the temperature and the humidity of the thermally controlled air in the vicinity of the server rack to determine if more or less of the thermally controlled air is needed by the serve rack. A decision is made as to whether or not more air flow is needed by the server rack in decision block 3906. If not, the "NO" branch of decision block 3906 is taken and a decision is made as to whether or not less air flow is needed b the server rack in decision block 3908. If not, the "NO" branch of decision block 3908 is taken and the method returns to block 3904 where the air flow needed for a server rack is determined. In this sequence of events, the air flow provided to the server rack is sufficient to the cooling needs of the server rack.

Returning to decision block 3906, if more air flow is needed by the server rack, then the "YES" branch is taken, one or more of the DCMC, the RMC, and the TMC operate to direct the active floor the to provide additional air flow to the server rack in block 3910, and method returns to block 3904 where the air flow needed for a server rack is determined. For example, TMC 1710 can operate to direct actuator 1762 to position baffle 1764 to restrict less of air flow 1770 to provide additional thermally controlled air to the server rack. Returning to decision block 3908, if less air flow is needed by the server rack, then the "YES" branch is taken, one or more of the DCMC, the RMC, and the TMC operate to direct the active floor tile to provide less air flow to the server rack in block 3912, and method returns to block 3904 where the air flow needed for a server rack is determined. For example, TMC 1710 can operate to direct actuator 1762 to position baffle 1764 to restrict more of air flow 1770 to provide less thermally controlled air to the server rack.

Figure 40:
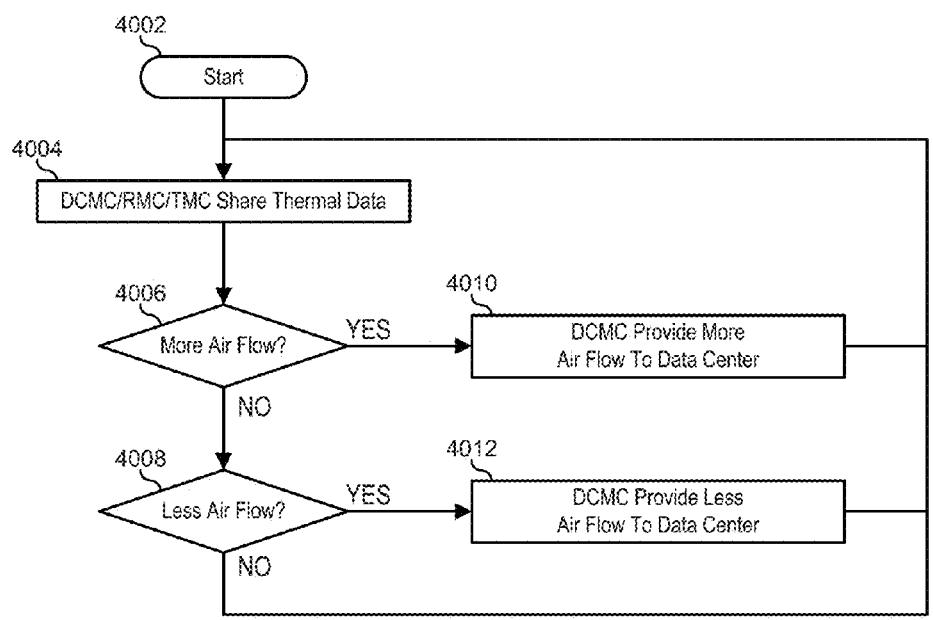
FIG. 40 is a flowchart illustrating a method for closed loop thermal control of a server rack and a data center according to an embodiment of the present disclosure.

FIG. 40 illustrates a method for closed loop thermal control of a server rack and a data center beginning at block 4002. An air flow needed for a data center is determined in block. 4004. For example, one or more of an active floor tile such as active floor tile 1700 and a server rack 1800 can measure the temperature and the humidity of the thermally controlled air in the vicinity of the server rack to determine if more or less of the thermally controlled air is needed by the serve rack, and a DCMC can measure the temperature and humidity of the thermally controlled air leaving and entering the data center AC system. A decision is made as to whether or not more air flow is needed in the data center in decision block 4006. If not, the "NO" branch of decision block 4006 is taken and a decision is made as to whether or not less air flow is needed bin the data center in decision block 4008. If not, the "NO" branch of decision block 4008 is taken and the method returns to block 4004 where the air flow needed for the data center is determined. In this sequence of events, the air flow provided to the data center is sufficient to the cooling needs of the server racks in the data center. Returning to decision block 4006, if more air flow is needed by the data center, then the "YES" branch is taken, the DCMC operates to direct the AC system to provide additional air flow to the data center in block 4010, and method returns to block 4004 where the air flow needed for the data center is determined. Returning to decision block 4008, if less air flow is needed by the data center, then the "YES" branch is taken, the DCMC operates to direct the AC system to provide less air flow to the data center in block 4012, and method returns to block 4004 where the air flow needed for a server rack is determined.

Figure 41:
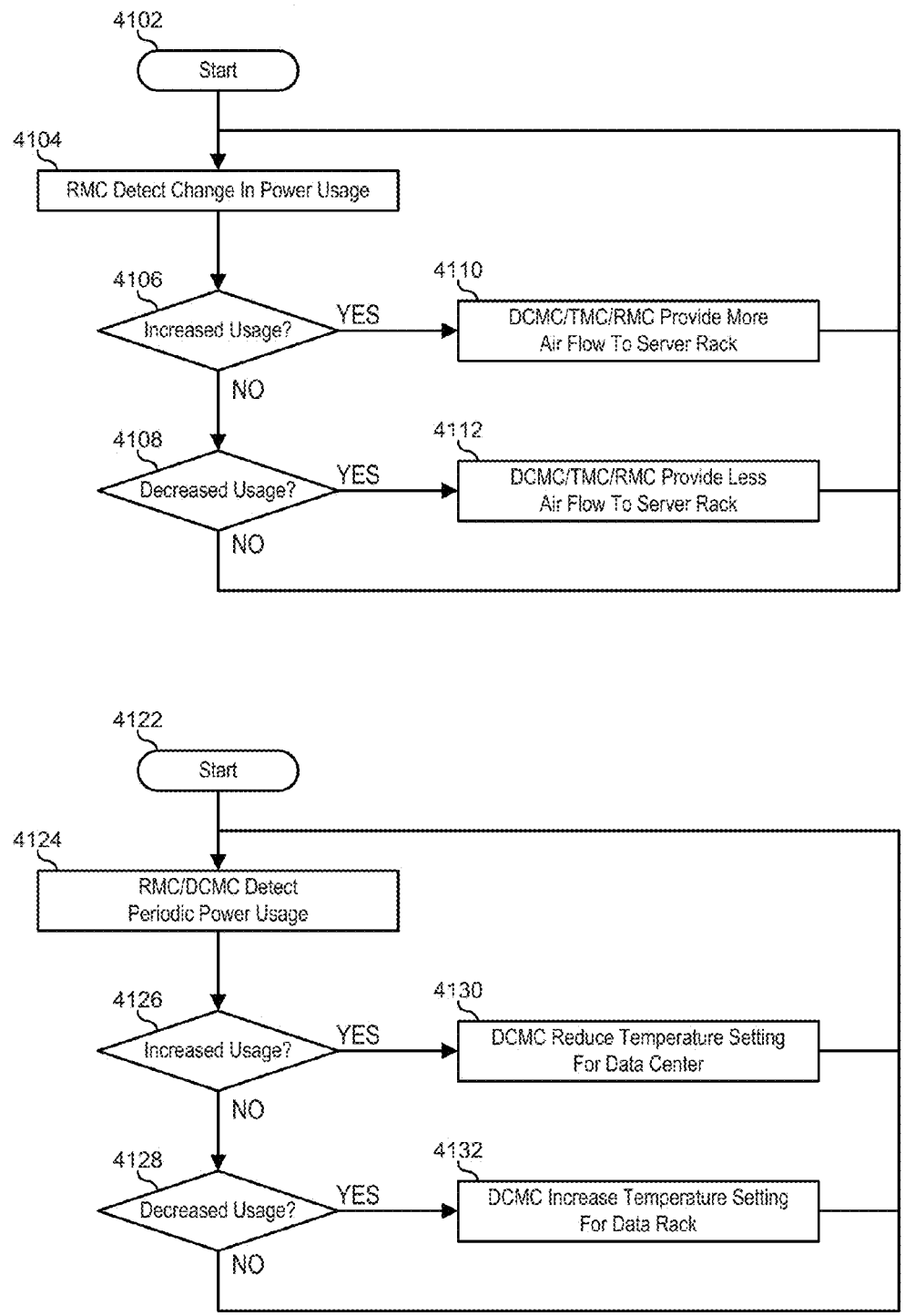
FIG. 41 is a flowchart illustrating a method for preemptive/proactive cooling of a server rack and a data center according to an embodiment of the present disclosure.

FIG. 41 illustrates a method for (preemptive/proactive cooling of a server rack beginning at block 4102. A change in the power usage of a server or a server rack is detected in block 4104. For example, RMC 1810 can detect the power usage of one or more servers in server rack 1800, and can detect when the level of the power usage changes for one or more server. A decision is made as to whether or not the power usage in the server rack has increased in decision block 4106. If not, the "NO" branch of decision block 4106 is taken and a decision is made as to whether or not the power usage in the server rack has decreased in decision block 4108. If not, the "NO" branch of decision block 4108 is taken and the method returns to block 4104 where a change in the power usage of the server or the server rack is detected. In this sequence of events, the power usage of the servers and the server rack is unchanged.

Returning to decision block 4106, if the power usage in the server rack has increased, then the "YES" branch is taken, one or more of the DCMC, the RMC, and the TMC operate to direct additional air flow to the server rack in block 4110, and method returns to block 4104 where a change in the power usage of the server or the server rack is detected. For example, RMC 1810 can direct TMC 1710 to operate actuator 1762 to position baffle 1764 to restrict less of air flow 1770 to provide additional thermally controlled air to the server rack. Returning to decision block 4108, if the power usage in the server rack has decreased, then the "YES" branch is taken, one or more of the DCMC, the RMC, and the TMC operate to direct less air flow to the server rack in block 4112, and method returns to block 4104 where a change in the power usage of the server or the server rack is detected. For example, RMC 1810 can direct TMC 1710 to operate actuator 1762 to position baffle 1764 to restrict more of air flow 1770 to provide less thermally controlled air to the server rack.

FIG. 41 also illustrates a method for preemptive/proactive cooling of a data center beginning at block 4122. One or more of a RMC and a DCMC detects a periodic change in the power usage of a data center in block 4124. For example, RMC 1810 can detect when the power usage of one or more servers in server rack 1800 varies with time. A decision is made as to whether or not the power usage in the data center periodically increases in decision block 4126. If not, the "NO" branch of decision block 4126 is taken and a decision is made as to whether or not the power usage in the data center periodically decreases in decision block 4128. If not, the "NO" branch of decision block 4128 is taken and the method returns to block 4124 where one or more of a RMC and a DCMC detects a periodic change in the power usage of a data center. In this sequence of events, the power usage has not periodically changed.

Returning to decision block 4126, if the power usage in the data center periodically increases, then the "YES" branch is taken, the DCMC operates to direct the AC system to reduce a temperature setting for the thermally controlled air in the data center in block 4130, and method returns to block 4124 where one or more of a RMC and a DCMC detects a periodic change in the power usage of a data center. For example, DCMC 150 can direct the AC system to reduce the temperature setting in data center 100. Returning to decision block 4128, if the power usage in the data center periodically decreases, then the "YES" branch is taken, the DCMC operates to direct the AC system to increase the temperature setting for the thermally controlled air in the data center in block 4132, and method returns to block 4124 where one or more of a RMC and a DCMC detects a periodic change in the power usage of a data center. For example, DCMC 150 can direct the AC system to increase the temperature setting in data center 100.

Figure 42:
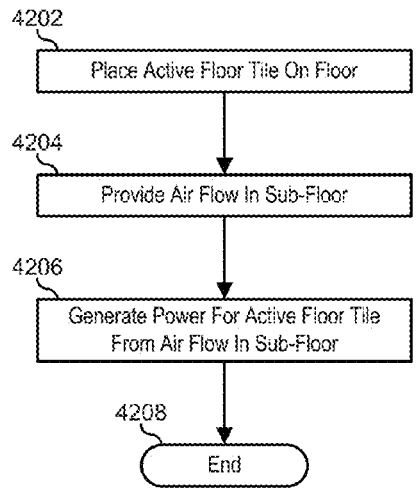
FIG. 42 is a flowchart illustrating a method for active power generation for an active floor tile according to an embodiment of the present disclosure.

FIG. 42 illustrates a method for active power generation for an active floor tile beginning at block 4202 where an active floor tile is placed onto a data center floor. For example, active floor tile 1900 can be placed into a data center floor. An air flow is provided in a sub-floor area of the data center floor in block 4204. For example, air flow 1960 can be provided in the sub-floor area below active floor tile 1900. Power is generated for the active floor tile from the airflow in the sub-floor in block 4206, and the method ends in block 4208. For example, active floor tile 1900 can receive operating power from power generator 1952.

Figure 43:
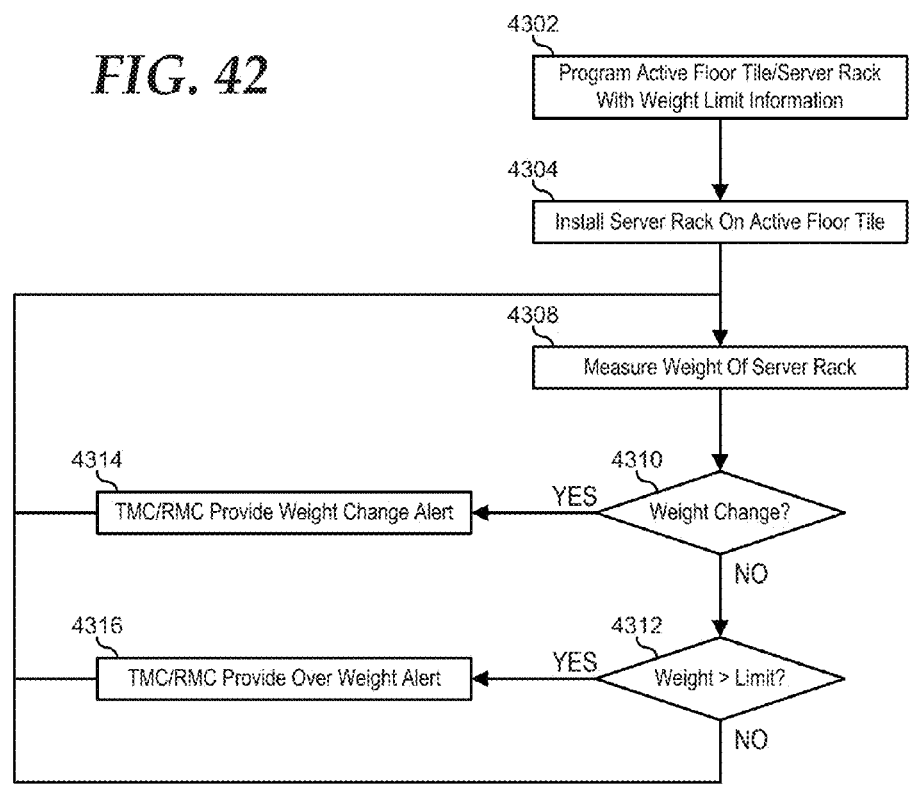
FIG. 43 is a flowchart illustrating a method for reporting the weight of a server rack according to an embodiment of the present disclosure.

FIG. 43 illustrates a method for reporting the weight of a server rack beginning at block 4302 where one or more of an active floor tile and a server rack are programmed with weight limit information for the floor tile in block 4302. For example, one or more of memory 2030 of active floor tile 2000, and memory 2130 of active floor tile 2100 can be programmed with weight limit information for the floor tile. The server rack is installed on the active floor tile in block 4304. For example, server rack 2100 can be installed on active floor tile 2000. One or more of the active floor tile and the server rack measures the weight of the server rack in block 4308. For example, one or more of weight sensor 2046 and weight sensor 2146 can measure the weight of server rack 2100.

A decision is made as to whether or not the measured weight has changed in block 4310. If not, the "NO" branch of decision block 4310 is taken and a decision is made as to whether or not the measured weight is greater than the weight limit information in decision block 4312. If not, the "NO" branch of decision block 4312 is taken and the method returns to block 4308 where one or more of the active floor tile and the server rack measures the weight of the server rack. Returning to decision block 4310, if the measured weight has changed, the "YES" branch is taken, one or more of a TMC and a RMC provides an alert that the weight of the server rack has been changed in block 4314, and the method returns to block 4308 where one or more of the active floor tile and the server rack measures the weight of the server rack. For example one or more pieces of equipment can have been removed from or installed into server rack 2100, and one or more of TMC 2010 and RMC 2110 can provide an alert to a DCMC, indicating that the one or more pieces of equipment have been removed or installed into the server rack. Returning to decision block 4312, if the measured weight is greater than the weight limit information, the "YES" branch is taken, one or more of a TMC and a RMC provides an alert that the weight of the server rack is greater than the weight limit in block 4316, and the method returns to block 4308 where one or more of the active floor tile and the server rack measures the weight of the server rack. For example one or more of TMC 2010 and RMC 2110 can provide an alert to a DCMC, indicating that the weight of the server rack is greater than the weight limit.

Figure 44:
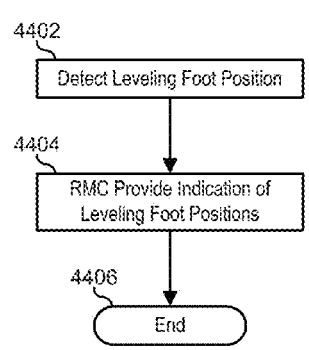
FIG. 44 is a flowchart illustrating a method for providing a position indication for leveling feet of a server rack according to an embodiment of the present disclosure.

FIG. 44 illustrates a method for providing a position indication for leveling feet of a server rack beginning at block 4402 where the position of a leveling foot of a server rack is detected. For example, server rack 2200 can include a foot assembly 2210 and a weight assembly 2220, and the weight assembly can be configured to determine if the foot assembly is raised or lowered. A RMC provides an indication as to the position of the leveling foot in block 4404, and the method ends in block 4406. For example, a RMC of server rack 2200 can receive an indication from weight assembly 2220 as to the position of foot assembly 2210, and can provide the indication as a visual indication on the server rack, as an indication on a display, or another indication as needed or desired.

Figure 45:
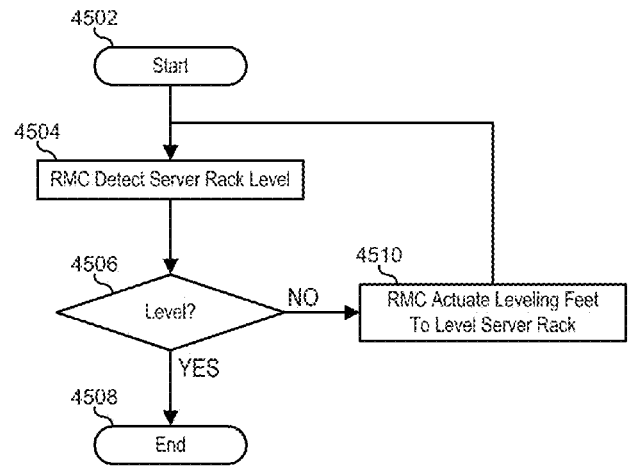
FIG. 45 is a flowchart illustrating a method for leveling a server rack according to an embodiment of the present disclosure.

FIG. 45 illustrates a method for leveling a server rack beginning at block 4502. A RMC detects the level of a server rack in. block 4504. For example, server rack 2300 can include a leveling module for detecting the level of the server rack. A decision is made as to whether or not the server rack is level in decision block 4506. If so, the "YES" branch of decision block 4506 is taken and the method ends at block 4508. If the server rack is not level, the "NO" branch of decision block 4506 is taken, the RMC actuates the leveling feet of the server rack to level the server rack in block 4510, and the method returns to block 4504 where the RMC detects the level of the server rack. For example, leveling module 2350 can actuate adjusting servo 2316 to raise or lower foot 2312, as needed to bring server rack 2300 into level.

Figure 46:
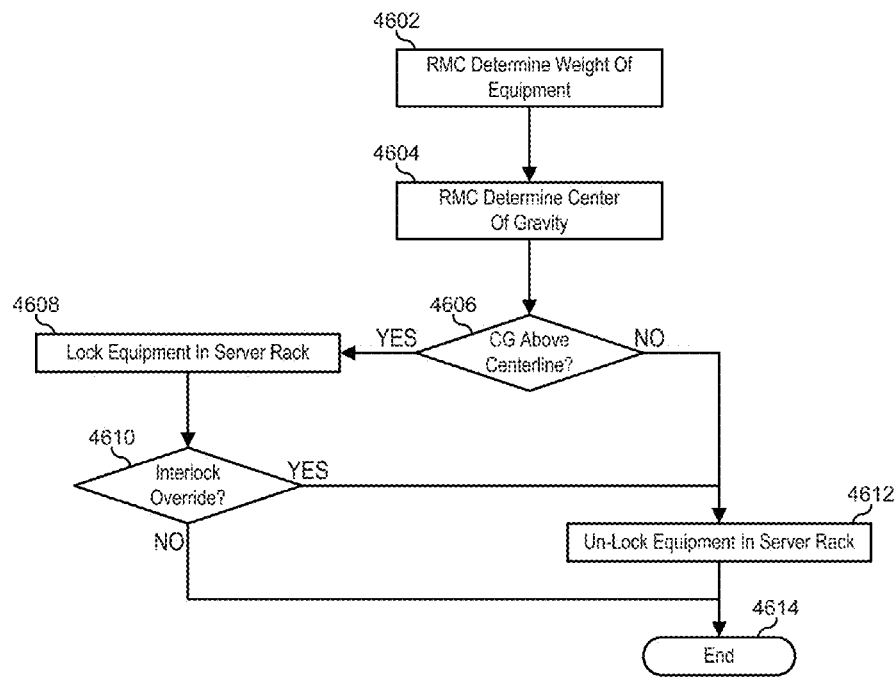
FIG. 46 is a flowchart illustrating a method for locking equipment into an unbalanced server rack according to an embodiment of the present disclosure.

FIG. 46 illustrates a method for locking equipment into an unbalanced server rack beginning at block 4602 where a RMC determines the weight of the equipment installed in the server rack. The RMC determines a center or gravity for the equipment in a server rack in block 4604. For example, RMC 2410 can determine that the center of gravity 2475 for servers 2440, 2445, 2450, 2455, and 2460, or center of gravity 2477 for servers 2455 and 2460. A determination is made as to whether or not the center of gravity is above a centerline of the server rack in decision block 4606. If not, the "NO" branch of decision block 4606 is taken, the equipment in the server rack is un-locked in block 4612, and the method ends in block 4614. For example, center of gravity 2475 can be below centerline 2470, and interlocks 2422-2432 can be operated in the open position to permit the installation and removal of servers 2440, 2445, 2450, 2455, and 2460. If the center of gravity is above a centerline of the server rack, the "YES" branch of decision block 4606 is taken, and the equipment in the server rack is locked in block 4608. For example center of gravity 2477 can be above centerline 2470, and interlocks 2422-2432 can be operated in the closed position to prevent the removal of servers 2455 and 2460. A decision is made as to whether or not the interlock is overridden in decision block 4610. If so, the "YES" branch of decision block 4610 is taken, the equipment in the server rack is un-locked block 4612, and the method ends in block 4614. If the interlock is not overridden, the "NO" branch of decision block 4610 is taken and the method ends at block 4614.

Figure 47:
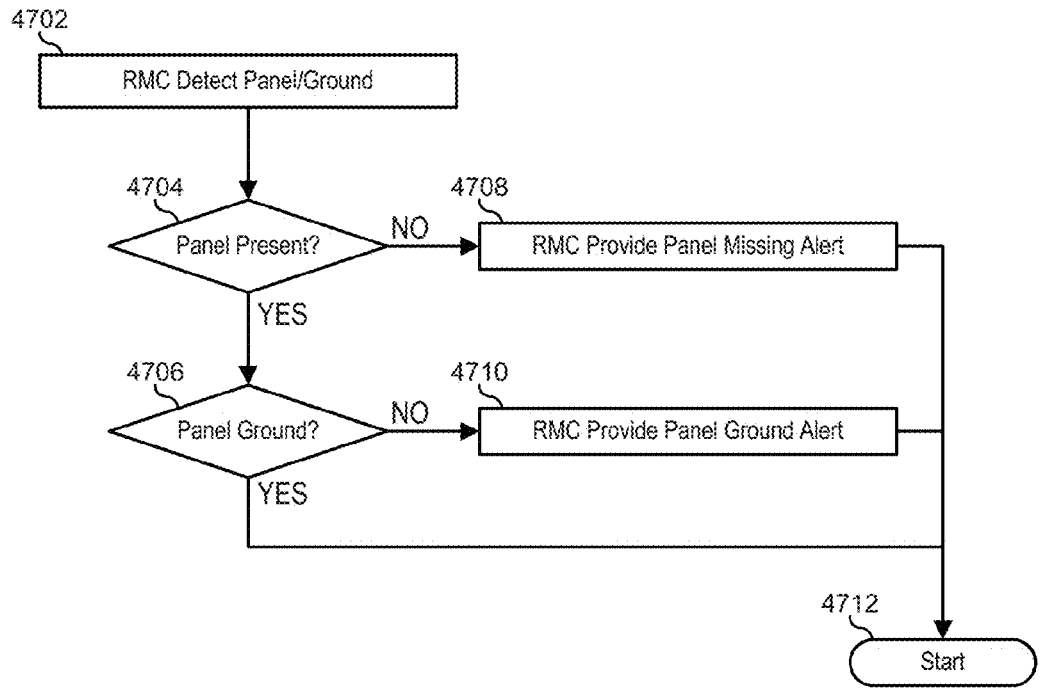
FIG. 47 is a flowchart illustrating a method for detecting a panel in a server rack according to an embodiment of the present disclosure.

FIG. 47 illustrates a method for detecting a panel in a server rack beginning at block 4702 where a RMC detects whether or not a panel is installed on a server rack, and whether or not an installed panel is grounded. For example, RMC 2610 can operate to detect the presence or absence of panel 2640, and whether or not the panel is grounded. A decision is made as to whether or not the panel is present in the server rack in decision block 4704. If so, the "YES" branch of decision block 4704 is taken and a decision is made as to whether or not the detected pane is grounded in decision block 4706. If so, the "YES" branch of decision block 4706 is taken and the method ends at block 4712. Returning to decision block 4704, if the panel is not present in the server rack, the "NO" branch is taken, the RMC provides an alert that indicates that the panel is missing from the server rack in block 4708, and the method ends in block 4712. Returning to decision block 4706, if the panel is not grounded, the "NO" branch is taken, the RMC provides an alert that indicates that the panel is not grounded in block 4710, and the method ends in block 4712.

Figure 48:
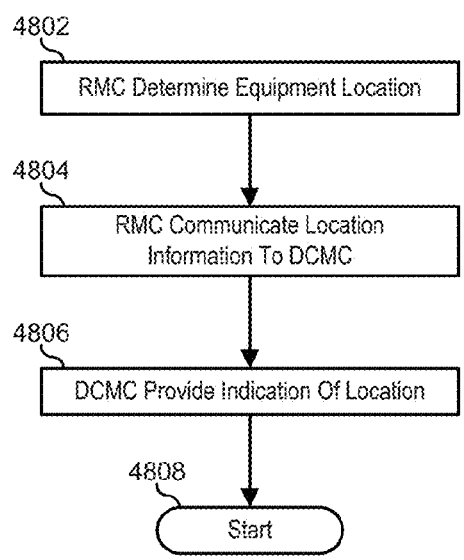
FIG. 48 is a flowchart illustrating a method for managing a data center according to an embodiment of the present disclosure.

FIG. 48 illustrates a method for managing a data center beginning at block 4802 where a RMC determines the location of equipment in a server rack. For example, a RMC can determine the location of the equipment by one or more of the methods described herein in FIGS. 33 and 36. The RMC communicates the location information to a DCMC in block 4804. The DCMC provides an indication of the location information in block 4806, and the method ends in block 4808. For example, DCMC 150 can provide the indication via one or more of a management system of data center 100 and a data center management appliance 2710.

Figure 49:
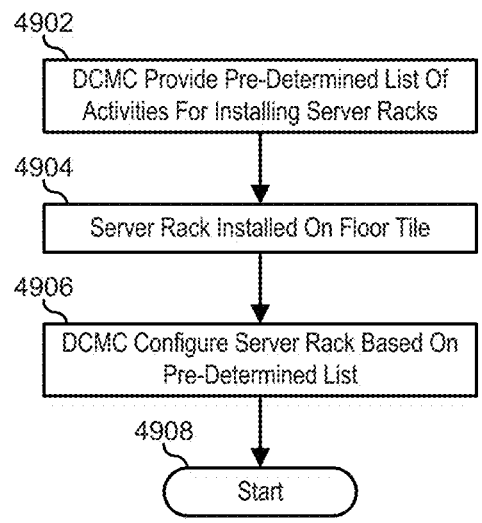
FIG. 49 is a flowchart illustrating a method for setting up a data center according to an embodiment of the present disclosure.

FIG. 49 illustrates a method for setting up a data center beginning at block 4902 where a DCMC is provided with a pre-determined list of activities to perform when a server rack is installed in a data center. The pre-determined list can include preset server names, prefixes, IP addresses, BMC names, and the like for the servers or server racks, other server configuration information, such as OS installation instructions, application software installation instructions, vLAN mappings, and the like, as needed or desired. A server rack is installed in the data center in block 4904, the servers and server rack are configure by the DCMC based upon the pre-determined list in block 4906, and the method ends in block 4908.

Figure 50:
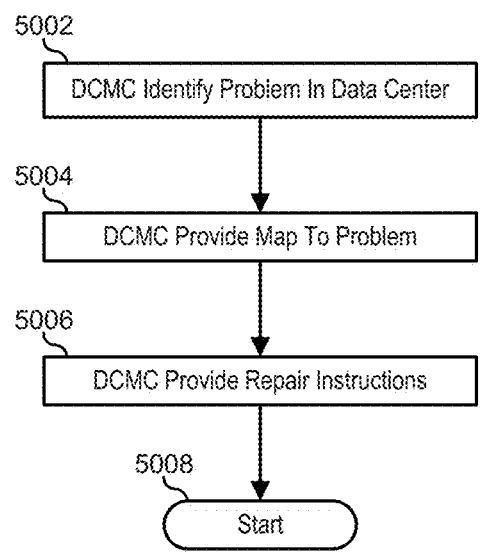
FIG. 50 is a block diagram illustrating a method for repairing a data center according to an embodiment of the present disclosure.

FIG. 50 illustrates a method for repairing a data center beginning at block 5002 where a DCMC identifies a problem in a data center. The DCMC provides a map to the problem in block 5004. For example, DCMC 1500 can provide the map to a problem via a data center management appliance 2710, providing a visual representation of the location of the equipment. The DCMC provides repair instructions to fix the problem in block 5006, and the method ends in block 5008. For example, the repair guide can include instructions for replacing a field replaceable unit (FRU) such as a disk drive, a power module, or the like.

Figure 51:
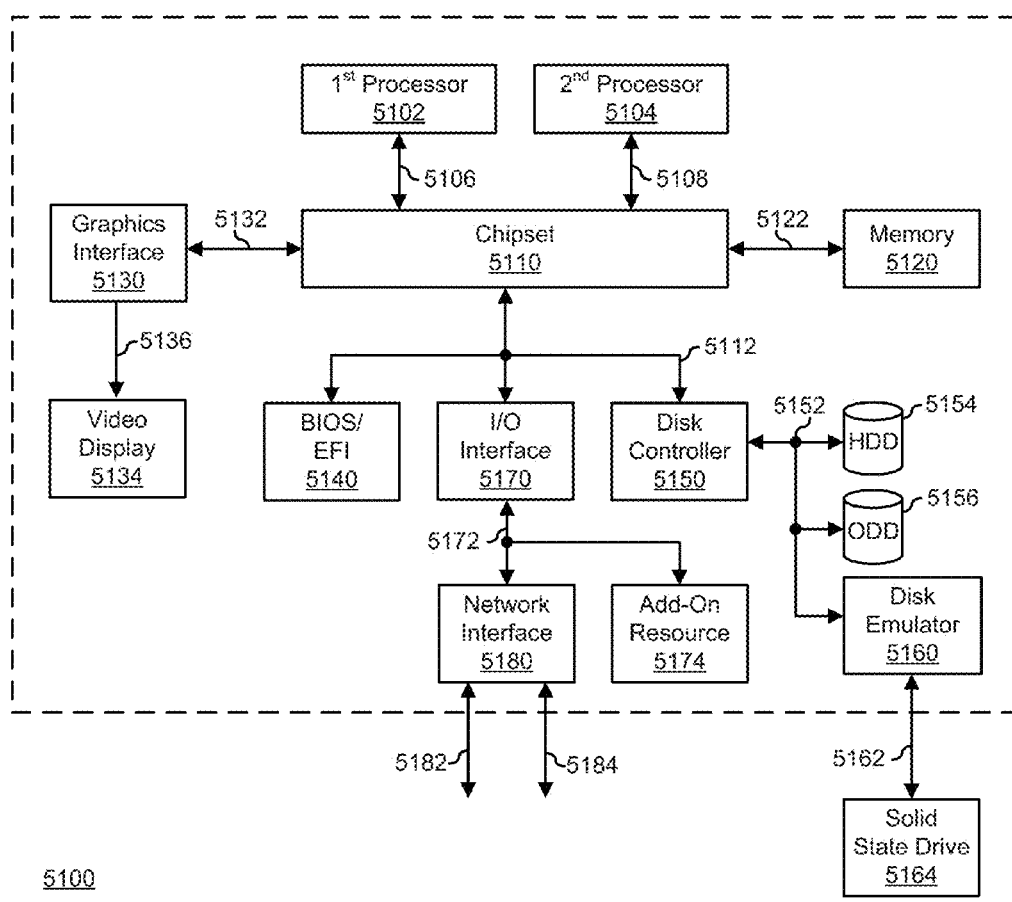
FIG. 51 is a block diagram illustrating a generalized information handling system according to an embodiment of the present disclosure.

FIG. 51 illustrates a generalized embodiment of information handling system 5100. For purpose of this disclosure information handling system 5100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 100 can include processing resources for executing machine-executable code, such as a central processing unit (CPU), a programmable logic array (PLA), an embedded. device such as a System-on-a-Chip (SoC), or other control logic hardware. Information handling system 5100 can also include one or more computer-readable medium for storing machine-executable code, such as software or data. Additional components of information handling system 5100 can include one or more storage devices that can store machine-executable code, one or more communications ports for communicating with external devices, and various input and output (I/O) devices, such as a keyboard, a mouse, and a video display. Information handling system 5100 can also include one or more buses operable to transmit information between the various hardware components.

Information handling system 5100 can include devices or modules that embody one or more of the devices or modules described above, and operates to perform one or more of the methods described above. Information handling system 5100 includes a processors 5102 and 5104, a chipset 5110, a memory 5120, a graphics interface 5130, include a basic input and output system/extensible firmware interface (BIOS/EFI) module 5140, a disk controller 5150, a disk emulator 5160, an input/output (I/O) interface 5170, and a network interface 5180. Processor 5102 is connected to chipset 5110 via processor interface 5106, and processor 5104 is connected to the chipset via processor interface 5108. Memory 5120 is connected to chipset 5110 via a memory bus 5122. Graphics interface 5130 is connected to chipset 5110 via a graphics interface 5132, and provides a video display output 5136 to a video display 5134. In a particular embodiment, information handling system 5100 includes separate memories that are dedicated to each of processors 5102 and 5104 via separate memory interfaces. An example of memory 5120 includes random access memory (RAM) such as static RAM (SRAM), dynamic RAM (DRAM), non-volatile RAM (NV-RAM), or the like, read only memory (ROM), another type of memory, or a combination thereof.

BIOS/EFI module 5140, disk controller 5150, and I/O interface 5170 are connected to chipset 5110 via an I/O channel 5112. An example of I/O channel 5112 includes a Peripheral Component Interconnect (PCI) interface, a PCI-Extended (PCI-X) interface, a high-speed PCI-Express (PCIe) interface, another industry standard or proprietary communication interface, or a combination thereof. Chipset 5110 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/EFI module 5140 includes BIOS/EFI code operable to detect resources within information handling system 5100, to provide drivers for the resources, initialize the resources, and access the resources. BIOS/EFI module 5140 includes code that operates to detect resources within information handling system 5100, to provide drivers for the resources, to initialize the resources, and to access the resources.

Disk controller 5150 includes a disk interface 5152 that connects the disc controller to a hard disk drive (HDD) 5154, to an optical disk drive (ODD) 5156, and to disk emulator 5160. An example of disk interface 5152 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 5160 permits a solid-state drive 5164 to be connected to information handling system 5100 via an external interface 5162. An example of external interface 5162 includes a USB interface, an IEEE 1394 (Firewire) interface, a proprietary interface, or a combination thereof. Alternatively, solid-state drive 5164 can be disposed within information handling system 5100.

I/O interface 5170 includes a peripheral interface 5172 that connects the I/O interface to an add-on resource 5174 and to network interface 5180. Peripheral interface 5172 can be the same type of interface as I/O channel 5112, or can be a different type of interface. As such, I/O interface 5170 extends the capacity of I/O channel 5112 when peripheral interface 5172 and the I/O channel are of the same type, and the I/O interface translates information from a format suitable to the I/O channel to a format suitable to the peripheral channel 5172 when they are of a different type. Add-on resource 5174 can include a data storage system, an additional graphics interface, a network interface card (NIC), a sound/video processing card, another add-on resource, or a combination thereof. Add-on resource 5174 can be on a main circuit board, on separate circuit board or add-in card disposed within information handling system 5100, a device that is external to the information handling system, or a combination thereof.

Network interface 5180 represents a NIC disposed within information handling system 5100, on a main circuit board of the information handling system, integrated onto another component such as chipset 5110, in another suitable location, or a combination thereof. Network interface device 5180 includes network channels 5182 and 5184 that provide interfaces to devices that are external to information handling system 5100. In a particular embodiment, network channels 5182 and 5184 are of a different type than peripheral channel 5172 and network interface 5180 translates information from a format suitable to the peripheral channel to a format suitable to external devices. An example of network channels 5182 and 5184 includes InfiniBand channels, Fibre Channel channels, Gigabit Ethernet channels, proprietary channel architectures, or a combination thereof. Network channels 5182 and 5184 can be connected to external network resources (not illustrated). The network resource can include another information handling system, a data storage system, another network, a grid management system, another suitable resource, or a combination thereof.

The skilled artisan will recognize that, where a particular device type, standard, or operation is specified, that suitable alternatives as needed or desired can be incorporated along with the teachings herein. For example, where the present disclosure describes network communications such as Ethernet communications, other communication standards, hardware, or software can be utilized to provide communications of sufficient bandwidth to perform the operations, teachings, and methods as disclosed herein.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A server rack comprising:
a power mapping module;
a power receptacle coupled to the power mapping module and including a first power line communication module, wherein the power receptacle is:
uniquely associated with a rack unit of the server rack; and
collocated with the associated rack unit; and
a server installed into the rack unit and including a second power line communication module, the server being coupled to the power mapping module via a management network, wherein the server asserts an interrupt request to the power mapping module via the management network;
wherein:
the power mapping module sends a unique identifier via the first power line communication module in response to receiving the interrupt request;
the server receives the unique identifier via the second power line communication module and sends the unique identifier to the power mapping module via the management network; and
the power mapping module determines that the server is installed into the rack based upon the receipt of the unique identifier.

2. The server rack of claim 1, wherein the power mapping module determines a physical location of the server based upon the power receptacle being collocated with the rack unit.

3. The server rack of claim 2, wherein:
the management network includes a data center management controller; and
the power mapping module further provides the physical location of the server to the data center management controller.

4. The server rack of claim 1, further comprising:
a power distribution unit, wherein the power mapping module and the power receptacle are integrated with the power distribution unit.

5. The server rack of claim 1, wherein the server includes a management controller coupled to the second power line communication module.

6. The server rack of claim 5, wherein the management controller is operable to manage the server via the second power line communication module.

7. The server rack of claim 1, wherein the server acknowledges the receipt of the unique identifier via the second power line communication module.

8. A server rack comprising:
a power mapping module;
a power receptacle coupled to the power mapping module and including a first power line communication module, wherein the power receptacle is:
uniquely associated with a rack unit of the server rack; and
collocated with the associated rack unit; and
a server installed into the rack unit and including a second power line communication module, the server being coupled to the power mapping module via a management network, wherein the server asserts an interrupt request to the power mapping module via the management network;
wherein:
the power mapping module sends a unique identifier to the server via the management network in response to receiving the interrupt request;
the server receives the unique identifier and sends the unique identifier to the power mapping module via the second power line communication module; and the power mapping module determines that the server is installed into the rack based upon the receipt of the unique identifier.

9. The server rack of claim 8, wherein the power mapping module determines a physical location of the server based upon the power receptacle being collocated with the rack unit.

10. The server rack of claim 9, wherein:
the management network includes a data center management controller; and
the power mapping module further provides the physical location of the server to the data center management controller.

11. The server rack of claim 8, further comprising:
a power distribution unit, wherein the power mapping module and the power receptacle are integrated with the power distribution unit.

12. The server rack of claim 8, wherein the server acknowledges the receipt of the unique identifier via, the second power line communication module.

13. The server rack of claim 8, wherein the server includes a management controller coupled to the second power line communication module.

14. The server rack of claim 13, wherein the management controller is operable to manage the server via the second power line communication module.

15. A server rack comprising:
a power mapping module;
a power receptacle coupled to the power mapping module and including a first power line communication module, wherein the power receptacle is:
uniquely associated with a rack unit of the server rack; and
collocated with the associated rack unit; and
a server installed into the rack unit and including a second power line communication module, the server being coupled to the power mapping module via a management network, wherein the server:
sends a unique identifier to the power mapping module via the management network; and
sends the unique identifier to the power mapping module via the second power line communication module;
wherein the power mapping module determines that the server is installed into the rack based upon the receipt of the unique identifier via the management network and the second power line communication module.

16. The server rack of claim 15, wherein the power mapping module determines a physical location of the server based upon the power receptacle being collocate with the rack unit.

17. The server rack of claim 16, wherein:
the management network includes a data center management controller; and
the power mapping module further provides the physical location of the server to the data center management controller.

18. The server rack of claim 15, further comprising:
a power distribution unit, wherein the power mapping module and the power receptacle are integrated with the power distribution unit.

19. The server rack of claim 15, wherein the server acknowledges the receipt of the unique identifier via the second power line communication module.

20. The server rack of claim 15, wherein the server includes a management controller coupled to the second power line communication module.

* * * * *